(12) United States Patent
Seo et al.

(10) Patent No.: US 8,203,262 B2
(45) Date of Patent: Jun. 19, 2012

(54) LIGHT-EMITTING ELEMENT INCLUDING A CARRIER TRANSPORT CONTROLLING LAYER, LIGHT-EMITTING DEVICE AND ELECTRONIC DEVICE

(75) Inventors: Satoshi Seo, Kanagawa (JP); Tsunenori Suzuki, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 268 days.

(21) Appl. No.: 12/339,517

(22) Filed: Dec. 19, 2008

(65) Prior Publication Data
US 2009/0167168 A1    Jul. 2, 2009

(30) Foreign Application Priority Data
Dec. 28, 2007 (JP) ................. 2007-340190

(51) Int. Cl.
*H05B 33/00* (2006.01)
*H01L 51/50* (2006.01)

(52) U.S. Cl. ........ 313/504; 313/506; 428/690; 428/917; 257/79

(58) Field of Classification Search ........... 313/504–506
See application file for complete search history.

(56) References Cited

U.S. PATENT DOCUMENTS

| | | | |
|---|---|---|---|
| 4,760,006 A | 7/1988 | Pawlowski | |
| 5,922,481 A | 7/1999 | Etzbach et al. | |
| 6,090,434 A | 7/2000 | Sugiura et al. | |
| 6,224,966 B1 * | 5/2001 | Sakai et al. | 428/212 |
| 6,387,546 B1 | 5/2002 | Hamada et al. | |
| 6,447,934 B1 | 9/2002 | Suzuki et al. | |
| 6,504,300 B2 | 1/2003 | Kawamura et al. | |
| 6,509,109 B1 | 1/2003 | Nakamura et al. | |
| 6,734,457 B2 | 5/2004 | Yamazaki et al. | |
| 6,995,509 B2 | 2/2006 | Yamazaki et al. | |
| 7,196,360 B2 | 3/2007 | Seo et al. | |
| 7,239,081 B2 | 7/2007 | Tsutsui | |
| 7,420,203 B2 | 9/2008 | Tsutsui et al. | |
| 7,474,049 B2 | 1/2009 | Liu et al. | |
| 2003/0027016 A1 | 2/2003 | Ara et al. | |
| 2003/0127967 A1 | 7/2003 | Tsutsui et al. | |

(Continued)

FOREIGN PATENT DOCUMENTS
EP            1876658 A2  *  1/2008

(Continued)

OTHER PUBLICATIONS

Lee, M-T et al., "Improved Stability of organic electroluminescent devices by doping styrylamines in hole or electron transporting layer" Applied Physics Letters, vol. 86, No. 10, 2005, pp. 103501-1-103501-3.*

(Continued)

*Primary Examiner* — Sikha Roy
(74) *Attorney, Agent, or Firm* — Husch Blackwell LLP

(57) ABSTRACT

A light-emitting element is provided, which includes a light-emitting layer and a control layer between a first electrode and a second electrode, wherein the control layer includes a first organic compound and a second organic compound, the first organic compound is included in the control layer more than the second organic compound, the second organic compound has a property of trapping carriers having the same polarity as carriers transported by the first organic compound, and the concentration and the carrier-trapping property of the second organic compound included in the control layer satisfy certain conditions.

14 Claims, 31 Drawing Sheets

U.S. PATENT DOCUMENTS

| | | | |
|---|---|---|---|
| 2004/0150328 A1 | 8/2004 | Czerw et al. | |
| 2005/0065342 A1 | 3/2005 | Shitagaki et al. | |
| 2005/0100760 A1 | 5/2005 | Yokoyama | |
| 2006/0011908 A1 | 1/2006 | Ohsawa et al. | |
| 2006/0029828 A1 | 2/2006 | Kanno et al. | |
| 2006/0043859 A1 | 3/2006 | Fukuoka et al. | |
| 2006/0051615 A1 | 3/2006 | Kanno et al. | |
| 2006/0083946 A1* | 4/2006 | Lee et al. | 428/690 |
| 2006/0091797 A1 | 5/2006 | Tsutsui et al. | |
| 2006/0158102 A1* | 7/2006 | Kawamura et al. | 313/504 |
| 2006/0164006 A1 | 7/2006 | Yamazaki et al. | |
| 2006/0267487 A1 | 11/2006 | Ozaki et al. | |
| 2007/0172699 A1 | 7/2007 | Nakashima et al. | |
| 2008/0006821 A1 | 1/2008 | Suzuki et al. | |
| 2008/0007164 A1 | 1/2008 | Suzuki et al. | |
| 2008/0007165 A1 | 1/2008 | Suzuki et al. | |
| 2008/0122350 A1 | 5/2008 | Sakata et al. | |
| 2008/0142794 A1 | 6/2008 | Shitagaki et al. | |
| 2008/0149923 A1* | 6/2008 | Ohsawa et al. | 257/40 |
| 2008/0217608 A1 | 9/2008 | Suzuki et al. | |
| 2008/0231177 A1 | 9/2008 | Nomura et al. | |
| 2008/0241586 A1 | 10/2008 | Kumaki et al. | |
| 2009/0200918 A1 | 8/2009 | Seo et al. | |

FOREIGN PATENT DOCUMENTS

| | | |
|---|---|---|
| JP | 6-207169 | 7/1994 |
| JP | 7-26255 | 1/1995 |
| JP | 2000-68057 | 3/2000 |
| JP | 2004-273163 | 9/2004 |
| JP | 2006-253444 | 9/2006 |
| WO | WO 2006/049334 A1 | 5/2006 |
| WO | WO 2007/069741 A1 | 6/2007 |

OTHER PUBLICATIONS

Tsutsui, T. et al., "High Quantum Efficiency in Organic Light-Emitting Devices with Iridium-Complex as a Triplet Emissive Center", Jpn. J. Appl. Phys., vol. 38, Part 2, No. 12B, Dec. 15, 1999, pp. L1502-L1504.

Goldsmith, C.R. et al., "C-H Bond Activation by a Ferric Methoxide Complex: Modeling the Rate-Determining Step in the Mechanism of Lipoxygenase," J. Am. Chem. Soc., vol. 124, No. 1, 2002, pp. 83-96.

Onishi.T et al, *High Molecular EL Materials—Development of Light-Emitting High Molecular Compounds*, Kyoritsu Shuppan, 2004, pp. 64-67 (with English translation, pp. 1-3).

Onishi.T et al, "A Method of Measuring an Energy Level," *High Molecular EL Materials—Development of Light-Emitting High Molecular Compounds*, Kyoritsu Shuppan, 2004, pp. 64-67 (with English translation, pp. 1-3).

Cina, S. et al., "P-135: Efficient Electron Injection from PEDOT-PSS into a Graded-n-doped Electron Transporting Layer in an Inverted OLED Structure", SID Digest '05: SID International Symposium Digest of Technical Papers, vol. 36, 2005, pp. 819-821.

Kajii, H. et al., "Study of Transient Electroluminescence Process Using Organic Light-Emitting Diode with Partial Doping Layer," Japanese Journal of Applied Physics, vol. 45, No. 4B, 2006, pp. 3721-3724.

* cited by examiner

LIGHT-EMITTING ELEMENT INCLUDING A CARRIER TRANSPORT CONTROLLING LAYER, LIGHT-EMITTING DEVICE AND ELECTRONIC DEVICE

BACKGROUND OF THE INVENTION

1. Field of the Invention

The present invention relates to light-emitting elements that employ electroluminescence. In addition, the present invention relates to light-emitting devices and electronic devices having such light-emitting elements.

2. Description of the Related Art

In recent years, research and development have been extensively conducted on light-emitting elements using electroluminescence. In a basic structure of such a light-emitting element, a substance having a light-emitting property is interposed between a pair of electrodes. By applying voltage to this element, light emission can be obtained from the substance having a light-emitting property.

Since such a light-emitting element is a self-luminous type, there are advantages such as higher visibility of a pixel than visibility of a liquid crystal display, and unnecessity of a backlight. Accordingly, such a light-emitting element is considered to be suitable as a flat panel display element. In addition, other advantages of such a light-emitting element are that the element can be manufactured to be thin and lightweight and the response speed is very high.

Since the light-emitting element can be formed into a film shape, surface light emission can be easily obtained by forming a large-area element. This is a feature that is difficult to be obtained by point sources typified by a filament lamp and an LED or linear sources typified by a fluorescent light. Therefore, utility value as a surface light source that can be applied to lighting devices or the like is also high.

Light-emitting elements using electroluminescence are classified broadly according to whether they use an organic compound or an inorganic compound as a substance having a light-emitting property.

When an organic compound is used as a light-emitting substance, electrons and holes are injected into a layer including a light-emitting organic compound from a pair of electrodes by voltage application to a light-emitting element, so that a current flows therethrough. The electrons and holes (i.e., carriers) are recombined, and thus, the light-emitting organic compound is excited. The light-emitting organic compound returns to a ground state from the excited state, thereby emitting light. Owing to such a mechanism, such a light-emitting element is referred to as a current-excitation light-emitting element.

It is to be noted that the excited state generated by an organic compound can be types of a singlet excited state and a triplet excited state, and luminescence from the singlet excited state is referred to as fluorescence, and luminescence from the triplet excited state is referred to as phosphorescence.

In an attempt to improve performance of such a light-emitting element, there are many problems which depend on the material, and in order to solve these problems, improvement of element structure, development of a material, and the like have been carried out.

For example, in Reference 1 (Tetsuo Tsutsui and eight others, Japanese Journal of Applied Physics, vol. 38, L1502-L1504 (1999)), a hole-blocking layer is provided so that a light-emitting element using a phosphorescent material efficiently emits light.

SUMMARY OF THE INVENTION

However, as described in Reference 1, a hole blocking layer does not have durability, and a light-emitting element has very short lifetime. Thus, development of a light-emitting element with long lifetime has been desired. If commercialization is considered, extending the lifetime is an important issue. Further, the development of light-emitting elements with much higher performances is desired.

In view of the above problems, it is an object of the present invention to provide light-emitting elements having long lifetime. Further, it is another object of the present invention to provide light-emitting elements and electronic devices having long lifetime.

As a result of diligent studies, the present inventors have found that a light-emitting element with long lifetime can be obtained by providing a control layer for controlling carrier transport. In addition, the present inventors have also found that a light-emitting element having long lifetime can be obtained particularly when the concentration and the carrier-trapping property of an organic compound included in the control layer satisfy a certain condition.

Accordingly, an aspect of the present invention is a light-emitting element including a light-emitting layer and a control layer between a first electrode and a second electrode, in which the control layer includes a first organic compound and a second organic compound, the first organic compound is included more than the second organic compound, the first organic compound is an organic compound having an electron-transporting property, the lowest unoccupied molecular orbital level (LUMO level) of the second organic compound is deeper than the lowest unoccupied molecular orbital level (LUMO level) of the first organic compound, and a value of the parameter X obtained by an expression (1) is in the range of from $5\times10^{-4}$ to $2\times10^{-2}$.

$$X = \frac{1}{L}\left\{\exp\left(-\frac{\Delta E}{kT}\right)\right\}^{\sqrt[3]{C}} \tag{1}$$

In the expression, $\Delta E$ is an energy difference [eV] between the LUMO level of the first organic compound and the LUMO level of the second organic compound, C is a molar fraction [dimensionless term] of the second organic compound, L is a thickness [nm] of the control layer, k is a Boltzmann constant ($=8.61\times10^{-5}$ [eV·K$^{-1}$]), and T is a temperature ($=300$ [K]).

In the above aspect, the value of X obtained by the expression (1) is preferably in the range of from $1\times10^{-3}$ to $1\times10^{-2}$.

In the above aspect, the thickness L of the control layer is preferably from 5 nm to 20 nm.

Further, in the above aspect, the mobility of the first organic compound is preferably in the range of from $10^{-7}$ [cm$^2$/Vs] to $10^{-3}$ [cm$^2$/Vs], more preferably $10^{-6}$ [cm$^2$/Vs] to $10^{-4}$ [cm$^2$/Vs].

Further, in the above aspect, the energy difference $\Delta E$ between the LUMO level of the first organic compound and the LUMO level of the second organic compound is preferably from 0.2 [eV] to 0.6 [eV].

Further, in the above aspect, the light-emitting layer preferably has an electron-transporting property. Typically, an organic compound which is included most among organic compounds included in the light-emitting layer preferably has an electron-transporting property. For example, it is preferable that the light-emitting layer contain a third organic compound and a fourth organic compound, in which the third organic compound is included more than the fourth organic compound, and the third organic compound have an electron-transporting property.

In addition, in the above aspect, the first organic compound and the third organic compound are preferably different organic compounds.

In the above aspect, preferably, the control layer and the light-emitting layer are in contact with each other.

Moreover, the present invention includes a light-emitting device having the above described light-emitting element. Thus, an aspect of the present invention is a light-emitting device that has the above-described light-emitting element and a control circuit arranged to control light emission of the light-emitting element.

The term "light-emitting device" in the present specification includes an image display device, a light-emitting device, or a light source (including a lighting device). Further, the following are all included in the "light-emitting device": a module in which a connector, for example, an FPC (flexible printed circuit), a TAB (tape automated bonding) tape, or a TCP (tape carrier package) is attached to a panel provided with a light-emitting element; a module provided with a printed wiring board at the end of the TAB tape or the TCP; and a module in which an IC (integrated circuit) is directly mounted to a light-emitting element by a COG (chip on glass) method.

Further, an electronic device using the light-emitting element according to an aspect of the present invention in a display portion is also included in the scope of the invention. Accordingly, an electronic device according to an aspect of the present invention includes a display portion, wherein the display portion includes the above-described light-emitting element and a control circuit arranged to control light emission from the light-emitting element.

In the light-emitting element according to an aspect of the present invention, a layer for controlling the carrier transport is provided; therefore, a light-emitting element with long lifetime can be obtained.

Further, a light-emitting element of the present invention is applied to light-emitting devices and electronic devices, so that the light-emitting devices and the electronic devices can have longer lifetime.

DETAILED DESCRIPTION OF THE INVENTION

Embodiment Mode

Figure 1:
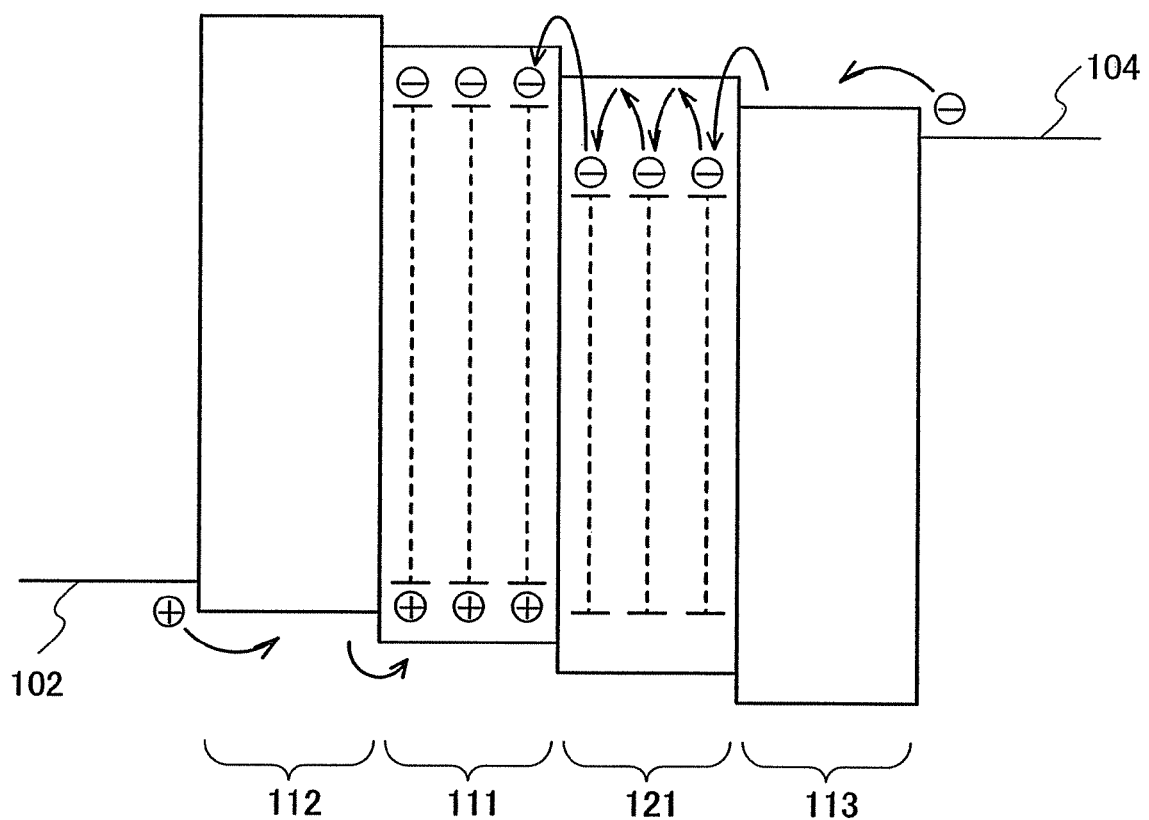
FIG. 1 illustrates a light-emitting element according to an aspect of the present invention.

Embodiment modes of the present invention will be explained with reference to the drawings. Note that the present invention is not limited to the description below and it is easily understood by those skilled in the art that modes and details of the present invention can be modified in various ways without departing from the spirit and scope of the present invention. Therefore, the present invention should not be construed as being limited to the description of the embodiment modes to be given below. Note that in the description of the present invention, like portions are denoted by the same reference numerals in some cases.

Embodiment Mode 1

A light-emitting element according to an aspect of the present invention includes a light-emitting layer and a control layer for controlling carrier transport, between a pair of electrodes. The control layer includes a first organic compound and a second organic compound, wherein the first organic compound is included more than the second organic compound, and the second organic compound has a property of trapping carriers having the same polarity as carriers transported by the first organic compound.

In this embodiment mode, a case is described in detail, in which the first organic compound has an electron-transporting property, while the second organic compound has an electron-trapping property. In other words, a light-emitting element is described, in which the light-emitting layer and the control layer are provided between the first electrode and the second electrode, the control layer includes the first organic compound and the second organic compound, wherein the first organic compound is included more than the second organic compound. The first organic compound is an organic compound having an electron-transporting property, and the lowest unoccupied molecular orbital level (LUMO level) of the second organic compound is deeper than the lowest unoccupied molecular orbital level (LUMO level) of the first organic compound.

Note that in this specification, "the HOMO level or the LUMO level is deep" means that the energy level is low, and "the HOMO level or the LUMO level is shallow" means that the energy level is high. For example, a substance A having a LUMO level of −2.5 eV has the LUMO level which is deeper by 0.3 eV than a substance B having a LUMO level of −2.2 eV, and the LUMO level which is shallower by 0.2 eV than a substance C having a LUMO level of −2.7 eV.

FIG. 1 illustrates an example of a band diagram of a light-emitting element according to an aspect of the present invention. The light-emitting element according to an aspect of the present invention includes a light-emitting layer 111 and a control layer 121 between a first electrode 102 and a second electrode 104. In FIG. 1, a hole-transporting layer 112 is provided between the first electrode 102 and the light-emitting layer 111, and an electron-transporting layer 113 is provided between the second electrode 104 and the control layer 121.

By application of voltage to the light-emitting element as illustrated in FIG. 1, holes injected from the first electrode are injected to the light-emitting layer through the hole-transporting layer. On the other hand, electrons injected from the second electrode are injected to the control layer through the electron-transporting layer. Although the transport speed of the electrons injected to the control layer becomes slower due to the electron-trapping property of the second organic compound, finally, the electrons are injected to the light-emitting layer and recombined with holes, whereby light is emitted.

In a conventional light-emitting element in which no control layer is provided, electrons are injected to the light-emitting layer without slowing the transport speed due to carrier trapping. Therefore, in a case where the light-emitting layer has an electron-transporting property, electrons can easily reach the vicinity of the interface between the hole-transporting layer and the light-emitting layer. Therefore, a carrier recombination region (light-emitting region) is formed in the vicinity of the interface between the hole-transporting layer and the light-emitting layer. In that case, there is a possibility that the electrons may reach the hole-transporting layer and deteriorate it. As the hole-transporting layer deteriorates and the number of electrons which have reached the hole-transporting layer becomes larger with time, the recombination probability in the light-emitting layer is decreased with time. This leads to reduction of lifetime of the light-emitting element (luminance decay with time).

On the contrary, in the light-emitting element according to an aspect of the present invention, as described above, the transport speed of electrons injected to the control layer becomes slower and electron injection to the light-emitting layer is controlled. As a result, the recombination region (light-emitting region), which tends to be formed in the vicinity of the interface between the hole-transporting layer and the light-emitting layer in a conventional light-emitting element, spreads entirely inside the light-emitting layer in the light-emitting element of the present invention. Specifically, the recombination region is formed from the inside of the light-emitting layer to the vicinity of the interface between the light-emitting layer and the control layer. Therefore, there is a low possibility that electrons may reach the hole-transporting layer and deteriorate it.

Further, in the present invention, it is important that, in the control layer, a second organic compound having a function of trapping electrons is added to a first organic compound with an electron-transporting property, rather than simply using a substance having slow electron mobility. With such a structure, it becomes possible not only to control the electron injection to the light-emitting layer but also to suppress changes in the controlled amount of electron injection with time. Accordingly, in the light-emitting element of an aspect of the present invention, a phenomenon can be prevented, in which carrier balance is deteriorated with time and probability of recombination is reduced; therefore, improvement in element lifetime (suppression of luminance decay with time) can be achieved.

In this case, the combination of the first organic compound and the second organic compound in the control layer and the concentration of the second organic compound are important. This is explained as follows.

For example, in the control layer, in the case of the combination with a low electron-trapping property (i.e., the combination in which the LUMO level of the second organic compound is slightly deeper (lower) than the LUMO level of the first organic compound), unless the concentration of the second organic compound is made higher to some extent, the transport speed of electrons in the control layer does not become smaller, which leads to the similar state to the conventional light-emitting element. Thus, a lifetime extension effect cannot be obtained in this case. On the other hand, in the control layer, in the case of the combination with a high electron-trapping property (i.e., the combination in which the LUMO level of the second organic compound is much deeper than the LUMO level of the first organic compound), if the concentration of the second organic compound is made too high, the transport speed of electrons in the control layer becomes much smaller, and the recombination region reaches the inside of the control layer. In this case, the recombination in the control layer adversely influences lifetime.

In other words, in intuitive understanding, a longest lifetime effect can be obtained, by setting the concentration of the second organic compound high in the combination with a low electron trapping property, and setting the concentration of the second organic compound low in the combination with a high electron trapping property. However, this is merely intuitive understanding, the optimum value of the concentration is variously changed depending on combination of materials (in other words, depth at which electrons are trapped), and it is difficult to estimate the optimum value.

The present inventors have found that a certain rule is present for an optimum structure of a control layer. In other words, when a parameter X obtained by the following expression (1), which is determined depending on $\Delta E$ as a depth at which electrons are trapped (energy difference between the LUMO level of the first organic compound and the LUMO level of the second organic compound), C as a concentration of the second organic compound, and L as a thickness, is in a certain range, a lifetime extension effect can be obtained.

$$X = \frac{1}{L}\left\{\exp\left(-\frac{\Delta E}{kT}\right)\right\}^{\sqrt[3]{C}} \quad (1)$$

In this expression, $\Delta E$ is an energy difference [eV] between the LUMO level of the first organic compound and the LUMO level of the second organic compound, C is a molar fraction [dimensionless term] of the second organic compound, L is a thickness [nm] of the control layer, k is a Boltzmann constant (=8.61×10$^{-5}$ [eV·K$^{-1}$]), and T is a temperature (=300 [K]).

This expression is obtained from the following theory.

Initially, in the light-emitting element according to an aspect of the present invention, an electron is transported through the control layer by n times of hopping. In other words, by hopping between n molecules, an electron is transported through the control layer. At this time, when a probability of existence of a trap for an electron in the control layer (i.e., probability of existence of the second organic compound) is denoted by p, an expected value $E_n$ which shows a probability in which an electron is trapped in the n times of hopping is expressed by $E_n$=np. For example, the existence possibility p is 0.1 (10%), and in the case of ten times of hopping (n=10), np=10×0.1=1. Statistically, this indicates that an electron is trapped at about one time when it is transported through the control layer. In other words, the expected value $E_n$=np is a statistical average value of the number of times in which an electron is trapped, in n times of hopping.

Next, a probability of, after an electron is captured by a trap, escaping from the trap is denoted by K. Here, because the above expected value $E_n$=np is (an average value of) the number of times in which an electron is trapped, a final probability $K_{all}$ that an electron is transported through the control layer by n times of hoppings is the $E_n$-th power of K. That is, the following expression (2) is obtained. The expression represents that, for example, in the case of $E_n$=np=2, since an electron is trapped twice in the control layer in average, $K_{all}$=K$^2$. Note that in the case of no trap (p=0), $K_{all}$=1, which is normalized.

$$K_{all} = K^{np} \quad (2)$$

Since $K_{all}$ is a probability that an electron is transported through the control layer by n times of hopping, the average probability $K_{ave}$ that the electron can go through the control layer at each hopping is expressed by an n-th power root of $K_{all}$. Accordingly, from the expression (2), the following expression (3) is obtained.

$$K_{ave} = \sqrt[n]{K_{all}} = K^p \quad (3)$$

Here, it is considered what kinds of physical quantities the average probability $K_{ave}$ influences. In a quantum aspect, when $K_{ave}$ is 0.5, one electron of two injected electrons cannot go forward (whether an electron can be transported or not). However, as apparent from the expression (2), the above consideration is based on the expected value, and thus average behavior should be considered. For example, when the distance between molecules is $L_0$, and $K_{ave}$ is 0.5, the transport distance of one electron of two injected electrons is $L_0$, and the transport distance of the other electron is 0, whereby the average value of the transport distance is $(L_0+0)/2=0.5 L_0$. In other words, $K_{ave}$ is directly proportional to the transport distance of electrons, i.e., a drift velocity of electrons. Therefore, when the drift velocity of electrons in the control layer is v, and the drift velocity of electrons in the first organic compound is $v_0$, the following expression (4) can be postulated.

$$v = v_0 K^p \quad (4)$$

Next, it is considered that what kinds of physical quantities K and p in the expression (4) are expressed with. The p is the existence probability of a trap for an electron (i.e., the existence probability of the second organic compound), and thus is simply a concentration of the second organic compound. Note that in the light-emitting element as an example disclosed in the present invention, electron transport is controlled more by drift in an electric field direction than by diffusion, and thus electron transport should be considered using a model only in the thickness direction of the element, i.e., one dimensional model. Accordingly, when the concentration (molar fraction) of the second organic compound is C, C is a molar fraction per unit volume (i.e., three dimensions). Thus, the following expression (5) is obtained.

$$p = \sqrt[3]{C} \quad (5)$$

On the other hand, K is the probability that an electron can escape from a trap, and kinetically shows Boltzmann distribution. Thus, K is expressed by the following expression (6).

$$K = \exp\left(-\frac{\Delta E}{kT}\right) \quad (6)$$

In the expression, $\Delta E$ is an energy difference [eV] between the LUMO level of the first organic compound and the LUMO level of the second organic compound, k is Boltzmann constant (=8.61×10$^{-5}$ [eV·K$^{-1}$]), and T is a temperature [K].

The expression (5) and the expression (6) are assigned to the expression (4), and thus the following expression (7) can be obtained, which is one of important features of the present invention.

$$v = v_0 \left\{\exp\left(-\frac{\Delta E}{kT}\right)\right\}^{\sqrt[3]{C}} \quad (7)$$

In the expression (7), $\Delta E$ is an energy difference [eV] between the LUMO level of the first organic compound and the LUMO level of the second organic compound, C is a molar fraction [dimensionless term] of the second organic compound, and k is Boltzmann constant (=8.61×10$^{-5}$ [eV·K$^{-1}$]), and T is a temperature.

In this case, the thickness of the control layer is L [nm] (the unit is nm in consideration of the thickness scale of the light-emitting element according to an aspect of the present invention, for convenience), and the time for an electron to be transported through the control layer is t [s]. In this case, t [s]=L [nm]/v [nm/s]. In addition, when the reciprocal of t [s] is x [s$^{-1}$]=1/t [s], x can be a rate constant of an electron transported through the control layer (a proportional constant of the number of electrons transported through the control layer is x). The rate constant x is expressed by the following expression (8) using the expression (7).

$$x = 1/t = v/L = \frac{v_0}{L}\left\{\exp\left(-\frac{\Delta E}{kT}\right)\right\}^{\sqrt[3]{C}} \quad (8)$$

In the expression (8), $\Delta E$ is an energy difference [eV] between the LUMO level of the first organic compound and the LUMO level of the second organic compound, C is a molar fraction [dimensionless term] of the second organic compound, L is a thickness [nm] of the control layer and k is Boltzmann constant ($=8.61\times10^{-5}$ [eV·K$^{-1}$]), and T is a temperature.

As described above, the lifetime extension effect due to the control layer cannot be obtained if an excessive number of electrons are transported through the control layer or an excessive number of electrons are trapped in the control layer. Accordingly, the lifetime extension effect cannot be obtained unless the rate constant x is kept in an appropriated range.

The present inventors have empirically found that the lifetime extension effect can be actually obtained in the case where the rate constant x is in a certain range.

Note that $v_0$ is a value which is variable depending on the type of the first organic compound, and further is a value under influences of mobility and electric field intensity (drift velocity=mobility×electric field intensity). However, in the expression (8), the exponential term is dominant and thus normalization ($v_0=1$) is adopted in the experiment. In addition, the experiment is conducted at room temperature, and thus T=300 [K].

In other words, at the time of $v_0=1$ and T=300 [K], the rate constant x is parameter X (the following expression (1)), and a relationship between the parameter X and the lifetime of the element is verified empirically. As a result, it is found that the lifetime extension effect can be obtained in the case where the parameter X is in the range of from $5\times10^{-4}$ to $2\times10^{-2}$, preferably from $1\times10^{-3}$ to $1\times10^{-2}$.

$$X = \frac{1}{L}\left\{\exp\left(-\frac{\Delta E}{kT}\right)\right\}^{\sqrt[3]{C}} \quad (1)$$

$\Delta E$ is an energy difference [eV] between the LUMO level of the first organic compound and the LUMO level of the second organic compound, C is a molar fraction [dimensionless term] of the second organic compound, L is a thickness [nm] of the control layer and k is Boltzmann constant ($=8.61\times10^{-5}$ [eV·K$^{-1}$]), and T is a temperature ($=300$ [K]).

In the above expression (1), the drift velocity $v_0$ of the first organic compound is normalized, but if the drift velocity is changed by several orders of magnitude, a difference in the parameter X is generated. The drift velocity is a product of mobility and electric field intensity, and the electric field intensity is not different in an order of magnitude in an actual luminance region. However, if the mobility is changed by several orders of magnitude, the drift velocity is also changed by several orders of magnitude, and thus there is a possibility that a difference in the parameter X is generated.

In view of the fact that the mobility of Alq used for the first organic compound in the experiment is about $10^{-5}$ [cm$^2$/Vs], and the range of the parameter X is in the range of two orders of magnitude, the mobility of the first organic compound is preferably in the range of ±two orders of magnitude from $10^{-5}$ [cm$^2$/Vs], which is the mobility of Alq. Therefore, the mobility of the first organic compound is preferably in the range of $10^{-7}$ to $10^{-3}$ [cm$^2$/Vs], more preferably $10^{-6}$ to $10^{-4}$ [cm$^2$/Vs].

In addition, the thickness L of the control layer influences the parameter X. The thickness L of the control layer is preferably from 1 to 100 [nm], more preferably from 5 to 20 [nm].

When the energy difference $\Delta E$ between the LUMO level of the first organic compound and the LUMO level of the second organic compound is large, the effect of trapping becomes great, even when the concentration of the second organic compound is low. Thus, accurate control of the concentration of the second organic compound in the control layer is needed. On the other hand, when the energy difference $\Delta E$ is small, the trapping effect of the second organic compound becomes small, and thus the concentration of the second organic compound can be easily controlled. Therefore, the energy difference $\Delta E$ between the LUMO level of the first organic compound and the LUMO level of the second organic compound is preferably in the range of from 0.2 to 0.6 [eV] in manufacturing of a light-emitting element.

As a substance used to form the control layer, a wide variety of organic compounds can be used. In this case, it is important that a material is selected appropriately and the concentration is adjusted so that the parameter X obtained by the expression (1) is in the range from $5\times10^{-4}$ to $2\times10^{-2}$.

For example, as the first organic compound, an organic compound having an electron-transporting property can be used. That is, the first organic compound is a substance whose electron-transporting property is higher than its hole-transporting property. Specifically, metal complexes such as tris(8-quinolinolato)aluminum(II) (abbr.: Alq), tris(4-methyl-8-quinolinolato)aluminum(III) (abbr.: Almq$_3$), bis(10-hydroxybenzo[h] quinolinato)beryllium(II) (abbr.: BeBq$_2$), bis(2-methyl-8-quinolinolato)(4-phenylphenolato)aluminum(III) (abbr.: BAlq), bis(8-quinolinolato)zinc(II) (abbr.: Znq), bis[2-(2-benzoxazolyl)phenolato]zinc(II) (abbr.: ZnPBO), and bis[2-(2-benzothiazolyl)phenolato]zinc(II) (abbr.: ZnBTZ); heterocyclic compounds such as 2-(4-biphenylyl)-5-(4-tert-butylphenyl)-1,3,4-oxadiazole (abbr.: PBD), 1,3-bis[5-(p-tert-butylphenyl)-1,3,4-oxadiazol-2-yl]benzene (abbr.: OXD-7), 3-(4-biphenylyl)-4-phenyl-5-(4-tert-butylphenyl)-1,2,4-triazole (abbr.: TAZ01), 2,2',2''-(1,3,5-benzene triyl)tris(1-phenyl-1H-benzimidazole) (abbr.: TPBI), bathophenanthroline (abbr.: BPhen), bathocuproine (abbr.: BCP); 9-[4-(5-phenyl-1,3,4-oxadiazol-2-yl)phenyl]-9H-carbazole (abbr.: C011); condensed aromatic compounds such as 9-[4-(10-phenyl-9-anthryl)phenyl]-9H-carbazole (abbr.: CzPA), 3,6-diphenyl-9-[4-(10-phenyl-9-anthryl)phenyl]-9H-carbazole (abbr.: DPCzPA), 9,10-bis(3,5-diphenylphenyl)anthracene (abbr.: DPPA), 9,10-di(2-naphthyl)anthracene (abbr.: DNA), 2-tert-butyl-9,10-di(2-naphthyl)anthracene (abbr.: t-BuDNA), 9,9'-bianthryl (abbr.: BANT), 9,9'-(stilbene-3,3'-diyl)diphenanthrene (abbr.: DPNS), 9,9'-(stilbene-4,4'-diyl)diphenanthrene (abbr.: DPNS2), 3,3',3''-(benzene-1,3,5-triyl)tripyrene (abbr.: TPB3) can be used. In addition, a high molecular compound such as poly[(9,9-dihexylfluorene-2,7-diyl)-co-(pyridine-3,5-diyl)] (abbr.: PF-Py), or poly[(9,9-dioctylfluorene-2,7-diyl)-co-(2,2'-bipyridine-6,6'-diyl)] (abbr.: PF-BPy) can be used. Among them, metal complexes that are stable against electrons are preferably used. As described above, the LUMO level of the second organic compound is preferably deeper than that of the first organic compound. Therefore, the first organic compound may be appropriately selected so as to satisfy the above condition according to the kind of compound used for the second organic compound. For example, as described later in Examples, when 2,3,5,8-tetraphenylquinoxaline (abbr.: TPQ), N,N'-diphenylquinacridone (abbr.: DPQd), or coumarin 545T is used for the second organic compound, Alq is used for the first organic compound, which satisfies the above condition.

In addition, the second organic compound is preferably an organic compound having a LUMO level which is deeper than a LUMO level of the first organic compound. Therefore, the second organic compound may be appropriately selected so as to satisfy the above condition according to the kind of compound used for the first organic compound.

Thus, a substance having a deep LUMO level is preferable for the second organic compound. As examples, acridone, coumarin 102, coumarin 6H, coumarin 480D, or coumarin 30, N,N'-dimethylquinacridone (abbr.: DMQd), N,N'-diphenylquinacridone (abbr.: DPQd), 9,18-dihydrobenzo[h]benzo[7,8]quino[2,3-b]acridine-7,16-dione (abbr.: DMNQd-1), 9,18-dimethyl-9,18-dihydrobenzo[h]benzo[7,8]quino[2,3-b]acridine-7,16-dione (abbr.: DMNQd-2), coumarin 6, coumarin 545T, coumarin 153, (2-{2-[4-(9H-carbazol-9-yl)phenyl]ethenyl}-6-methyl-4H-pyran-4-ylidene)propanedinitrile (abbr.: DCMCz), (2-{2-[4-(dimethylamino)phenyl]ethenyl}-6-methyl-4H-pyran-4-ylidene)propanedinitrile (abbr.: DCM1), {2-methyl-6-[2-(2,3,6,7-tetrahydro-1H,5H-benzo[ij]quinolizin-9-yl)ethenyl]-4H-pyran-4-ylidene}propanedinitrile (abbr.: DCM2), {2-(1,1-dimethylethyl)-6-[2-(2,3,6,7-tetrahydro-1,1,7,7-tetramethyl-1H,5H-benzo[ij]quinolizin-9-yl)ethenyl]-4H-pyran-4-ylidene}propanedinitrile (abbr.: DCJTB), Nile Red, 2,3-diphenylquinoxaline (abbr.: DPQ), 2,3-bis(4-fluorophenyl)quinoxaline (abbr.: FDPQ), 2,3-bis(4-trifluoromethylphenyl)quinoxaline (abbr.: $CF_3$-DPQ), 2,3,5,8-tetraphenylquinoxaline (abbr.: TPQ), 2,3,2',3'-tetraphenyl-6,6'-biquinoxaline (abbr.: DPQ2), 2,3,2',3'-tetrakis(4-fluorophenyl)-6,6'-biquinoxaline (abbr.: FDPQ2) and the like can be given. Further, a phosphorescent material such as (acetylacetonato)bis[2,3-bis(4-fluorophenyl)quinoxalinato]iridium(III) (abbr.: Ir(Fdpq)$_2$(acac)) can also be used. The above-described compounds are compounds having particularly deep LUMO levels among compounds that are used for light-emitting elements. Thus, when such compounds are added to the first organic compound described above, an excellent electron-trapping property is exhibited.

As described above, the light-emitting element described in this embodiment mode includes the layer for controlling the carrier transport. Since the layer for controlling carrier transport includes two or more kinds of substances, carrier balance can be controlled precisely by control of combination, the mixture ratio, the thickness, or the like of the substances.

Since the carrier balance can be controlled by control of combination, the mixture ratio, the thickness, or the like of the substances, control of carrier balance can be easier than by a conventional method. That is, even if a physical property of the substance is not changed, the carrier transport can be controlled by a mixture ratio of the substances, the thickness of the layer, and the like. Therefore, a material for the light-emitting layer can be chosen from a wider range, and the light-emitting element can be designed more flexibly.

The carrier transport is controlled using the organic compound which is included least of two or more kinds of substances included in the control layer for controlling the carrier transport. That is, since the carrier transport can be controlled by a component which is included least of components included in the control layer for controlling the carrier transport, the light-emitting element hardly deteriorates with time and can have long lifetime. That is, change in carrier balance is hardly caused in the light-emitting element as compared with a case where carrier balance is controlled by a single substance. For example, when the carrier transport is controlled by a layer formed with a single substance, the carrier balance of the whole layer is changed by a partial change in morphology, partial crystallization, or the like. Therefore, the layer for controlling carrier transport in that case easily deteriorates with time. However, as described in this embodiment mode, the carrier transport is controlled due to a component which is included least of the components included in the control layer for controlling carrier transport, whereby change in morphology or effect of crystallization, aggregation, or the like is reduced, and then change with time is hardly caused. Thus, a light-emitting element with long lifetime can be obtained in which reduction of carrier balance with time and reduction in light emission efficiency with time are hardly caused.

Embodiment Mode 2

One mode of a light-emitting element according to an aspect of the present invention is hereinafter described with reference to FIGS. 2A, 2B, FIGS. 3A and 3B and FIGS. 4A to 4C. A light-emitting element according to an aspect of the present invention has a control layer for controlling carrier transport, as described in Embodiment Mode 1.

A light-emitting element according to an aspect of the present invention has a plurality of layers between a pair of electrodes. The plurality of layers is a combination of layers formed using a substance with a high carrier-injecting property and a substance with a high carrier-transporting property which are stacked so that a light-emitting region is formed in a region away from the electrodes, that is, recombination of carriers is performed in an area away from the electrodes.

In this embodiment mode, the light-emitting element includes a first electrode 102, a second electrode 104, and an EL layer 103 provided between the first electrode 102 and the second electrode 104. In addition, in this embodiment mode, the first electrode 102 serves as an anode and the second electrode 104 serves as a cathode. In other words, when a voltage is applied to the first electrode 102 and the second electrode 104 such that a potential of the first electrode 102 is higher than that of the second electrode 104, light emission can be obtained. Such a case will be described below.

A substrate 101 is used as a support of the light-emitting element. The substrate 101 can be formed with, for example, glass, plastic, or the like. Alternatively, the substrate 101 may be formed with any other material as long as the material can serve as a support in a manufacturing process of the light-emitting element.

The first electrode 102 is preferably formed using a metal, an alloy, an electrically conductive compound, a mixture of these, or the like each having a high work function (specifically, a work function of 4.0 eV or higher is preferable). Specifically, indium tin oxide (ITO), indium tin oxide containing silicon or silicon oxide, indium zinc oxide (IZO), indium tin oxide containing tungsten oxide and zinc oxide (IWZO), and the like can be used, for example. Such conductive metal oxide films are generally formed by sputtering, but may also be formed by an inkjet method, a spin coating method, or the like by application of a sol-gel method or the like. For example, indium oxide-zinc oxide (IZO) can be formed by a sputtering method using indium oxide into which zinc oxide of 1 to 20 wt % is added, as a target. Indium oxide containing tungsten oxide and zinc oxide (IWZO) can be formed by sputtering using a target in which 0.5 to 5 wt % of tungsten oxide and 0.1 to 1 wt % of zinc oxide are mixed with indium oxide. Besides, gold (Au), platinum (Pt), nickel (Ni), tungsten (W), chromium (Cr), molybdenum (Mo), iron (Fe), cobalt (Co), copper (Cu), palladium (Pd), titanium (Ti), nitride of a metal material (e.g., titanium nitride), and the like can be given.

In a case where a layer including a composite material described below is used as a layer in contact with the first electrode, various metals, alloys, electroconductive compounds, and mixture thereof can be used as the first electrode regardless of the work functions. For example, aluminum (Al), silver (Ag), an aluminum alloy (AlSi), or the like can be used. Besides, an element belonging to Group 1 or 2 of the periodic table which has a low work function, i.e., alkali metals such a lithium (Li) and cesium (Cs) and alkaline earth metals such as magnesium (Mg), calcium (Ca), and strontium (Sr); alloys of them (e.g., MgAg and AlLi); rare earth metals such as europium (Eu) and ytterbium (Yb); alloys of them; and the like can also be used. A film of an alkali metal, an alkaline earth metal, or an alloy including these can be formed by a vacuum evaporation method. In addition, an alloy including an alkali metal or an alkaline earth metal can be formed by a sputtering method. Further, silver paste or the like can be formed by an inkjet method.

The second electrode 104 can be formed using a metal, an alloy, an electrically conductive compound, or a mixture of these, having a low work function (specifically, a work function of 3.8 eV or lower is preferable). As a specific example of such a cathode material, an element belonging to group 1 or 2 in the periodic table, that is, an alkali metal such as lithium (Li) or cesium (Cs); an alkaline earth metal such as magnesium (Mg), calcium (Ca), or strontium (Sr); an alloy containing the element belonging to group 1 or 2 (MgAg, AlLi); a rare-earth metal such as europium (Eu) or ytterbium (Yb); an alloy thereof; or the like can be used. A film of an alkali metal, an alkaline earth metal, or an alloy including these can be formed by a vacuum evaporation method. In addition, an alloy including an alkali metal or an alkaline earth metal can be formed by a sputtering method. Further, silver paste or the like can be formed by an inkjet method.

By provision of an electron-injecting layer 115 described later, as a layer in contact with the second electrode 104, the second electrode 104 can be formed using any of various conductive materials such as Al, Ag, ITO, and indium tin oxide containing silicon or silicon oxide, regardless of levels of their work functions. These conductive materials can be formed by sputtering, inkjet, spin coating or the like.

The EL layer 103 is provided between the first electrode 102 and the second electrode 104. The EL layer includes a light-emitting layer and a control layer for controlling carrier transport. This embodiment mode illustrates a light-emitting element which includes a control layer 121 for controlling electron transport as a layer for controlling carrier transport.

The control layer 121 for controlling electron transport is provided between the light-emitting layer 111 and the second electrode 104 serving as a cathode. The control layer 121 for controlling electron transport can have a structure described in Embodiment Mode 1.

The light-emitting layer 111 is a layer containing a substance with a high light-emitting property, and various materials may be used for the light-emitting layer 111. As the substance with a high light-emitting property, for example, a fluorescent compound which emits fluorescence or a phosphorescent compound which emits phosphorescence can be used.

Examples of phosphorescent compounds which can be used for the light-emitting layer include the following materials. Examples of materials for blue light emission are as follows: bis[2-(4',6'-difluorophenyl)pyridinato-N,C$^{2'}$]iridium(III) tetrakis(1-pyrazolyl)borate (abbr.: FIr6), bis[2-(4', 6'-difluorophenyl)pyridinato-N,C$^{2'}$]iridium(III) picolinate (abbr: FIrpic), bis[2-(3',5'bistrifluoromethylphenyl)pyridinato-N,C$^{2'}$]iridium(III) picolinate (abbr.: Ir(CF$_3$ ppy)$_2$(pic)), bis[2-(4',6'-difluorophenyl)pyridinato-N,C$^{2'}$]iridium(III) acetylacetonate (abbr.: FIracac), and the like. Examples of materials for green light emission are as follows: tris(2-phenylpyridinato-N,C$^{2'}$)iridium(III) (abbr.: Ir(ppy)$_3$), bis(2-phenylpyridinato-N,C$^{2'}$)iridium(III) acetylacetonate (abbr.: Ir(ppy)$_2$(acac)), bis(1,2-diphenyl-1H-benzimidazolato)iridium(III) acetylacetonate (abbr: Ir(pbi)$_2$(acac)), bis(benzo[h]quinolinato)iridium(III) acetylacetonate (abbr.: Ir(bzq)$_2$(acac)), and the like. Examples of materials for yellow light emission are as follows: bis(2,4-diphenyl-1,3-oxazolato-N,C$^{2'}$)iridium(III) acetylacetonate (abbr.: Ir(dpo)$_2$(acac)), bis [2-(4'-perfluorophenylphenyl)pyridinato]iridium(III) acetylacetonate (abbr.: Ir(p-PF-ph)$_2$(acac)), bis(2-phenylbenzothiazolato-N,C$^{2'}$)iridium(III) acetylacetonate (abbr.: Ir(bt)$_2$(acac)), and the like. Examples of materials for orange light emission are as follows: tris(2-phenylquinolinato-N,C$^{2'}$)iridium(III) (abbr.: Ir(pq)$_3$), bis(2-phenylquinolinato-N,C$^{2'}$)iridium(III) acetylacetonate (abbr: Ir(pq)$_2$(acac)), and the like. Examples of materials for red light emission are organometallic complexes such as bis[2-(2'-benzo[4,5-a]thienyl)pyridinato-N,C$^{3'}$]iridium(III) acetylacetonate (abbr.: Ir(btp)$_2$(acac)), bis(1-phenylisoquinolinato-N,C$^{2'}$)iridium (III) acetylacetonate (abbr.: Ir(piq)$_2$(acac)), (acetylacetonato) bis[2,3-bis(4-fluorophenyl)quinoxalinato]iridium(III) (abbr.: Ir(Fdpq)$_2$(acac)), and 2,3,7,8,12,13,17,18-octaethyl-21H,23H-porphyrin platinum(II) (abbr.: PtOEP). In addition, a rare earth metal complex such as tris(acetylacetonato)(monophenanthroline)terbium(III) (abbr.: Tb(acac)$_3$(Phen)), tris(1,3-diphenyl-1,3-propanedionato)(monophenanthroline)europium(III) (abbr.: Eu(DBM)$_3$(Phen)), or tris[1-(2-thenoyl)-3,3,3-trifluoroacetonato](monophenanthroline)europium(III) (abbr.: Eu(TTA)$_3$(Phen)) exhibits light emission (electron transition between different multiplicities) from a rare earth metal ion; therefore, such a rare earth metal complex can be used as a phosphorescent compound.

Examples of fluorescent compounds which can be used for the light-emitting layer are as follows. Examples of materials for blue light emission are as follows: N,N'-bis[4-(9H-carbazol-9-yl)phenyl]-N,N'-diphenylstilbene-4,4'-diamine (abbr.: YGA2S), 4-(9H-carbazol-9-yl)-4'-(10-phenyl-9-anthryl)triphenylamine (abbr.: YGAPA), and the like. Examples of materials for green light emission are as follows: N-(9,10-diphenyl-2-anthryl)-N,9-diphenyl-9H-carbazol-3-amine (abbr.: 2PCAPA), N-[9,10-bis(1,1'-biphenyl-2-yl)-2-anthryl]-N,9-diphenyl-9H-carbazol-3-amine (abbr.: 2PCABPhA), N-(9,10-diphenyl-2-anthryl)-N,N',N'-triphenyl-1,4-phenylenediamine (abbr.: 2DPAPA), N-[9,10-bis(1,1'-biphenyl-2-yl)-2-anthryl]-N,N',N'-triphenyl-1,4-phenylenediamine (abbr.: 2DPABPhA), 9,10-bis(1,1'-biphenyl-2-yl)-N-[4-(9H-carbazol-9-yl)phenyl]-N-phenylanthracen-2-amine (abbr.: 2YGABPhA), N,N,9-triphenylanthracen-9-amine (abbr.: DPhAPhA), and the like. Examples of materials for yellow light emission are as follows: rubrene, 5,12-bis(1,1'-biphenyl-4-yl)-6,11-diphenyltetracene (abbr.: BPT), and the like. Examples of materials for red light emission are as follows N,N,N',N'-tetrakis(4-methylphenyl)tetracene-5,11-diamine (abbr.: p-mPhTD), 7,13-diphenyl-N,N,N',N'-tetrakis(4-methylphenyl)acenaphtho[1,2-a]fluoranthene-3,10-diamine (abbr.: p-mPhAFD), and the like.

It is to be noted that the light-emitting layer may have a structure in which the above substance having a high light-emitting property (a guest material) is dispersed in another substance (a host material). As the substance into which the substance having a high light-emitting property is dispersed, a variety of kinds of substances can be used, and it is preferable to use a substance whose lowest unoccupied molecular orbital (LUMO) level is higher (shallower) than that of a substance having a high light-emitting property and whose highest occupied molecular orbital (HOMO) level is lower (deeper) than that of the substance having a high light-emitting property.

Therefore, for example, a compound having a hole-transporting property such as the following is preferable: 4,4'-bis[N-(1-naphthyl)-N-phenylamino]biphenyl (abbr.: NPB or α-NPD); 4,4'-bis[N-(9,9-dimethylfluoren-2-yl)-N-phenylamino]biphenyl (abbr.: DFLDPBi); N,N'-bis(4-methylphenyl)-N,N'-diphenyl-p-phenylenediamine (abbr.: DTDPPA); 4,4'-bis[N-(4-diphenylaminophenyl)-N-phenylamino]biphenyl (abbr.: DPAB); 4,4'-bis(N-{4-[N'-(3-methylphenyl)-N'-phenylamino]phenyl}-N-phenylamino)biphenyl (abbr.: DNTPD); 1,3,5-tris[N-(4-diphenylaminophenyl)-N-phenylamino]benzene (abbr.: DPA3B); N,N'-bis(spiro-9,9'-bifluoren-2-yl)-N,N'-diphenylbenzidine (abbreviation BSPB); 4,4'-bis[N-(3-methylphenyl)-N-phenylamino]biphenyl] (abbr.: TPD); 4,4',4''-tris(N,N-diphenylamino)triphenylamine (abbr.: TDATA); 4,4',4''-tris[N-(3-methylphenyl)-N-phenylamino]triphenylamine (abbr.: MTDATA); 1,3,5-tris[N,N-di(m-tolyl)amino]benzene (abbr.: m-MTDAB); 4,4',4''-tris(N-carbazolyl)triphenylamine (abbr.: TCTA); 9,10-diphenylanthracene (abbr.: DPAnth); N,N-diphenyl-9-[4-(10-phenyl-9-antryl)phenyl]-9H-carbazol-3-amine (abbr.: CzA1PA); 9-phenyl-9'-[4-(10-phenyl-9-anthryl)phenyl]-3,3'-bi(9H-carbazole) (abbr.: PCCPA); 4-(10-phenyl-9-anthryl)triphenylamine (abbr.: DPhPA); 4-(9H-carbazol-9-yl)-4'-(10-phenyl-9-anthryl)triphenylamine (abbr.: YGAPA); N,9-diphenyl-N-[4-(10-phenyl-9-anthryl)phenyl]-9H-carbazol-3-amine (abbr.: PCAPA); N,9-diphenyl-N-{4-[4-(10-phenyl-9-anthryl)phenyl]phenyl}-9H-carbazol-3-amine (abbr.: PCAPBA); N-(9,10-diphenyl-2-anthryl)-N,9-diphenyl-9H-carbazol-3-amine (abbr.: 2PCAPA); 6,12-dimethoxy-5,11-diphenylchrysene; or N,N,N',N',N'',N''',N'''-octaphenyldibenzo[g,p]chrysene-2,7,10,15-tetraamine (abbr.: DBC1).

In addition, for example, a compound having an electron-transporting property such as the following is preferable: tris(8-quinolinolato)aluminum(III) (abbr.: Alq); tris(4-methyl-8-quinolinolato)aluminum(III) (abbr.: Almq$_3$); bis(10-hydroxybenzo[h]quinolinato)beryllium(II) (abbr.: BeBq$_2$), bis(2-methyl-8-quinolinolato)(4-phenylphenolato)aluminum(III) (abbr.: BAlq); bis(8-quinolinolato)zinc(II) (abbr.: Znq); bis[2-(2-benzoxazolyl)phenolato]zinc(II) (abbr.: ZnPBO); bis[2-(2-benzothiazolyl)phenolato]zinc(II) (abbr.: ZnBTZ); 2-(4-biphenylyl)-5-(4-tert-butylphenyl)-1,3,4-oxadiazole (abbr.: PBD); 1,3-bis[5-β-tert-butylphenyl)-1,3,4-oxadiazol-2-yl]benzene (abbr.: OXD-7); 3-(4-biphenylyl)-4-phenyl-5-(4-tert-butylphenyl)-1,2,4-triazole (abbr.: TAZ01); 2,2',2''-(1,3,5-benzenetriyl)tris(1-phenyl-1H-benzimidazole) (abbr.: TPBI); bathophenanthroline (abbr.: BPhen); bathocuproine (abbr.: BCP); 9-[4-(5-phenyl-1,3,4-oxadiazole-2-yl)phenyl]-9H-carbazole (abbr.: CO11); 9-[4-(10-phenyl-9-anthryl)phenyl]-9H-carbazole (abbr.: CzPA); 3,6-diphenyl-9-[4-(10-phenyl-9-anthryl)phenyl]-9H-carbazole (abbr.: DPCzPA); 9,10-bis(3,5-diphenylphenyl)anthracene (abbr.: DPPA); 9,10-di(2-naphthyl)anthracene (abbr.: DNA); 2-tert-butyl-9,10-di(2-naphthyl)anthracene (abbr.: t-BuDNA); 9,9'-bianthryl (abbr.: BANT); 9,9'-(stilbene-3,3'-diyl)diphenanthrene (abbr.: DPNS); 9,9'-(stilbene-4,4'-diyl)diphenanthrene (abbr.: DPNS2); or 3,3',3''-(benzene-1,3,5-triyl)tripyrene (abbr.: TPB3).

In particular, as described in Embodiment Mode 1, when the control layer is provided between the light-emitting layer and the second electrode, the light-emitting layer preferably has an electron-transporting property. Thus, the host material preferably has an electron-transporting property. Among the above-described host materials, compounds having an electron-transporting property, such as Alq, Almq$_3$, BeBq$_2$, BAlq, Znq, ZnPBO, ZnBTZ, PBD, OXD-7, TAZ01, TPBI, BPhen, BCP, CO11, CzPA, DPCzPA, DPPA, DNA, t-BuDNA, BANT, DPNS, DPNS2, and TPB3 are preferable. In addition, the light-emitting layer is a region in which the density of holes and the density of electrons are both high, and thus the host material is preferably stable against both of an oxidation reaction and a reduction reaction. Accordingly, as a preferable host material, tricyclic, tetracyclic, pentacyclic, and hexacyclic condensed aromatic compounds such as CzPA, DPCzPA, DPPA, DNA, t-BuDNA, BANT, DPNS, DPNS2, and TPB3 are given. In particular, anthracene derivatives such as CzPA, DPCzPA, DPPA, DNA, t-BuDNA, and BANT which are stable and have high energy gaps are preferable as the host material.

As a substance in which the substance with a light-emitting property is dispersed, a plurality of kinds of substances can be used. For example, in order to suppress crystallization, a substance for suppressing crystallization, such as rubrene or the like may be further added. Furthermore, in order to efficiently transfer energy to the substance having a light-emitting property, NPB, Alq or the like may be further added.

With a structure in which a substance with a high light-emitting property is dispersed in another substance, crystallization of the light-emitting layer 111 can be suppressed. Further, concentration quenching due to high concentration of the substance having a high light-emitting property can be suppressed.

Note that for the light-emitting layer 111, a high molecular compound can be used. Specifically, examples of materials for blue light emission are as follows: poly(9,9-dioctylfluorene-2,7-diyl) (abbr.: POF), poly[(9,9-dioctylfluorene-2,7-diyl)-co-(2,5-dimethoxybenzene-1,4-diyl)] (abbr.: PF-DMOP), poly{(9,9-dioctylfluorene-2,7-diyl)-co-[N,N'-di-(p-butylphenyl)-1,4-diaminobenzene]}(abbr.: TAB-PFH), and the like. Examples of materials for green light emission are as follows: poly(p-phenylenevinylene) (abbr.: PPV), poly[(9,9-dihexylfluorene-2,7-diyl)-alt-co-(benzo[2,1,3]thiadiazole-4,7-diyl)] (abbr.: PFBT), poly[(9,9-dioctyl-2,7-divinylenefluorenylene)-alt-co-(2-methoxy-5-(2-ethylhexyloxy)-1,4-phenylene)], and the like. Examples of materials for orange to red light emission are as follows: poly[2-methoxy-5-(2'-ethylhexoxy)-1,4-phenylenevinylene] (abbr.: MEH-PPV), poly(3-butylthiophene-2,5-diyl) (abbr.: R4-PAT), poly{[9,9-dihexyl-2,7-bis(1-cyanovinylene)fluorenylene]-alt-co-[2,5-bis(N,N'-diphenyl amino)-1,4-phenylene]}, poly{[2-methoxy-5-(2-ethylhexyloxy)-1,4-bis(1-cyanovinylenephenylene)]-alt-co-[2,5-bis(N,N'-diphenylamino)-1,4-phenylene]} (abbr.: CN-PPV-DPD), and the like.

As described above, the EL layer 103 described in this embodiment mode includes the light-emitting layer 111 and the control layer 121 for controlling electron transport. That is, there is no particular limitation on the stacked structure of the other layers included in the EL layer 103, and a control layer for controlling carrier transport and a light-emitting layer may be combined, as appropriate, with a layer formed with a substance having a high electron-transporting property, a substance having a high hole-transporting property, a substance having a high electron-injecting property, a substance having a high hole-injecting property, a bipolar substance (a substance having high electron-transporting and hole-transporting properties), or the like. For example, a hole-injecting layer, a hole-transporting layer, an electron-transporting layer, an electron-injecting layer and/or the like may be combined as appropriate. Specific materials to form each of the layers will be given below.

The hole-injecting layer 114 is a layer including a substance having a high hole-injecting property. As a substance having a high hole-injecting property, molybdenum oxide, vanadium oxide, ruthenium oxide, tungsten oxide, manganese oxide, or the like can be used. Besides, as examples of a low molecular organic compound, a phthalocyanine-based compound such as phthalocyanine (abbr.: $H_2Pc$), copper(II) phthalocyanine (abbr.: CuPc), or vanadyl phthalocyanine (VOPc); an aromatic amine compound such as 4,4',4''-tris(N,N-diphenylamino)triphenylamine (abbr.: TDATA), 4,4',4''-tris[N-(3-methylphenyl)-N-phenylamino]triphenylamine (abbr.: MTDATA), 4,4'-bis[N-(4-diphenylaminophenyl)-N-phenylamino]biphenyl (abbr.: DPAB), 4,4'-bis(N-{4-[N'-(3-methylphenyl)-N'-phenylamino]phenyl}-N-phenylamino)biphenyl (abbr.: DNTPD), 1,3,5-tris[N-(4-diphenylaminophenyl)-N-phenylamino]benzene (abbr.: DPA3B), 3-[N-(9-phenylcarbazol-3-yl)-N-phenylamino]-9-phenylcarbazole (abbr.: PCzPCA1), 3,6-bis[N-(9-phenylcarbazol-3-yl)-N-phenylamino]-9-phenylcarbazole (abbr.: PCzPCA2), or 3-[N-(1-naphthyl)-N-(9-phenylcarbazol-3-yl)amino]-9-phenylcarbazole (abbr.: PCzPCN1); and the like can be given.

Alternatively, the hole-injecting layer 114 can be formed using a composite material in which a substance with an acceptor property is mixed into a substance with a high hole-transporting property. It is to be noted that, by using the material with a high hole-transporting property containing an acceptor material, a material used to form an electrode may be selected regardless of its work function. In other words, besides a material with a high work function, a material with a low work function may also be used as the first electrode 102. Such composite materials can be formed by co-evaporation of a substance having a high hole-transporting property and an acceptor substance.

In this specification, the term "composite" refers to not only a state in which two types of materials are simply mixed, but also a state in which electric charges are given and received between materials by the mixture of a plurality of materials.

As the organic compound used for the composite material, various compounds such as an aromatic amine compound, a carbazole derivative, aromatic hydrocarbon, and a high molecular compound (oligomer, dendrimer, polymer, or the like) can be used. The organic compound used for the composite material is preferably an organic compound having a high hole-transporting property. Specifically, a substance having a hole mobility of $10^{-6}$ cm$^2$/Vs or higher is preferably used. Further, any substance whose hole-transporting property is higher than its electron-transporting property can be used, in addition to these substances. The organic compound that can be used for the composite material is specifically shown below.

Examples of organic compounds which can be used for the composite material are as follows: aromatic amine compounds such as MTDATA, TDATA, DPAB, DNTPD, DPA3B, PCzPCA1, PCzPCA2, PCzPCN1, 4,4'-bis[N-(1-naphthyl)-N-phenylamino]biphenyl (abbr.: NPB or α-NPD), and N,N'-bis(3-methylphenyl)-N,N'-diphenyl-[1,1'-biphenyl]-4,4'-diamine (abbr.: TPD); carbazole derivatives such as 4,4'-di(N-carbazolyl)biphenyl (abbr.: CBP), 1,3,5-tris[4-(N-carbazolyl)phenyl]benzene (abbr.: TCPB), 9-[4-(10-phenyl-9-anthryl)phenyl]-9H-carbazole (abbr.: CzPA), and 1,4-bis[4-(N-carbazolyl)phenyl]-2,3,5,6-tetraphenylbenzene; and aromatic hydrocarbon compounds such as 2-tert-butyl-9,10-di(2-naphthyl)anthracene (abbr.: t-BuDNA), 2-tert-butyl-9,10-di(1-naphthyl)anthracene, 9,10-bis(3,5-diphenylphenyl)anthracene (abbr.: DPPA), 2-tert-butyl-9,10-bis(4-phenylphenyl)anthracene (abbr.: t-BuDBA), 9,10-di(2-naphthyl)anthracene (abbr.: DNA), 9,10-diphenylanthracene (abbr.: DPAnth), 2-tert-butylanthracene (abbr.: t-BuAnth), 9,10-bis(4-methyl-1-naphthyl)anthracene (abbr.: DMNA), 9,10-bis[2-(1-naphthyl)phenyl]-2-tert-butyl-anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenylvinyl)biphenyl (abbr.: DPVBi), and 9,10-bis[4-(2,2-diphenylvinyl)phenyl]anthracene (abbr.: DPVPA).

Examples of the acceptor substance are as follows: organic compounds such as 7,7,8,8-tetracyano-2,3,5,6-tetrafluoro-quinodimethane (abbr.: $F_4$-TCNQ) and chloranil; and transition metal oxides. Other examples are oxides of metals belonging to Group 4 to Group 8 of the periodic table. Specifically, vanadium oxide, niobium oxide, tantalum oxide, chromium oxide, molybdenum oxide, tungsten oxide, manganese oxide, and rhenium oxide are preferable because of their high electron-accepting properties. Among these, molybdenum oxide is especially preferable because it is stable in air and its hygroscopic property is low so that it can be easily handled.

Furthermore, for the hole-injecting layer 114, a high molecular compound (an oligomer, a dendrimer, a polymer, or the like) can be used. Examples of high molecular compounds include poly(N-vinylcarbazole) (abbr.: PVK), poly(4-vinyltriphenylamine) (abbr.: PVTPA), poly[N-(4-{N'-[4-(4-diphenylamino)phenyl]phenyl-N'-phenylamino}phenyl)methacrylamide] (abbr.: PTPDMA), and poly[N,N'-bis(4-butylphenyl)-N,N'-bis(phenyl)benzidine] (abbr.: Poly-TPD). In addition, a high molecular compound to which acid is added, such as poly(3,4-ethylenedioxythiophene)/poly(styrenesulfonic acid) (PEDOT/PSS) or polyaniline/poly(styrenesulfonic acid) (PAni/PSS), can be used.

Moreover, a composite material formed by using the above-mentioned high molecular compound such as PVK, PVTPA, PTPDMA, or Poly-TPD and the above-mentioned acceptor substance can be used for the hole-injecting layer 114.

The hole-transporting layer 112 is a layer including a substance having a high hole-transporting property. As a substance having a high hole-transporting property, a low molecular compound can be used, and examples thereof include aromatic amine compounds such as NPB (or α-NPD), TPD, 4,4'-bis[N-(9,9-dimethylfluoren-2-yl)-N-phenylamino]biphenyl (abbr.: DFLDPBi), and 4,4'-bis[N-(spiro-9,9'-bifluoren-2-yl)-N-phenylamino]biphenyl (abbr.: BSPB). The substances mentioned here mainly have a hole mobility of $10^{-6}$ cm$^2$/Vs or higher. However, any other substances may also be used as long as the hole-transporting properties thereof are higher than the electron-transporting properties thereof. Note that the layer including a substance having a high hole-transporting property is not limited to a single layer, but two or more layers including any of the above-mentioned substances may be stacked.

Furthermore, for the hole-transporting layer 112, a high molecular compound can be used. Examples of high molecular compounds include poly(N-vinylcarbazole) (abbr.: PVK), poly(4-vinyltriphenylamine) (abbr.: PVTPA), poly[N-(4-{N'-[4-(4-diphenylamino)phenyl]phenyl-N'-phenylamino}phenyl)methacrylamide] (abbr.: PTPDMA), and poly[N,N'-bis(4-butylphenyl)-N,N'-bis(phenyl)benzidine (abbr.: Poly-TPD).

The electron-transporting layer 113 is a layer including a high electron-transporting property. For example, as a low molecular organic compound, metal complexes such as tris(8-quinolinolato)aluminum(III) (abbr.: Alq), tris(4-methyl-8-quinolinolato)aluminum(III) (abbr.: Almq$_3$), bis(10-hydroxybenzo[h]quinolinato)beryllium(II) (abbr.: BeBq$_2$), bis(2-methyl-8-quinolinolato)(4-phenylphenolato)aluminum(III) (abbr.: BAlq), bis(8-quinolinolato)zinc(II) (abbr.: Znq), bis[2-(2-benzoxazolyl)phenolato]zinc(II) (abbr.: ZnPBO), and bis[2-(2-benzothiazolyl)phenolato]zinc(II) (abbr.: ZnBTZ) can be used. Further, examples other than metal complexes are heterocyclic compounds such as 2-(4-biphenylyl)-5-(4-tert-butylphenyl)-1,3,4-oxadiazole (abbr.: PBD), 1,3-bis[5-(p-tert-butylphenyl)-1,3,4-oxadiazol-2-yl]benzene (abbr.: OXD-7), 3-(4-biphenylyl)-4-phenyl-5-(4-tert-butylphenyl)-1,2,4-triazole (abbr.: TAZ01), 2,2',2''-(1,3,5-benzenetriyl)tris(1-phenyl-1H-benzimidazole) (abbr.: TPBI), bathophenanthroline (abbr.: BPhen), and bathocuproine (abbr.: BCP). The substances mentioned here mainly have an electron mobility of $10^{-6}$ cm$^2$/Vs or higher. Note that substances other than the substances mentioned above may also be used for the electron-transporting layer as long as the electron-transporting properties thereof are higher than the hole-transporting properties thereof. Note that the electron-transporting layer is not limited to a single layer, but two or more layers including the above-mentioned substances may be stacked.

In addition, a high molecular compound can be used for the electron-transporting layer 113. Examples thereof are poly[(9,9-dihexylfluorene-2,7-diyl)-co-(pyridine-3,5-diyl)] (abbr.: PF-Py), poly[(9,9-dioctylfluorene-2,7-diyl)-co-(2,2'-bipyridine-6,6'-diyl)] (abbr.: PF-BPy), and the like.

The electron-injecting layer 115 is a layer including a substance having a high electron-injecting property. As the substance having a high electron injecting property, alkali metals, alkaline earth metals, or compounds thereof such as lithium fluoride (LiF), cesium fluoride (CsF), and calcium fluoride (CaF$_2$) can be used. For example, a layer of a material having an electron-transporting property containing an alkali metal, an alkaline earth metal, or a compound thereof, such as Alq which contains magnesium (Mg), may be used. By using a layer of a substance having an electron-transporting property containing an alkali metal or an alkaline earth metal as the electron-injecting layer, electron injection from the second electrode 104 is performed efficiently, which is preferable.

Various methods can be used for forming the EL layer 103 regardless of a dry method or a wet method. For example, a vacuum evaporation method, an inkjet method, a spin coating method, or the like may be used. Further, a different formation method may be adopted for each electrode or each layer.

For example, the EL layer may be formed by a wet method using a high molecular compound selected from the above-described materials. Further, the EL layer can also be formed by a wet method using a low molecular organic compound. Furthermore, the EL layer may be formed by a dry method such as vacuum evaporation using a low molecular organic compound.

The electrode may be formed by a wet method using sol-gel method, or by a wet method using a paste of a metal material. Further, the electrode may be formed by a dry method such as sputtering or vacuum evaporation.

For example, in the case where the light-emitting element of an aspect of the present invention is applied to a display device and its light-emitting layer is selectively deposited according to each color, each light-emitting layer is preferably formed by a wet process. When the light-emitting layers are formed using an inkjet method, it becomes easy to form the light-emitting layer for each color even over a large-sized substrate.

In the light-emitting element of an aspect of the present invention having the structure as described above, current flows between the first electrode 102 and the second electrode 104 by application of voltage, and holes and electrons are recombined in the EL layer 103; whereby light is emitted.

Figure 4A:
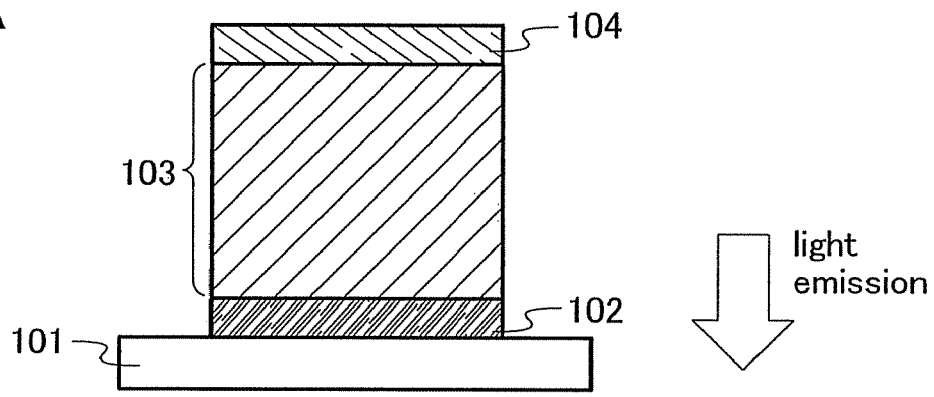
FIGS. 4A to 4C illustrate light-emitting elements according to aspects of the present invention.
Figure 4B:
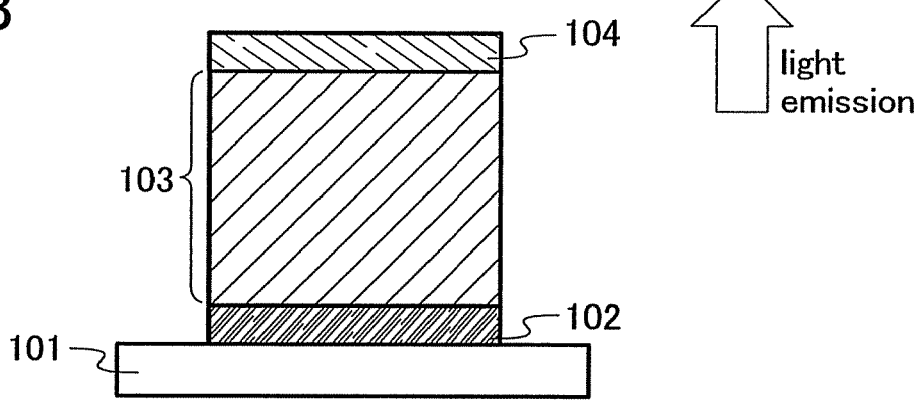
Figure 4C:
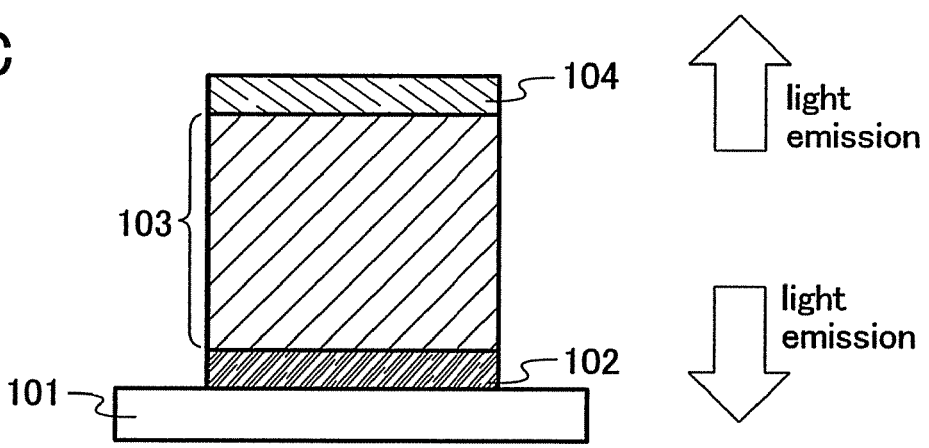

The emitted light is extracted out through one or both of the first electrode 102 and the second electrode 104. Accordingly, one or both of the first electrode 102 and the second electrode 104 is/are an electrode having a light transmitting property. In a case where only the first electrode 102 has a light transmitting property, light emission is extracted from a substrate side through the first electrode 102 as shown in FIG. 4A. In the case where only the second electrode 104 is a light-transmitting electrode, as shown in FIG. 4B, light is extracted from the side opposite to the substrate through the second electrode 104. When each of the first electrode 102 and the second electrode 104 has a light-transmitting property, the emitted light is extracted from both the substrate side and the side opposite to the substrate side through the first electrode 102 and the second electrode 104 as shown in FIG. 4C.

The structure of layers provided between the first electrode 102 and the second electrode 104 are not limited to the above example. Any structure besides the above can be employed as long as a light-emitting region for recombination of holes and electrons is positioned away from the first electrode 102 and the second electrode 104 so as to prevent quenching due to the proximity of the light-emitting region and a metal, and also a control layer for controlling the carrier transport is provided.

That is, the stacked structure of the layers is not particularly limited. It is acceptable as long as layers made of a substance with a high electron-transporting property, a substance with a high hole-transporting property, a substance with a high electron-injection property, a substance with a high hole-injecting property, and a substance with a bipolar property (a substance having both high electron and hole transporting properties) are appropriately combined with the control layer for controlling the carrier transport and the light-emitting layer that are shown in this embodiment mode.

Figure 2A:
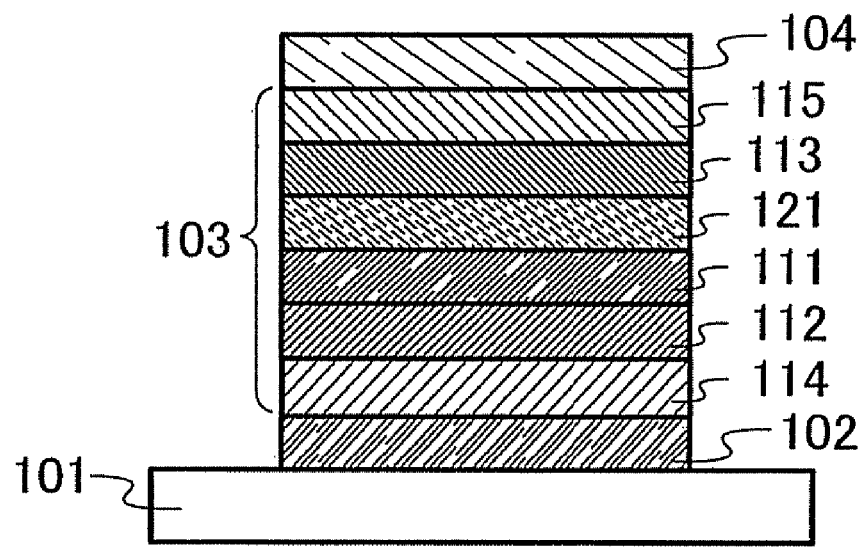
FIGS. 2A and 2B illustrate a light-emitting element according to an aspect of the present invention.

Since the control layer for controlling the electron transport controls the electron transport, it is preferably provided between the light-emitting layer and the electrode functioning as a cathode. As illustrated in FIG. 2A, the control layer for controlling the electron transport is more preferably provided to be in contact with the light-emitting layer. By providing the control layer for controlling the electron transport to be in contact with the light-emitting layer, electron injection into the light-emitting layer can be directly controlled. Therefore, change in carrier balance with time in the light-emitting layer can be suppressed more efficiently, whereby the lifetime of the element can be more effectively improved. Furthermore, the process can be simplified.

Note that the control layer for controlling the electron transport is preferably provided to be in contact with the light-emitting layer, and in such a case, a first organic compound contained in the control layer for controlling electron transport is preferably a different kind of an organic compound from the organic compound which is included more in the light-emitting layer. In particular, in the case where the light-emitting layer includes a substance in which a substance having a high light-emitting property (a third organic compound) is dispersed and the substance having a high light-emitting property (a fourth organic compound), the structures of the third organic compound and the first organic compound are preferably different from each other. With such a structure, the electron transport from the control layer for controlling the electron transport to the light-emitting layer can be suppressed between the first organic compound and the third organic compound. Thus, the effect obtained by providing the control layer for controlling the electron transport can be further heightened.

Figure 2B:
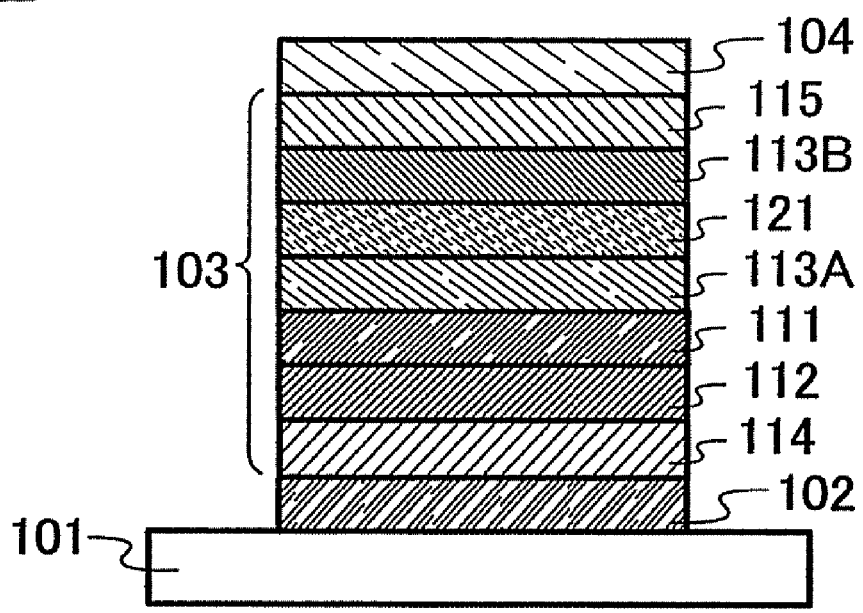

As illustrated in FIG. 2B, a layer may be formed between the light-emitting layer 111 and the control layer 121 for controlling the electron transport. In FIG. 2B, a first electron-transporting layer 113A is provided between the light-emitting layer 111 and the control layer 121 for controlling electron transport, and a second electron-transporting layer 113B is provided between the control layer 121 for controlling electron transport and the electron-injecting layer 115.

Figure 3A:
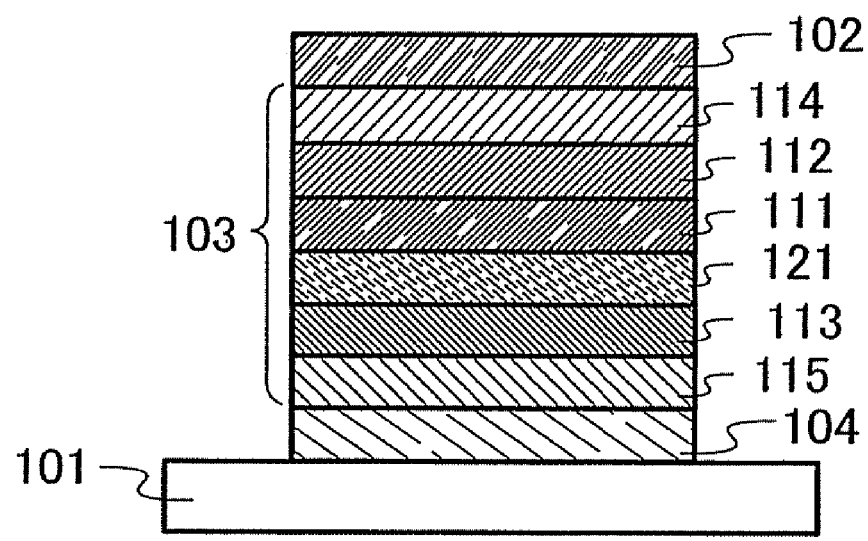
FIGS. 3A and 3B illustrate a light-emitting element according to an aspect of the present invention.
Figure 3B:
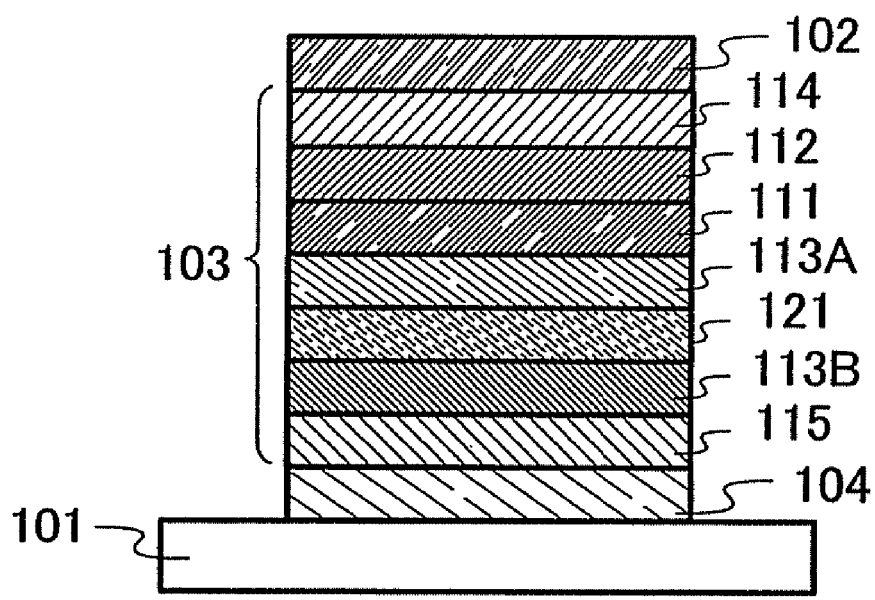

In addition, as illustrated in FIGS. 3A and 3B, over the substrate 101, the second electrode 104 functioning as a cathode, the EL layer 103, and the first electrode 102 functioning as an anode may be stacked in this order. In FIG. 3A, a structure is employed in which the electron-injecting layer 115, the electron-transporting layer 113, the control layer 121 for controlling electron transport, the light-emitting layer 111, the hole-transporting layer 112, and the hole-injecting layer 114 are stacked sequentially over the second electrode 104. In FIG. 3B, a structure is employed in which the electron-injecting layer 115, the second electron-transporting layer 113B, the control layer 121 for controlling electron transport, the first electron-transporting layer 113A, the light-emitting layer 111, the hole-transporting layer 112, and the hole-injecting layer 114 are stacked sequentially over the second electrode 104.

In this embodiment mode, the light-emitting element is formed over a substrate made of glass, plastic, or the like. By forming a plurality of such light-emitting elements over a substrate, a passive matrix light-emitting device can be manufactured. Moreover, the light-emitting element may be manufactured over an electrode electrically connected to, for example, a thin film transistor (TFT) formed over a substrate made of glass, plastic, or the like. Thus, an active matrix light-emitting device which controls the driving of a light-emitting element by a TFT can be manufactured. Note that the structure of a TFT is not particularly limited, and either a staggered TFT or an inverted staggered TFT may be used. In addition, a driving circuit formed over a TFT substrate may be formed using an n-channel TFT and a p-channel TFT, or may be formed using any one of an N-channel TFT and a p-channel TFT. In addition, the crystallinity of a semiconductor film used for the TFT is not particularly limited. Either an amorphous semiconductor film or a crystalline semiconductor film may be used for the TFT. Further, a single crystalline semiconductor film may be used. The single crystalline semiconductor film can be formed by a Smart Cut (registered trademark) method or the like.

As described above, the light-emitting element described in this embodiment mode has a feature that the control layer 121 for controlling electron transport is provided. With the concentration and the carrier-trapping property of the second organic compound included in the control layer under certain conditions, a light-emitting element having less deterioration and long lifetime can be obtained.

Note that this embodiment mode can be combined with any of the embodiment modes as appropriate.

Embodiment Mode 3

In Embodiment Mode 3, a mode of a light-emitting element in which a plurality of light-emitting units according to an aspect of the present invention are stacked (hereinafter, referred to as a stacked type element) will now be described with reference to FIG. 5. The light-emitting element is a stacked-type element including a plurality of light-emitting units between a first electrode and a second electrode. Each structure of the light-emitting units can be similar to that described in Embodiment Mode 1 or Embodiment Mode 2. In other words, the light-emitting element described in Embodiment Mode 1 or Embodiment Mode 2 is a light-emitting element having one light-emitting unit. In this embodiment mode, a light-emitting element having a plurality of light-emitting units will be described.

Figure 5:
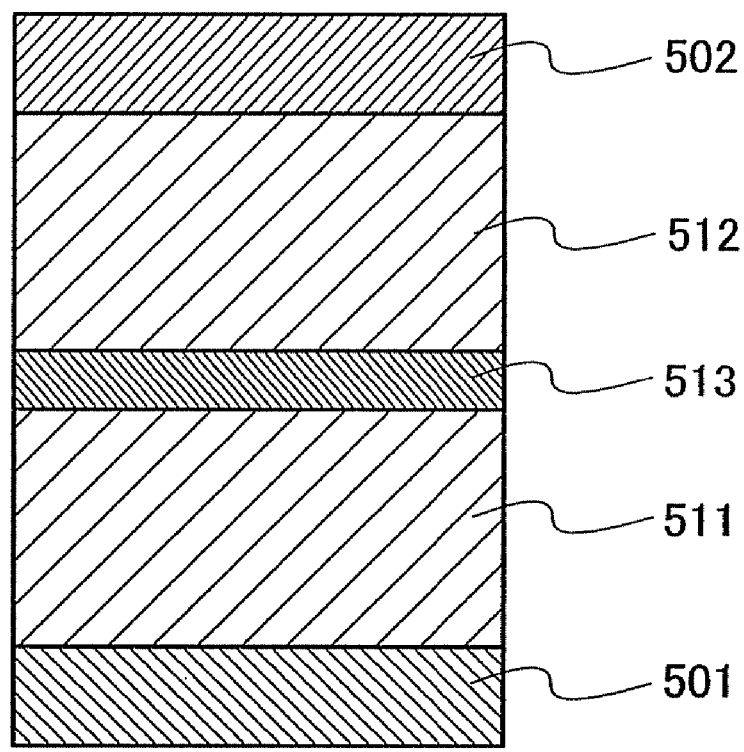
FIG. 5 illustrates a light-emitting element according to an aspect of the present invention.

In FIG. 5, a first light-emitting unit 511 and a second light-emitting unit 512 are stacked between a first electrode 501 and a second electrode 502. Materials similar to those in Embodiment Mode 2 can be applied to the first electrode 501 and the second electrode 502. The first light-emitting unit 511 and the second light-emitting unit 512 may have either the same or a different structure, which can be similar to that described in Embodiment Mod 2.

A charge-generating layer 513 is a layer which injects electrons into a light-emitting unit on one side and injects holes into a light-emitting unit on the other side when voltage is applied to the first electrode 501 and the second electrode 502, and may be either a single layer or a stacked structure of two or more layers. As a stacked structure of plural layers, a structure in which a hole-injecting layer and an electron-injecting layer are stacked is preferable.

As the hole-injecting layer, a semiconductor or an insulator, such as molybdenum oxide, vanadium oxide, rhenium oxide, or ruthenium oxide, can be used. Alternatively, the hole-injecting layer may have a structure in which an acceptor substance is added to a substance having a high hole-transporting property. The layer including a substance having a high hole-transporting property and an acceptor substance is formed with the composite material shown in Embodiment Mode 2 and includes, as an acceptor substance, 7,7,8,8-tetracyano-2,3,5,6-tetrafluoroquinodimethane (abbr.: $F_4$-TCNQ) or metal oxide such as vanadium oxide, molybdenum oxide, or tungsten oxide. As the substance having a high hole-transporting property, various compounds such as an aromatic amine compound, a carbazole derivative, an aromatic hydrocarbon, a high molecular compound (an oligomer, a dendrimer, and a polymer, or the like) can be used. Note that a substance having a hole mobility of $10^{-6}$ cm$^2$/Vs or higher is preferably employed as the substance having a high hole-transporting property. However, other substances may also be used as long as the hole-transporting properties thereof are higher than the electron-transporting properties thereof. Since the composite material of the substance having a high hole-transporting property and the acceptor substance has excellent carrier-injecting and carrier-transporting properties, low-voltage driving and low-current driving can be realized.

As the electron-injecting layer, an insulator or a semiconductor, such as lithium oxide, lithium fluoride, or cesium carbonate, can be used. Alternatively, the electron-injecting layer may have a structure in which a donor substance is added to a substance having a high electron-transporting property. As the donor substance, an alkali metal, an alkaline earth metal, a rare earth metal, a metal belonging to Group 13 of the periodic table, or an oxide or carbonate thereof can be used. Specifically, lithium (Li), cesium (Cs), magnesium (Mg), calcium (Ca), ytterbium (Yb), indium (In), lithium oxide, cesium carbonate, or the like is preferably used. Alternatively, an organic compound such as tetrathianaphthacene may be used as the donor substance. As the substance having a high electron-transporting property, the materials shown in Embodiment Mode 2 can be used. Note that a substance having an electron mobility of $10^{-6}$ cm$^2$/Vs or higher is preferably employed as the substance having a high electron-transporting property. However, other substances may also be used as long as the electron-transporting properties thereof are higher than the hole-transporting properties thereof. Since the composite material of the substance having a high electron-transporting property and the donor substance has excellent carrier-injecting and carrier-transporting properties, low-voltage driving and low-current driving can be realized.

Further, the electrode materials shown in Embodiment Mode 2 can be used for the charge-generating layer 513. For example, the charge-generating layer 513 may be formed with a combination of a layer including a substance having a hole-transporting property and metal oxide with a transparent conductive film. Note that a layer having a high light-transmitting property is preferably used as the charge-generating layer in terms of light extraction efficiency.

In any case, it is acceptable as long as the charge-generating layer 513 interposed between the first light-emitting unit 511 and the second light-emitting unit 512 injects electrons into a light-emitting unit on one side and injects holes into a light-emitting unit on the other side when voltage is applied to the first electrode 501 and the second electrode 502. For example, any structure is acceptable for the charge-generating layer 513 as long as the charge-generating layer 513 injects electrons into the first light-emitting unit 511 and holes into the second light-emitting unit 512 when voltage is applied so that potential of the first electrode becomes higher than potential of the second electrode.

In this embodiment mode, the light-emitting element having two light-emitting units is described. However, the present invention can similarly be applied to a light-emitting element in which three or more light-emitting units are stacked. When a charge-generating layer is provided between a pair of electrode layers so as to partition a plurality of light-emitting units, as in the light-emitting element of this embodiment mode, a long lifetime element in a high luminance range can be realized while current density is kept low. When the light-emitting element is applied to a lighting device, voltage drop due to resistance of an electrode material can be suppressed, thereby achieving homogeneous light emission in a large area. Moreover, a light-emitting device with low driving voltage and low power consumption can be realized.

When light-emitting units are formed to emit light of different colors from each other, a light-emitting element as a whole can provide light emission of a desired color. For example, when a light-emitting element having two light-emitting units is formed such that the emission color of the first light-emitting unit and the emission color of the second light-emitting unit are complementary to each other, the light-emitting element can provide white light emission as a whole. Note that "complementary colors" refer to colors which can produce an achromatic color when mixed. That is, when light emitted from substances which emit light of complementary colors is mixed, white light emission can be obtained. The same can be applied to a light-emitting element which has three light-emitting units. For example, the light-emitting element as a whole can provide white light emission when the emission color of the first light-emitting unit is red, the emission color of the second light-emitting unit is green, and the emission color of the third light-emitting unit is blue.

Note that this embodiment mode can be combined with any of the other embodiment modes as appropriate.

Embodiment Mode 4

In this embodiment mode, a light-emitting device having a light-emitting element according to an aspect of the present invention will be described.

Figure 6A:
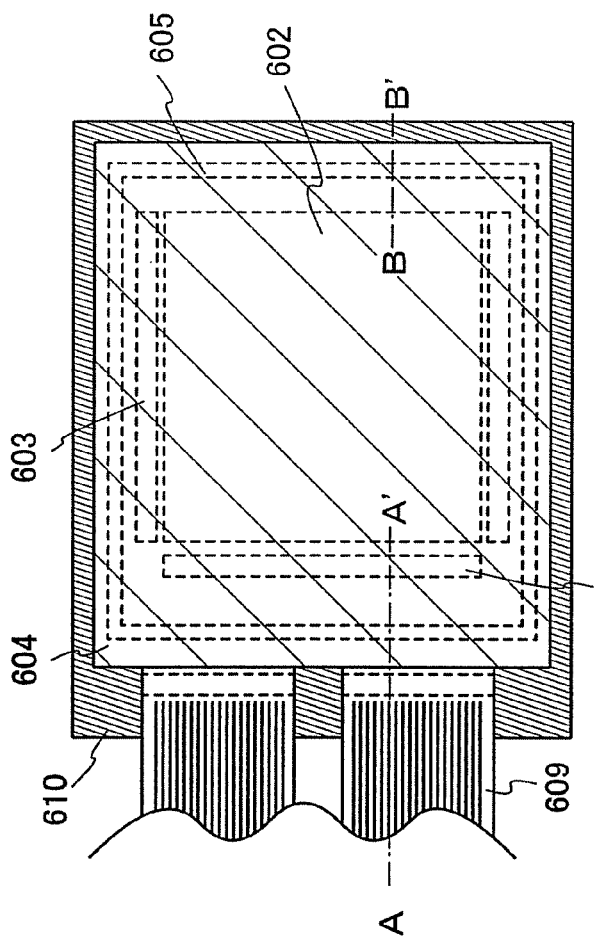
FIGS. 6A and 6B illustrate a light-emitting device according to an aspect of the present invention.
Figure 6B:
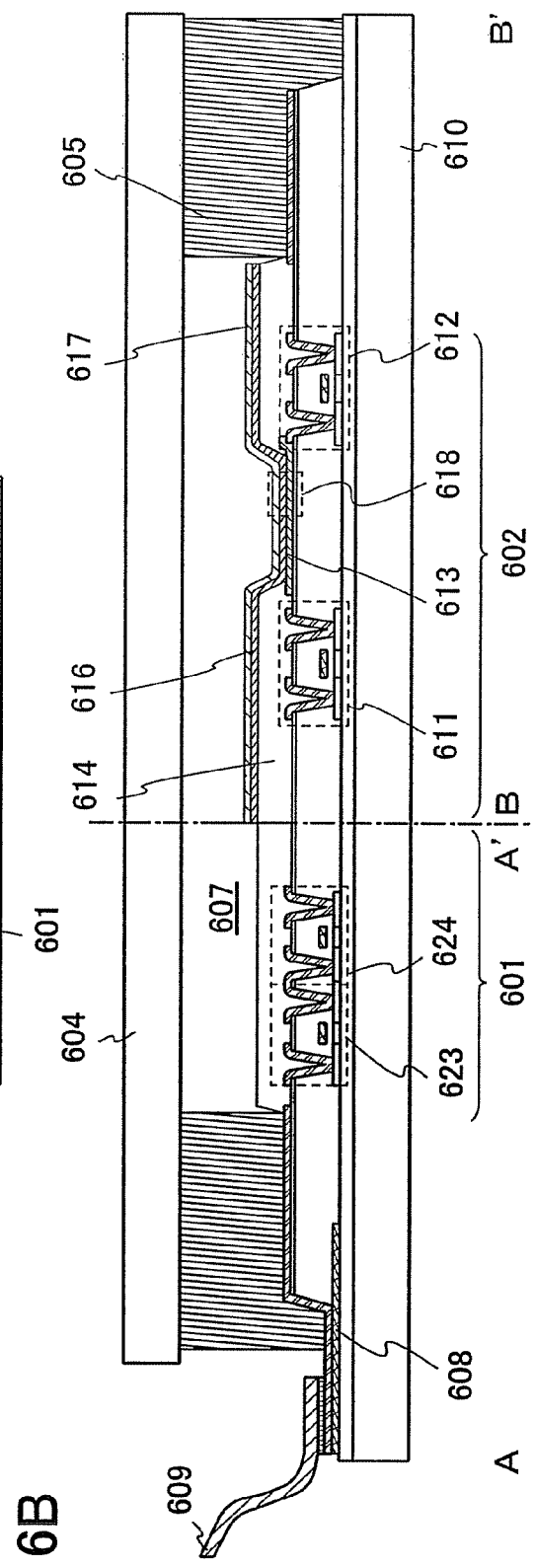

A light-emitting device having a light-emitting element of the present invention in a pixel portion is described in this embodiment mode with reference to FIGS. 6A and 6B. Note that FIG. 6A is a top view illustrating the light-emitting device and FIG. 6B is a cross-sectional view of FIG. 6A taken along lines A-A' and B-B'. This light-emitting device includes a driver circuit portion (source side driver circuit) 601, a pixel portion 602, and a driver circuit portion (gate side driver circuit) 603, which are indicated by dotted lines, in order to control the light emission of the light-emitting element. Further, reference numeral 604 denotes a sealing substrate and reference numeral 605 denotes a sealing material. Reference numeral 607 denotes a space surrounded by the sealing material 605.

Note that a leading wiring 608 is a wiring for transmitting signals that are input to the source side driver circuit 601 and the gate side driver circuit 603. The leading wiring 608 receives video signals, clock signals, start signals, reset signals, and the like from an FPC (flexible printed circuit) 609 that serves as an external input terminal. Although only an FPC is illustrated here, this FPC may be provided with a printed wiring board (PWB). The light-emitting device in this specification includes not only a light-emitting device itself but also a light-emitting device with an FPC or a PWB attached thereto.

Then, a cross-sectional structure is described with reference to FIG. 6B. The driver circuit portions and the pixel portion are provided over an element substrate 610, but only the source side driver circuit 601, which is the driver circuit portion, and one pixel of the pixel portion 602 are illustrated in FIG. 6B.

Note that a CMOS circuit which is a combination of an n-channel TFT 623 and a p-channel TFT 624 is formed in the source side driver circuit 601. The driver circuit may be formed with various types of circuits such as CMOS circuits, PMOS circuits, or NMOS circuits. In this embodiment mode, a driver-integrated type in which a driver circuit is formed over the substrate provided with the pixel portion is described; however, the present invention is not limited to this type, and the driver circuit can be formed outside the substrate.

The pixel portion 602 includes a plurality of pixels each having a switching TFT 611, a current controlling TFT 612, and a first electrode 613 that is electrically connected to a drain of the current controlling TFT 612. Note that an insulator 614 is formed to cover the end portion of the first electrode 613. Here, a positive photosensitive acrylic resin film is used to form the insulator 614.

Further, in order to improve the coverage, the insulator 614 is provided such that either an upper end portion or a lower end portion of the insulator 614 has a curved surface with a curvature. For example, when positive photosensitive acrylic is used as a material for the insulator 614, it is preferable that only an upper end portion of the insulator 614 have a curved surface with a radius of curvature (0.2 μm to 3 μm). The insulator 614 can be formed using either a negative type that becomes insoluble in an etchant by light irradiation or a positive type that becomes soluble in an etchant by light irradiation.

An EL layer 616 and a second electrode 617 are formed over the first electrode 613. Here, various metals, alloys, electrically conductive compounds, or mixtures thereof can be used for a material of the first electrode 613. If the first electrode is used as an anode, it is preferable that the first electrode be formed using a metal, an alloy, an electrically conductive compound, or a mixture thereof with a high work function (preferably, a work function of 4.0 eV or higher) among such materials. For example, the first electrode 613 can be formed using a single-layer film such as an indium tin oxide film containing silicon, an indium zinc oxide film, a titanium nitride film, a chromium film, a tungsten film, a Zn film, a Pt film, or the like; a stacked film of a titanium nitride film and a film containing aluminum as its main component; or a three-layer structure of a titanium nitride film, a film containing aluminum as its main component, and a titanium nitride film. Note that when a stacked structure is employed, the first electrode 613 has low resistance as a wiring, forms a favorable ohmic contact, and can serve as an anode.

The EL layer 616 is formed by various methods such as an evaporation method using an evaporation mask, an inkjet method, a spin coating method, and the like. The EL layer 616 includes the control layer for controlling carrier transport shown in Embodiment Modes 1 and 2. Any of a low molecular compound, a high molecular compound (an oligomer, a dendrimer, and a polymer, or the like) may be employed as a material for the EL layer 616. As the material for the EL layer, not only an organic compound but also an inorganic compound may be used.

As the material for the second electrode 617, various types of metals, alloys, electrically conductive compounds, mixtures thereof, and the like can be used. If the second electrode is used as a cathode, it is preferable that the second electrode be formed using a metal, an alloy, an electrically conductive compound, a mixture thereof, or the like with a low work function (preferably, a work function of 3.8 eV or lower) among such materials. Examples include: elements belonging to Group 1 and Group 2 of the periodic table, that is, alkali metals such as lithium (Li) and cesium (Cs) and alkaline earth metals such as magnesium (Mg), calcium (Ca), and strontium (Sr); alloys thereof (MgAg, AlLi); and the like. In the case where light generated in the EL layer 616 is transmitted through the second electrode 617, the second electrode 617 may also be formed using a stacked layer of a thin metal film with a small film thickness and a transparent conductive film (indium tin oxide (ITO), indium tin oxide containing silicon or silicon oxide, indium zinc oxide (IZO), indium oxide containing tungsten oxide and zinc oxide (IWZO), or the like).

By attaching the sealing substrate 604 and the element substrate 610 to each other with the sealing material 605, a light-emitting element 618 is provided in the space 607 which is surrounded by the element substrate 610, the sealing substrate 604, and the sealing material 605. Note that the space 607 is filled with a filler. There are also cases where the space 607 may be filled with an inert gas (such as nitrogen or argon) as such a filler, or where the space 607 may be filled with the sealing material 605.

As the sealing material 605, an epoxy-based resin is preferably used. In addition, it is desirable that a material thereof allows as little moisture or oxygen as possible to permeate. As the sealing substrate 604, a plastic substrate formed of fiberglass-reinforced plastics (FRP), polyvinyl fluoride (PVF), polyester, acrylic, or the like can be used besides a glass substrate or a quartz substrate.

As described above, the light-emitting device including a light-emitting element according to an aspect of the present invention can be obtained.

A light-emitting device of the present invention includes any of the light-emitting elements shown in Embodiment Modes 1 and 2. Therefore, a light-emitting device which is hard to deteriorate and has long lifetime can be obtained.

Figure 7A:
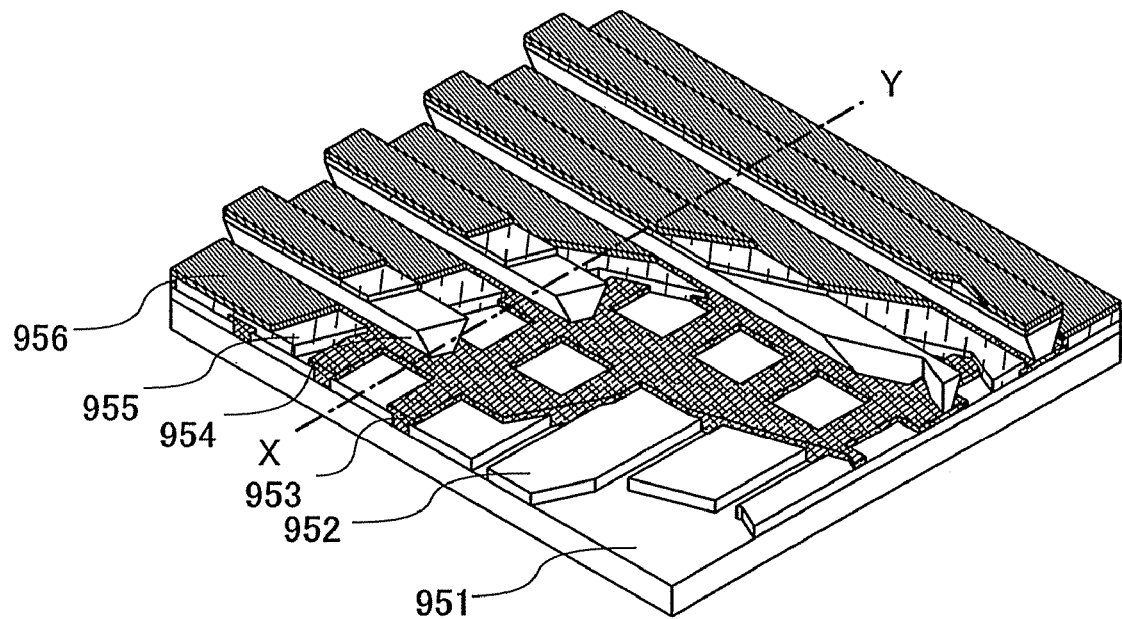
FIGS. 7A and 7B illustrate a light-emitting device according to an aspect of the present invention.
Figure 7B:
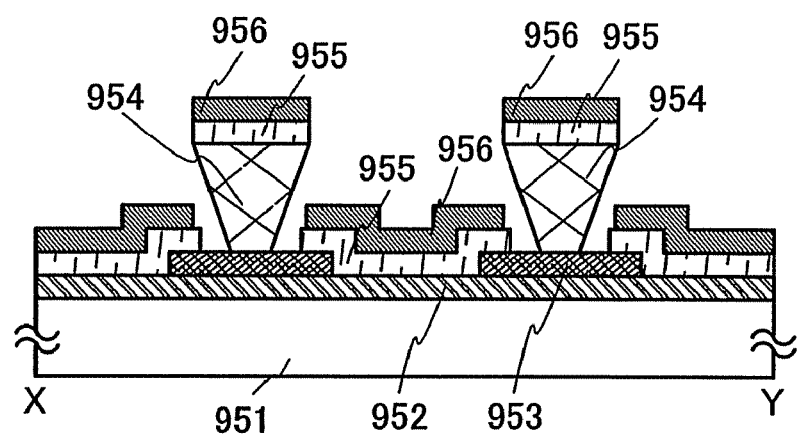

As described above, an active matrix light-emitting device that controls driving of a light-emitting element with a transistor is described in this embodiment mode; however, the present invention can also be applied to a passive matrix light-emitting device. FIGS. 7A and 7B illustrate a passive matrix light-emitting device manufactured according to aspect of the present invention. Note that FIG. 7A is a perspective view of the light-emitting device and FIG. 7B is a cross-sectional view of FIG. 7A taken along a line X-Y. In FIGS. 7A and 7B, an EL layer 955 is provided between an electrode 952 and an electrode 956 over a substrate 951. The end portion of the electrode 952 is covered with an insulating layer 953. A partition layer 954 is provided over the insulating layer 953. The sidewalls of the partition layer 954 slope so that the distance between one sidewall and the other sidewall is gradually reduced toward the surface of the substrate. In other words, a cross section taken along the direction of the short side of the partition layer 954 is trapezoidal, and the lower side (a side in contact with the insulating layer 953, which is one of a pair of parallel sides of the trapezoidal cross section) is shorter than the upper side (a side not in contact with the insulating layer 953, which is the other one of the pair of parallel sides). The cathode can be patterned by providing the partition layer 954 in this manner. In addition, as for a passive matrix light-emitting device, a light-emitting device with long lifetime can be obtained by including a light-emitting element with less deterioration and long lifetime according to an aspect of the present invention.

Note that this embodiment mode can be combined with any of the other embodiment modes as appropriate.

Embodiment Mode 5

In this embodiment mode, electronic devices according to an aspect of the present invention which includes the light-emitting device described in Embodiment Mode 3 as a part will be described. Electronic devices according to an aspect of the present invention include any of the light-emitting elements described in Embodiment Modes 1 and 2 and a display portion with long lifetime.

Examples of electronic devices each manufactured using a light-emitting device of the present invention can be given as follows: cameras such as video cameras and digital cameras, goggle type displays, navigation systems, audio reproducing devices (car audio sets, audio component sets, and the like), computers, game machines, portable information terminals (mobile computers, cellular phones, portable game machines, electronic book readers, and the like), image reproducing devices each provided with a storage medium (specifically, devices each provided with a display device that can reproduce a storage medium such as a digital versatile disc (DVD) and display the image), and the like. Specific examples of these electronic devices are illustrated in FIGS. 8A to 8D.

Figure 8A:
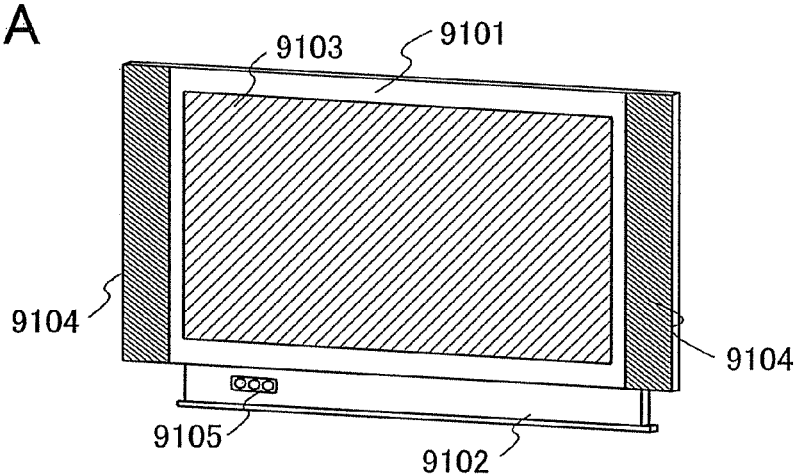
FIGS. 8A to 8D illustrate electronic devices according to an aspect of the present invention.

FIG. 8A illustrates a television device of this embodiment mode, which includes a housing 9101, a support 9102, a display portion 9103, speaker portions 9104, a video input terminal 9105, and the like. In the display portion 9103 of this television device, light-emitting elements similar to those described in Embodiment Modes 1 and 2 are arranged in matrix. Features of the light-emitting elements are less deterioration and long lifetime. The display portion 9103 which includes the light-emitting elements has similar features. Therefore, in this television device, deterioration in image quality is small. With such features, a deterioration compensation function can be eliminated or reduced drastically in the television device; therefore, reduction in size and weight of the housing 9101 and the support 9102 can be achieved. In the television device of this embodiment mode, high image quality and reduction in size and weight are achieved; therefore, a product which is suitable for living environment can be provided.

Figure 8B:
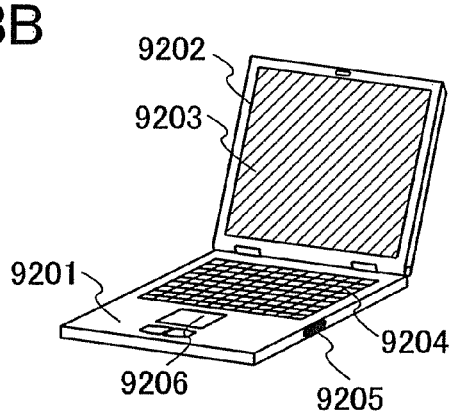

FIG. 8B illustrates a computer of this embodiment mode, which includes a main body 9201, a housing 9202, a display portion 9203, a keyboard 9204, an external connection port 9205, a pointing device 9206, and the like. In the display portion 9203 of this computer, light-emitting elements similar to those described in Embodiment Modes 1 and 2 are arranged in matrix. Features of the light-emitting element are less deterioration and long lifetime. The display portion 9203 which includes the light-emitting elements has similar features. Therefore, in this computer, deterioration in image quality is small. With such features, a deterioration compensation function can be eliminated or reduced drastically in the computer; therefore, reduction in size and weight of the main body 9201 and the housing 9202 can be achieved. In the computer of this embodiment mode, high image quality and reduction in size and weight are achieved; therefore, a product which is suitable for environment can be provided.

Figure 8C:
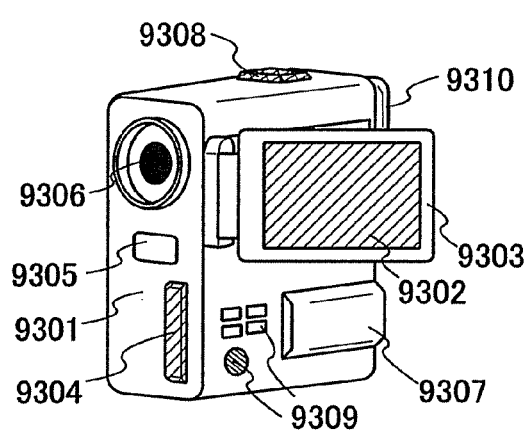

FIG. 8C illustrates a camera that includes a main body 9301, a display portion 9302, a housing 9303, an external connection port 9304, a remote control receiving portion 9305, an image receiving portion 9306, a battery 9307, an audio input portion 9308, operation keys 9309, an eyepiece portion 9310, and the like. In the display portion 9302 of this camera, light-emitting elements similar to those described in Embodiment Modes 1 and 2 are arranged in matrix. Features of the light-emitting elements are less deterioration and long lifetime. The display portion 9302 which includes the light-emitting elements has similar features. Therefore, in this camera, deterioration in image quality is small. With such features, a deterioration compensation function can be eliminated or reduced drastically in the camera; therefore, reduction in size and weight of the main body 9301 can be achieved. In the camera of this embodiment mode, high image quality and reduction in size and weight are achieved; therefore, a product which is suitable for being carried around can be provided.

Figure 8D:
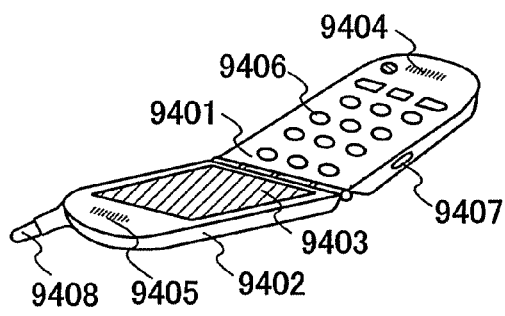

FIG. 8D illustrates a cellular phone of this embodiment mode, which includes a main body 9401, a housing 9402, a display portion 9403, an audio input portion 9404, an audio output portion 9405, operation keys 9406, an external connection port 9407, an antenna 9408, and the like. In the display portion 9403 of this cellular phone, light-emitting elements similar to those described in Embodiment Modes 1 and 2 are arranged in matrix. Features of the light-emitting elements are less deterioration and long lifetime. The display portion 9403 which includes the light-emitting elements has similar features. Therefore, in this cellular phone, deterioration in image quality is small. With such features, a deterioration compensation function can be eliminated or reduced drastically in the cellular phone; therefore, reduction in size and weight of the main body 9401 and the housing 9402 can be achieved. In the cellular phone of this embodiment mode, high image quality and reduction in size and weight are achieved; therefore, a product which is suitable for being carried around can be provided.

Figure 9A:
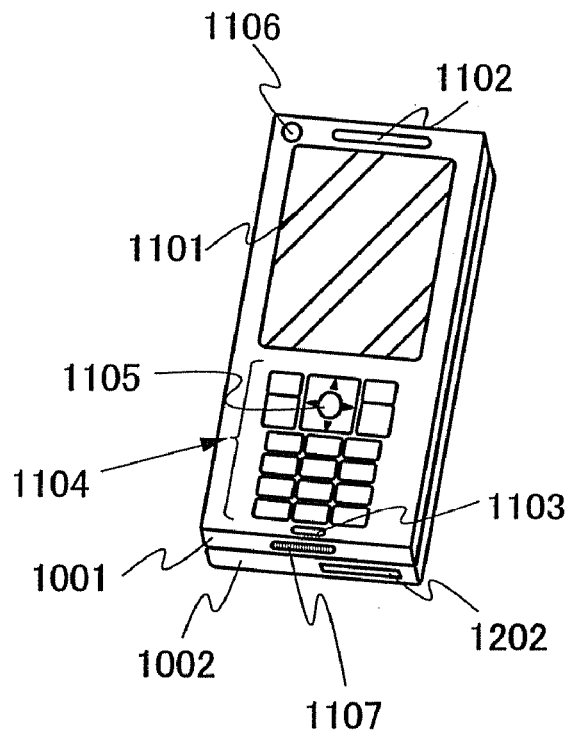
FIGS. 9A to 9C illustrate an electronic device according to an aspect of the present invention.
Figure 9B:
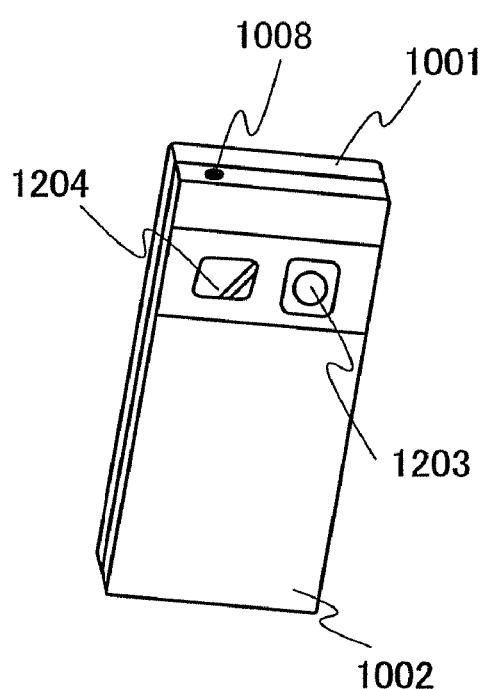
Figure 9C:
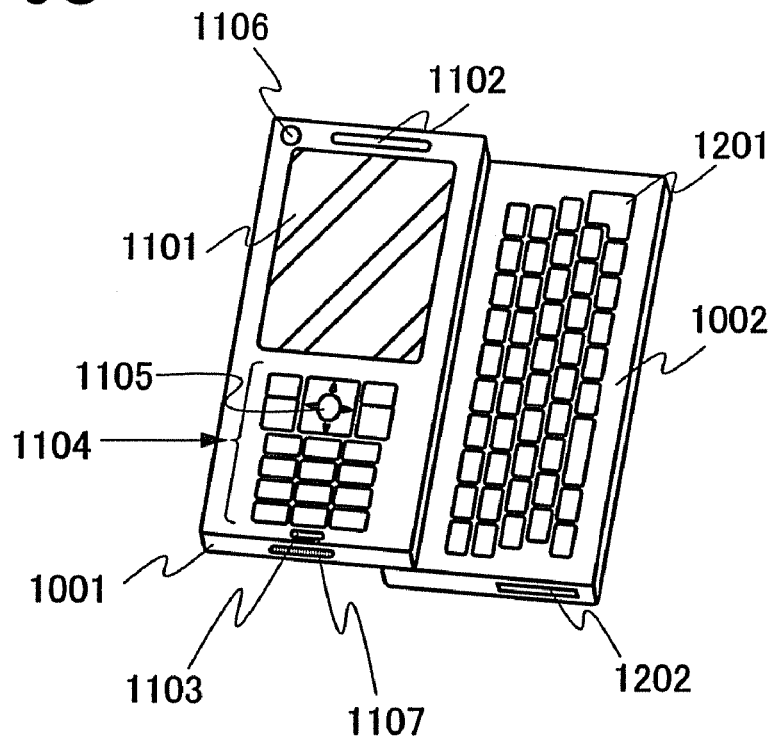

FIGS. 9A to 9C illustrate an example of a structure of a cellular phone, which is different from a structure of the cellular phone of FIG. 8D. FIG. 9A is a front view, FIG. 9B is a rear view, and FIG. 9C is a development view. The cellular phone in FIGS. 9A to 9C is a so-called smartphone which has both a function as a phone and a function as a portable information terminal, and incorporates a computer to conduct a variety of data processing in addition to voice calls.

The cellular phone illustrated in FIGS. 9A to 9C has two housings 1001 and 1002. The housing 1001 includes a display portion 1101, a speaker 1102, a microphone 1103, operation keys 1104, a pointing device 1105, a camera lens 1106, an external connection terminal 1107, an earphone terminal 1108, and the like, while the housing 1002 includes a keyboard 1201, an external memory slot 1202, a camera lens 1203, a light 1204, and the like. In addition, an antenna is incorporated in the housing 1001.

In addition to the above structure, the cellular phone may incorporate a non-contact IC chip, a small-sized memory device, or the like.

In the display portion 1101, the light-emitting device shown in Embodiment Mode 3 can be incorporated, and a display direction can be changed as appropriate depending on the usage mode. The cellular phone is provided with the camera lens 1106 on the same surface as the display portion 1101; therefore, the cellular phone can be used as a videophone. Further, a still image and a moving image can be taken with the camera lens 1203 and the light 1204, using the display portion 1101 as a viewfinder. The speaker 1102 and the microphone 1103 can be used for video calls, recording, reproducing, and the like without being limited to voice calls. With the use of the operation keys 1104, making and receiving calls, inputting simple information such as e-mail or the like, scrolling the screen, moving the cursor, and the like are possible. Furthermore, the housing 1001 and the housing 1002 (FIG. 9A), which are overlapped with each other, are developed by sliding as illustrated in FIG. 9C and can be used as a portable information terminal. In this case, smooth operation can be conducted using the keyboard 1201 and the pointing device 1105. The external connection terminal 1107 can be connected to an AC adaptor and various types of cables such as a USB cable, and charging, data communication with a computer, and the like are possible. Furthermore, a large amount of data can be stored and moved by inserting a storage medium into the external memory slot 1202.

In addition to the above functions, the cellular phone may include an infrared communication function, a television receiving function, or the like.

Figure 10:
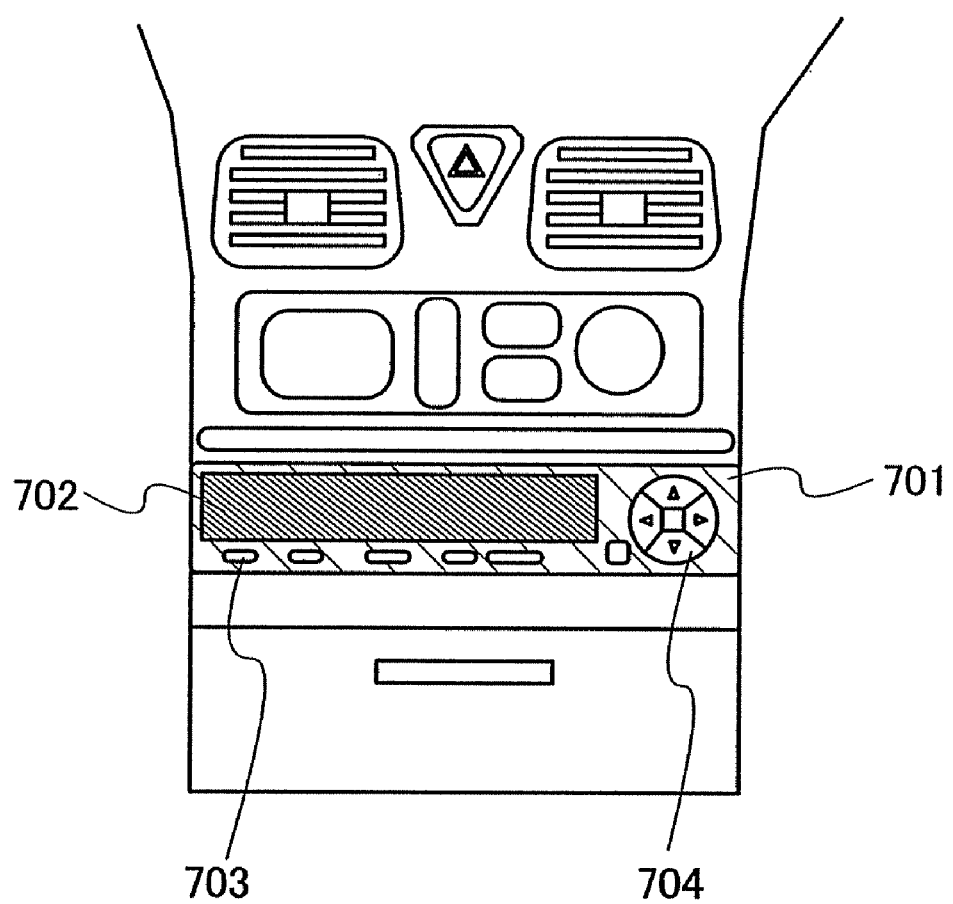
FIG. 10 illustrates an electronic device according to an aspect of the present invention.

FIG. 10 illustrates an audio reproducing device, specifically, a car audio system, which includes a main body 701, a display portion 702, and operation switches 703 and 704. The display portion 702 can be realized with the light-emitting device (passive matrix type or active matrix type) described in Embodiment Mode 3. Further, the display portion 702 may be formed using a segment type light-emitting device. In any case, the use of a light-emitting element according to an aspect of the present invention makes it possible to form a display portion having long lifetime, with the use of a vehicle power source (12 V to 42 V). Furthermore, although this embodiment mode describes an in-car audio system, a light-emitting device according to an aspect of the present invention may also be used in portable audio systems or audio systems for home use.

Figure 11:
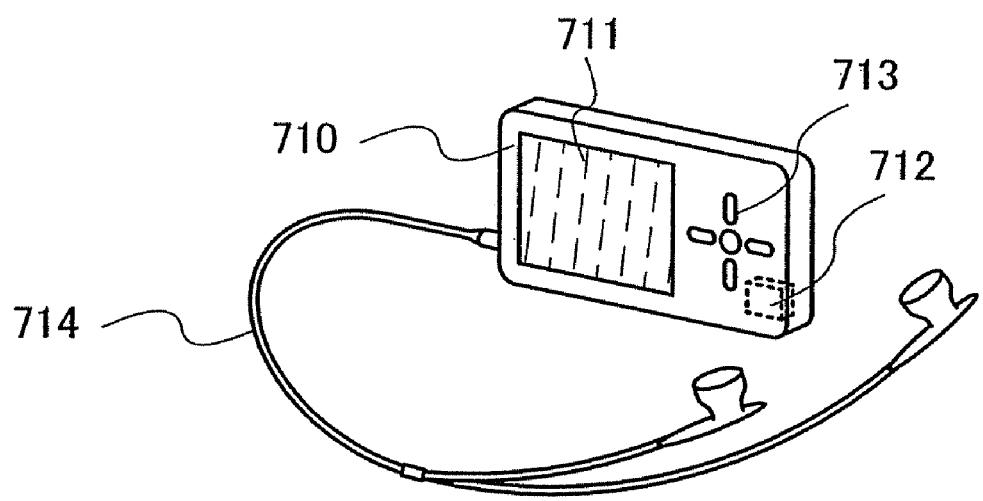
FIG. 11 illustrates an electronic device according to an aspect of the present invention.

FIG. 11 illustrates a digital player as an example of an audio reproducing device. The digital player illustrated in FIG. 11 includes a main body 710, a display portion 711, a memory portion 712, an operation portion 713, a pair of earphones 714, and the like. Note that a pair of headphones or wireless earphones can be used instead of pair of the earphones 714. The display portion 711 can be realized with the light-emitting device (passive matrix type or active matrix type) described in Embodiment Mode 3. Further, the display portion 711 may be formed using a segment type light-emitting device. In any case, the use of a light-emitting element according to an aspect of the present invention makes it possible to form a display portion with long lifetime which can display images even when using a secondary battery (a nickel-hydrogen battery or the like). As the memory portion 712, a hard disk or a nonvolatile memory is used. For example, by using a NAND-type nonvolatile memory with a recording capacity of 20 to 200 gigabytes (GB) and by operating the operating portion 713, an image or a sound (music) can be recorded and reproduced. Note that in the display portion 702 and the display portion 711, white characters are displayed against a black background, and thus, power consumption can be reduced. This is particularly effective for portable audio systems.

As described above, the applicable range of the light-emitting device manufactured by applying the present invention is so wide that the light-emitting device is applicable to electronic devices in a wide variety of fields. By applying the present invention, an electronic device which has a display portion with less deterioration and long lifetime can be manufactured.

A light-emitting device to which the present invention is applied has a light-emitting element with high light emission efficiency and can also be used as a lighting device. One mode of using a light-emitting element to which the present invention is applied as a lighting device is described with reference to FIG. 12.

Figure 12:
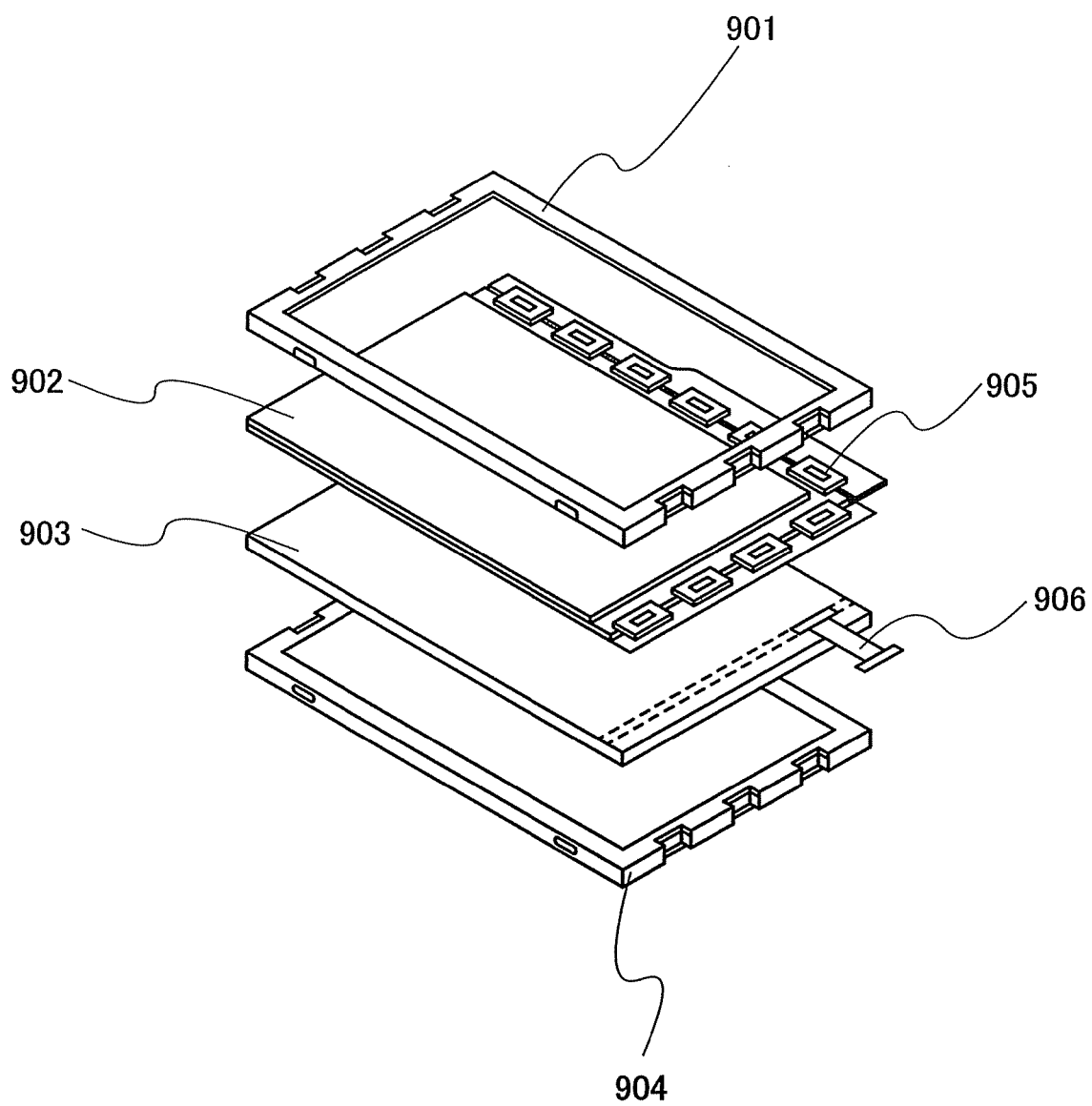
FIG. 12 illustrates a lighting device according to an aspect of the present invention.

FIG. 12 illustrates a liquid crystal display device using the light-emitting device to which the present invention is applied as a backlight, as an example of the electronic device using a light-emitting device according to an aspect of the present invention as a lighting device. The liquid crystal display device illustrated in FIG. 12 includes a housing 901, a liquid crystal layer 902, a backlight 903, and a housing 904, and the liquid crystal layer 902 is connected to a driver IC 905. The light-emitting device to which the present invention is applied is used as the backlight 903, and current is supplied through a terminal 906.

Because the light-emitting device according to an aspect of the present invention is a thin-type and has long lifetime, reduction in thickness and lifetime extension of a liquid crystal display device is possible by using a light-emitting device according to an aspect of the present invention as a backlight of the liquid crystal display device. Moreover, a light-emitting device according to an aspect of the present invention is a plane emission type lighting device and can have a large area. Thus, the backlight can have a large area, and a liquid crystal display device having a large area can also be obtained.

Figure 13:
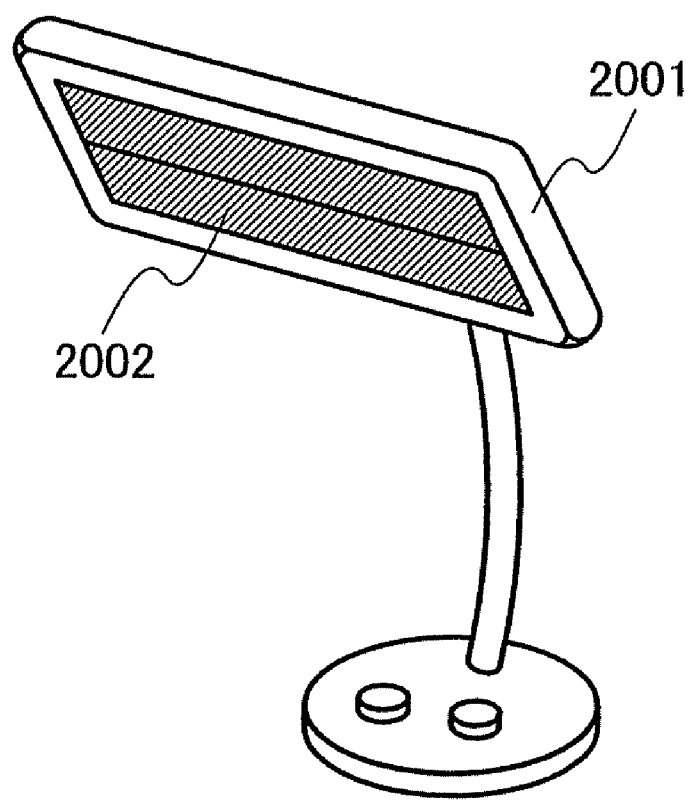
FIG. 13 illustrates a lighting device according to an aspect of the present invention.

FIG. 13 illustrates an example in which a light-emitting device according to an aspect of the present invention is used as a desk lamp, which is one of lighting devices. The desk lamp illustrated in FIG. 13 includes a housing 2001 and a light source 2002, and a light-emitting device according to an aspect of the present invention is used as the light source 2002. Because a light-emitting device of the present invention has long lifetime, the desk lamp also has long lifetime.

Figure 14:
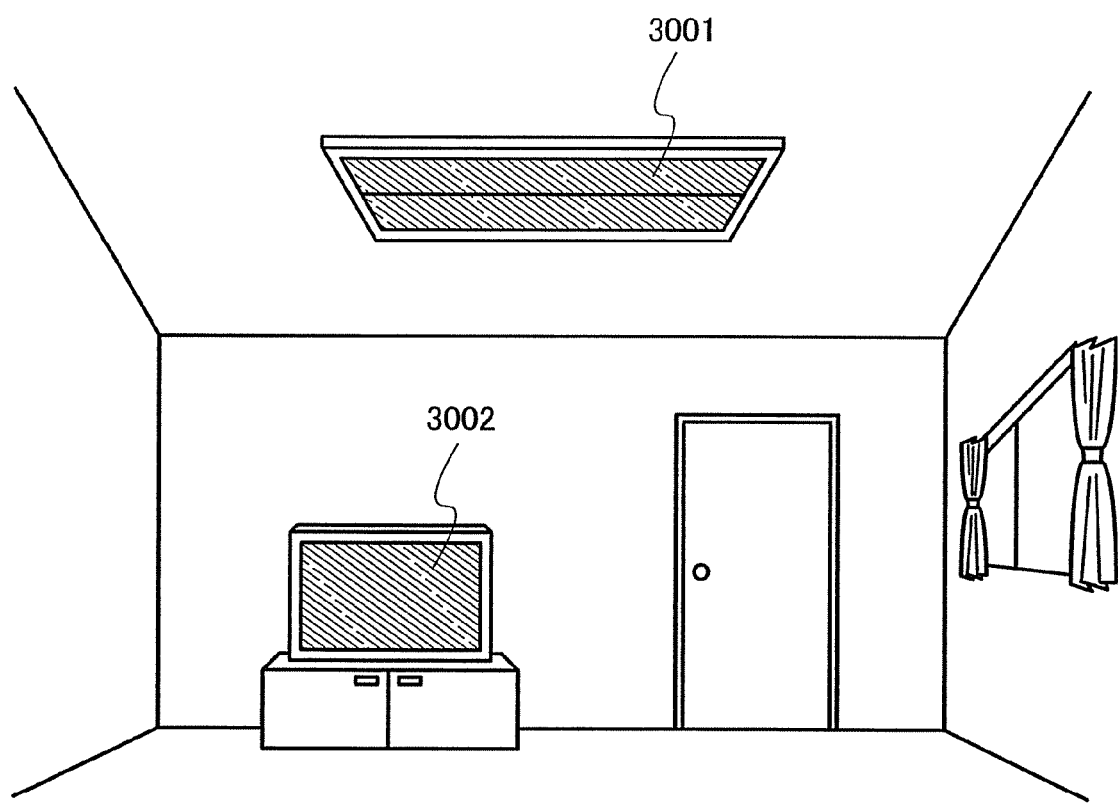
FIG. 14 illustrates a lighting device according to an aspect of the present invention.

FIG. 14 illustrates an example in which a light-emitting device to which the present invention is applied is used as an interior lighting device 3001. Because a light-emitting device according to an aspect of the present invention can have a large area, a light-emitting device according to an aspect of the present invention can be used as a lighting device having a large area. Moreover, because a light-emitting device according to an aspect of the present invention has long lifetime, a light-emitting device according to an aspect of the present invention can be used as a lighting device which has long lifetime. Thus, a television device 3002 according to an aspect of the present invention as illustrated in FIG. 8A may be placed in a room where a light-emitting device to which the present invention is applied is used as the interior lighting device 3001, and public broadcasting or movies can be watched there. In such a case, since both devices have long lifetime, environmental load can be reduced because the number of replacement of lighting devices or television devices by purchase can be reduced.

Example 1

In Example 1, the reduction reaction characteristics of tris(8-quinolinolato)aluminum(III) (abbr.: Alq), 2,3,5,8-tetraphenylquinoxaline (abbr.: TPQ), coumarin 545T (abbr.: C545T), and NM-diphenylquinacridone (abbr.: DPQd), which were used for a control layer for controlling electron transport in light-emitting elements formed in Examples described later were measured by cyclic voltammetry (CV). Further, from the measurements, the LUMO levels of Alq, TPQ, C545T, and DPQd were calculated. Note that an electrochemical analyzer (ALS model 600A or 600C, manufactured by BAS Inc.) was used for the measurements.

As for a solution used for the CV measurement, dehydrated dimethylformamide (DMF, product of Sigma-Aldrich Inc., 99.8%, catalog No. 22705-6) was used as a solvent, and Tetra-n-butylammonium perchlorate (n-Bu$_4$NClO$_4$, product of Tokyo Chemical Industry Co., Ltd., catalog No. T0836), which was a supporting electrolyte, was dissolved in the solvent such that the concentration of tetra-n-butylammonium perchlorate was 100 mmol/L. Further, the object to be measured was also dissolved in the solvent such that the concentration thereof was 2 mmol/L. Note that as for a substance with a bad solubility which cannot be dissolved at a concentration of 2 mmol/L, undissolved part of the substance is filtrated and then a filtrate was used for the measurement. A platinum electrode (manufactured by BAS Inc., PTE platinum electrode) was used as a working electrode, a platinum electrode (manufactured by BAS Inc., Pt counter electrode for VC-3, (5 cm)) was used as an auxiliary electrode, and an Ag/Ag$^+$ electrode (manufactured by BAS Inc., RE-7 reference electrode for nonaqueous solvent) was used as a reference electrode. It is to be noted that the measurement was conducted at room temperature (20 to 25° C.). In addition, the scan speed at the CV measurement was 0.1 V/sec in all measurements.

(Calculation of Potential Energy of Reference Electrode with Respect to Vacuum Level)

First, the potential energy (eV) of the reference electrode (an Ag/Ag$^+$ electrode) used in Example 1 with respect to the vacuum level was calculated. That is, the Fermi level of the Ag/Ag$^+$ electrode was calculated. It is known that the oxidation-reduction potential of ferrocene in methanol is +0.610 [V vs. SHE] with respect to a standard hydrogen electrode (Reference: Christian R. Goldsmith et al., *J. Am. Chem. Soc.*, Vol. 124, No. 1, pp. 83-96, 2002). On the other hand, when the oxidation-reduction potential of ferrocene in methanol was calculated using the reference electrode used in Example 1, the result was +0.11 V [vs. Ag/Ag$^+$]. Therefore, it was found that the potential energy of the reference electrode used in Example 1 was lower than that of the standard hydrogen electrode by 0.50 [eV].

Here, it is known that the potential energy of the standard hydrogen electrode with respect to the vacuum level is −4.44 eV (Reference: Toshihiro Ohnishi and Tamami Koyama, High Molecular EL Material, Kyoritsu Shuppan, pp. 64-67). Accordingly, the potential energy of the reference electrode used in Example 1 with respect to the vacuum level could be calculated to be −4.44−0.50=−4.94 [eV].

Measurement Example 1

Alq

Figure 16:
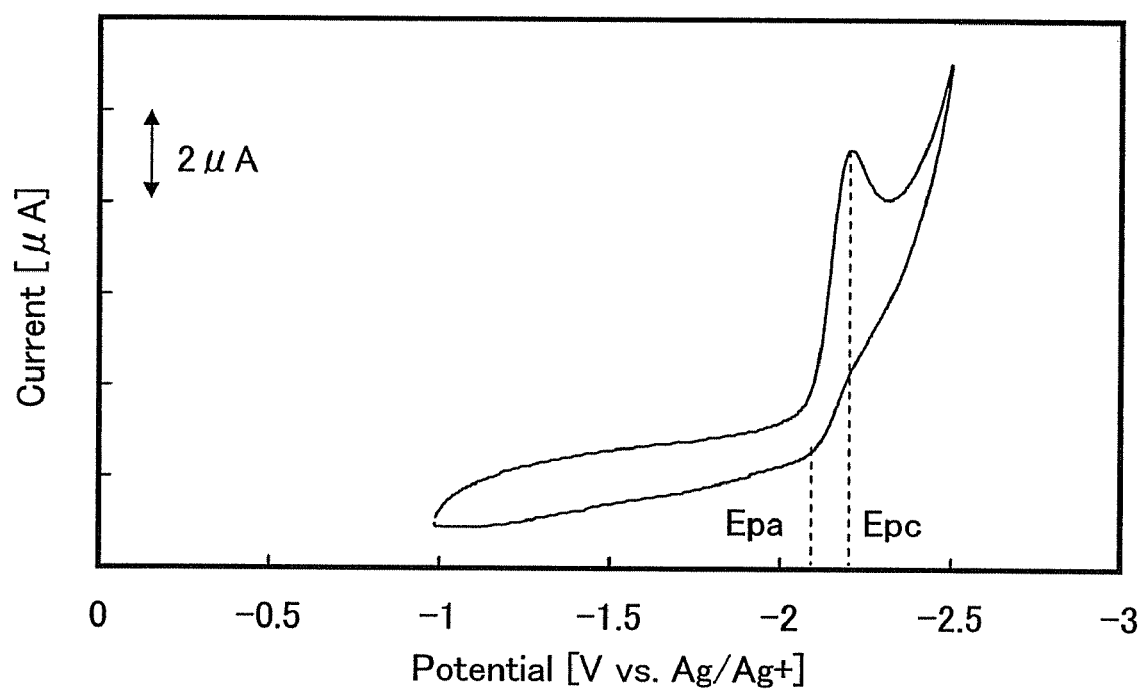
FIG. 16 is a graph showing a reduction reaction characteristic of Alq.

In Measurement Example 1, calculation of LUMO level by CV measurement is described. FIG. 16 shows the CV measurement results of reduction reaction characteristics of Alq. Note that the measurements of the reduction reaction characteristics were performed in such a manner that the working electrode with respect to the reference electrode was scanned with potentials ranging from −0.98 V to −2.50 V, and then potentials raging ranging from −2.50 V to −0.98 V.

As shown in FIG. 16, it can be seen that a reduction peak potential $E_{pc}$ was −2.21 V and an oxidation peak potential $E_{pa}$ was −2.07 V. Therefore, a half-wave potential (an intermediate potential between $E_{pc}$ and $E_{pa}$) was calculated to be −2.14 V. This shows that Alq is reduced by an electric energy of −2.14 [V vs. Ag/Ag$^+$], and this energy corresponds to the LUMO level. Here, as described above, the potential energy of the reference electrode used in Example 1 with respect to the vacuum level is −4.94 [eV]. Therefore, the LUMO level of Alq was calculated to be −4.94−(−2.14)=−2.80 [eV].

Measurement Example 2

TPQ

Figure 17:
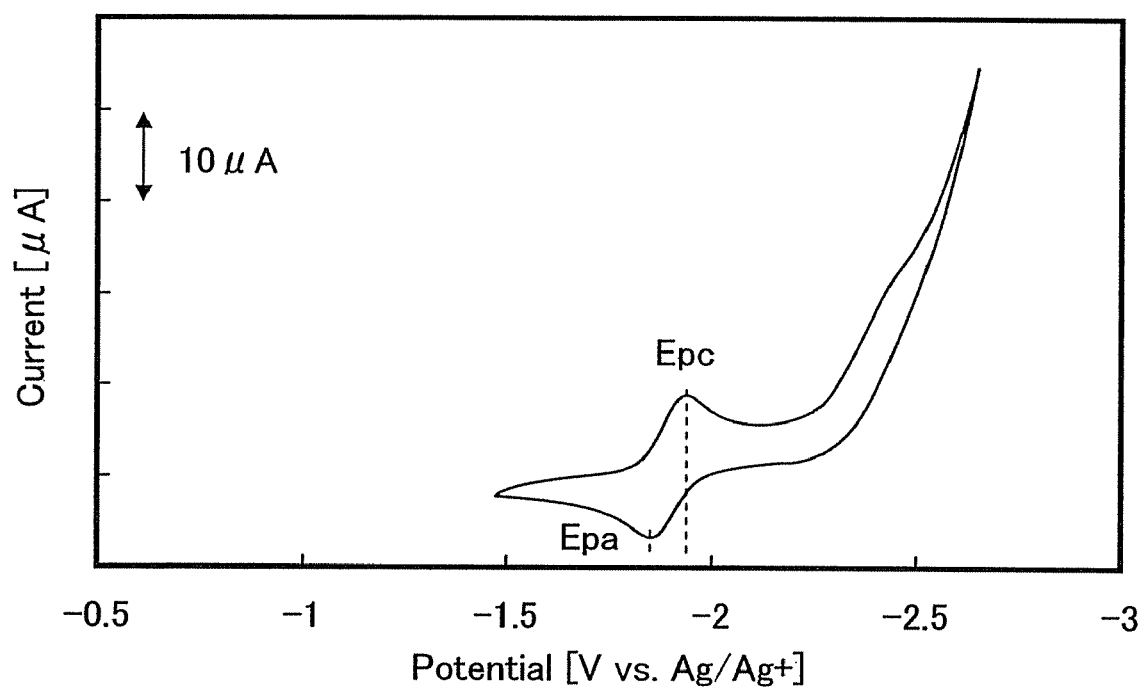
FIG. 17 is a graph showing a reduction reaction characteristic of TPQ.

FIG. 17 shows CV measurement results of reductive reaction characteristics of TPQ. Note that the measurement of the reduction characteristics was conducted by the steps of: scanning the potential of the working electrode with respect to the reference electrode from −1.48 V to −2.65 V, and then from −2.65 V to −1.48 V.

As shown in FIG. 17, it can be seen that a reduction peak potential $E_{pc}$ was −1.94 V and an oxidation peak potential $E_{pa}$ was −1.85 V. Therefore, a half-wave potential (an intermediate potential between $E_{pc}$ and $E_{pa}$) can be calculated to be −1.90 V. This shows that Alq is reduced by an electric energy of −1.90 [V vs. Ag/Ag$^+$], and this energy corresponds to the LUMO level. Here, as described above, the potential energy of the reference electrode used in Example 1 with respect to the vacuum level is −4.94 [eV]. Therefore, the LUMO level of TPQ was calculated to be −4.94−(−1.90)=−3.05 [eV].

Measurement Example 3

C545T

Figure 18:
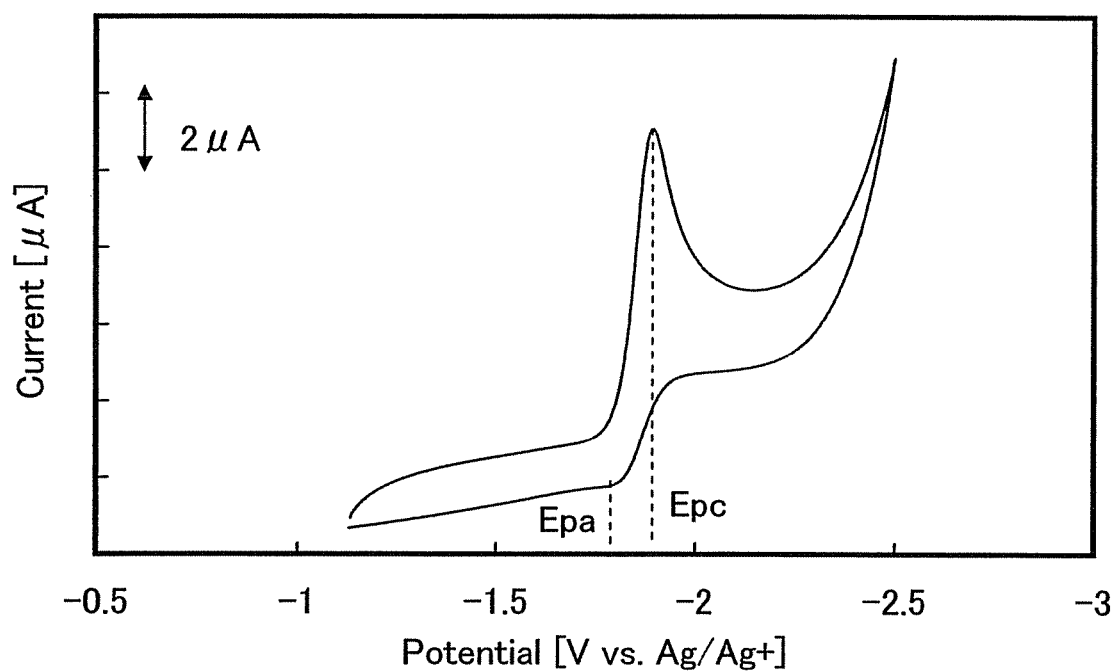
FIG. 18 is a graph showing a reduction reaction characteristic of C545T.

FIG. 18 shows CV measurement results of reductive reaction characteristics of C545T. Note that the measurement of the reduction reaction characteristics was conducted by scanning the potential of the working electrode with respect to the reference electrode from −1.14 V to −2.50 V, and then from −2.50 V to −1.14 V.

As shown in FIG. 18, it can be seen that a reduction peak potential $E_{pc}$ was −1.89 V and an oxidation peak potential $E_{pa}$ was −1.79 V. Therefore, a half-wave potential (an intermediate potential between $E_{pc}$ and $E_{pa}$) can be calculated to be −1.84 V. This shows that C545T was reduced by an electric energy of −1.84 [V vs. Ag/Ag$^+$], and this energy corresponds to the LUMO level. Here, as described above, the potential energy of the reference electrode used in Example 1 with respect to the vacuum level is −4.94 [eV]. Therefore, the LUMO level of C545T was calculated to be −4.94−(−1.84)=−3.10 [eV].

Measurement Example 4

DPQd

Figure 19:
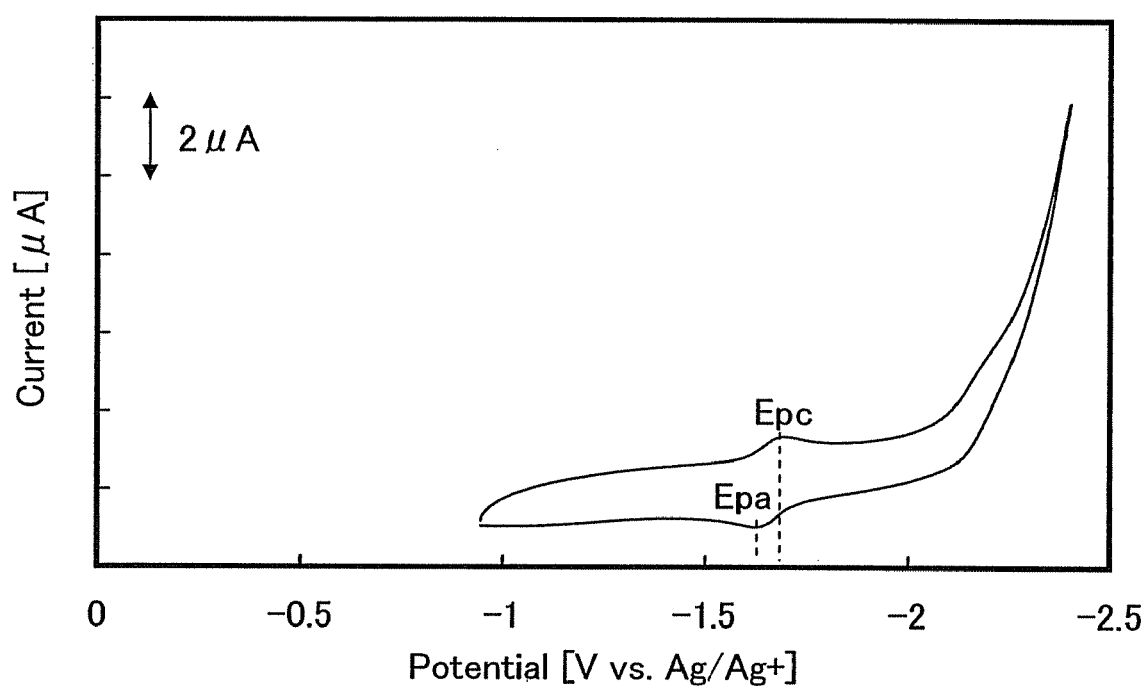
FIG. 19 is a graph showing a reduction reaction characteristic of DPQd.

FIG. 19 shows CV measurement results of reductive reaction characteristics of DPQd. Note that the measurement of the reduction reaction characteristics was conducted by scanning the potential of the working electrode with respect to the reference electrode from −0.95 V to −2.40 V, and then from −2.40 V to −0.95 V.

As shown in FIG. 19, it can be seen that a reduction peak potential $E_{pc}$ was −1.70 V and an oxidation peak potential $E_{pa}$ was −1.62 V. Therefore, a half-wave potential (an intermediate potential between $E_{pc}$ and $E_{pa}$) can be calculated to be −1.66 V. This shows that DPQd was reduced by an electric energy of −1.66 [V vs. Ag/Ag$^+$], and this energy corresponds to the LUMO level. Here, as described above, the potential energy of the reference electrode used in Example 1 with respect to the vacuum level is −4.94 [eV]. Therefore, the LUMO level of DPQd was calculated to be −4.94−(−1.66)=−3.28 [eV].

From the above measurement results, it is found that the LUMO level of TPQ is deeper than the LUMO level of Alq by 0.25 [eV], the LUMO level of C545T is deeper than the LUMO level of Alq by 0.30 [eV], and the LUMO level of DPQd is deeper than the LUMO level of Alq by 0.48 [eV].

Example 2

Figure 15:
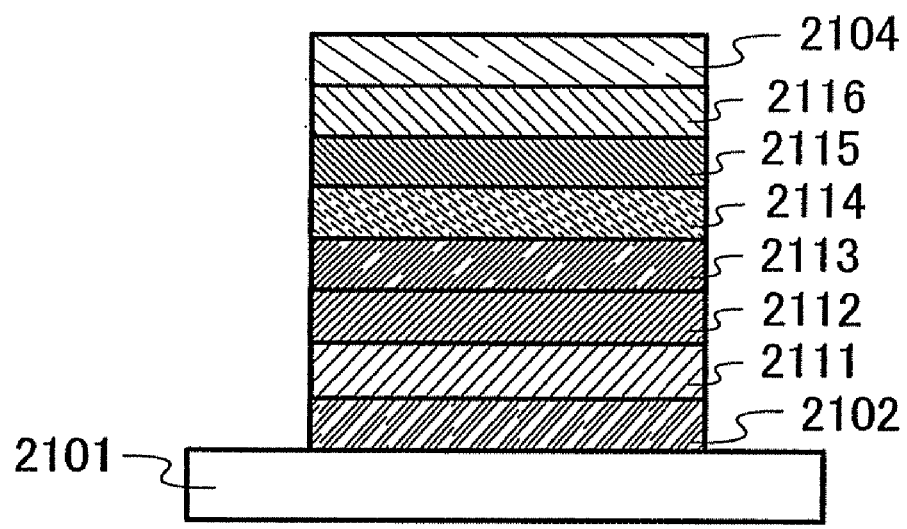
FIG. 15 illustrates a light-emitting element fabricated in Examples.

Example 2 will describe a light-emitting element according to an aspect of the present invention with reference to FIG. 15. Structural formulae of materials used in this example are shown below. In Example 2, a light-emitting element in which tris(8-quinolinolato)aluminum(III) (abbr.: Alq) was used for the first organic compound included in a control layer 2114, and 2,3,5,8-tetraphenylquinoxaline (abbr.: TPQ) was used for the second organic compound included in the control layer 2114 was formed, and the concentration of TPQ was changed. The lifetime of the light-emitting element was examined.

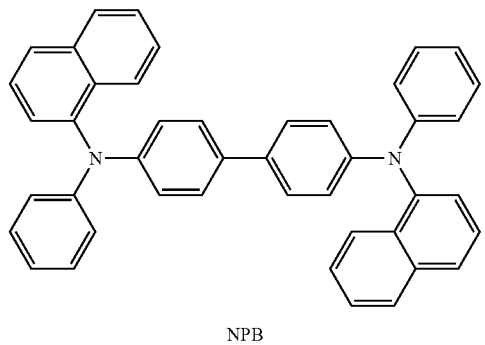

NPB

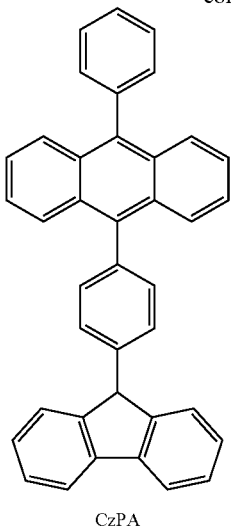

CzPA

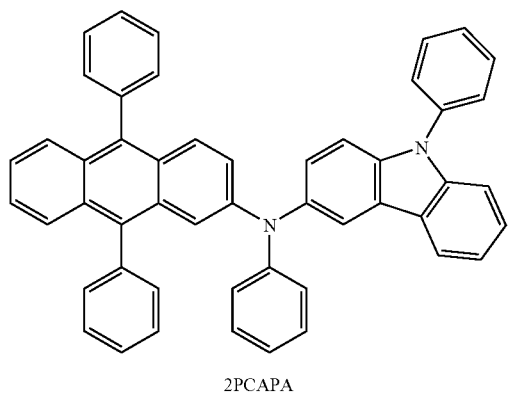

2PCAPA

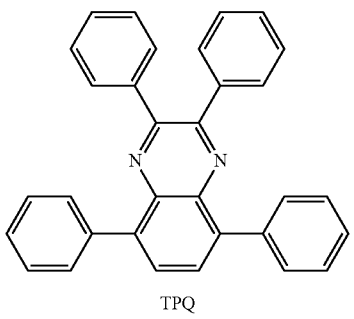

TPQ

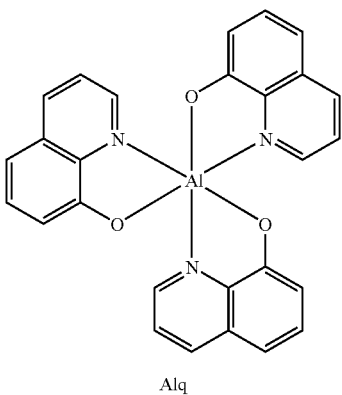

Alq

Hereinafter, a method for fabricating a light-emitting element of this example is shown.

(Light-Emitting Element 1)

First, indium tin oxide containing silicon oxide (abbr.: ITSO) was deposited on a glass substrate 2101 by a sputtering method, so that a first electrode 2102 was formed. The thickness of the first electrode 2102 was set to 110 nm. The area of the first electrode was set to 2 mm×2 mm.

Next, the substrate provided with the first electrode 2102 was fixed to a substrate holder provided in a vacuum evaporation apparatus such that the side on which the first electrode 2102 was formed faced downward. After the pressure in a film formation chamber was lowered to approximately $10^{-4}$ Pa, a layer 2111 containing a composite material of an organic compound and an inorganic compound was formed on the first electrode 2102 by co-evaporation of 4,4'-bis[N-(1-naphthyl)-N-phenylamino]biphenyl (abbr.: NPB) and molybdenum(VI) oxide. The thickness was 50 nm and the weight ratio of NPB to molybdenum(VI) oxide was adjusted to 4:1 (=NPB:molybdenum oxide). Note that a co-evaporation method refers to an evaporation method by which evaporation is concurrently conducted from a plurality of evaporation sources in one treatment chamber.

Next, a film of 4,4'-bis[N-(1-naphthyl)-N-phenylamino] biphenyl (abbr.: NPB) was formed to a thickness of 10 nm on the layer 2111 containing a composite material by an evaporation method employing resistance heating to form a hole-transporting layer 2112.

Then, a light-emitting layer 2113 was formed to a thickness of 30 nm on the hole-transporting layer 2112 by co-evaporation of 9-[4-(10-phenyl-9-anthryl)phenyl]-9H-carbazole (abbr.: CzPA) and N-(9,10-diphenyl-2-anthryl)-N,9-diphenyl-9H-carbazol-3-amine (abbr.: 2PCAPA). Here, the weight ratio of CzPA to 2PCAPA was adjusted to 1:0.05 (=CzPA: 2PCAPA).

Then, tris(8-quinolinolato)aluminum(III) (abbr.: Alq) and 2,3,5,8-tetraphenylquinoxaline (abbr.: TPQ) were co-evaporated so that the control layer 2114 for controlling electron transport was formed to a thickness of 10 nm on the light-emitting layer 2113. In this case, the weight ratio of Alq to TPQ was adjusted to 1:0.005 (=Alq:TPQ).

Then, tris(8-quinolinolato)aluminum(III) (Alq) was deposited to a thickness of 30 nm on the control layer 2114 by an evaporation method using resistant heating, so that an electron-transporting layer 2115 was formed.

Next, by an evaporation method using resistance heating, a film of lithium fluoride (LiF) was formed to a thickness of 1 nm on the electron-transporting layer 2115 to form an electron-injecting layer 2116.

Finally, by forming a film of aluminum with a film thickness of 200 nm on the electron-injecting layer 2116 by an evaporation method using resistance heating, a second electrode 2104 was formed. Accordingly, a light-emitting element 1 was fabricated.

(Light-Emitting Element 2)

The same substrate as that of the light-emitting element 1 was used, and the concentration of TTQ in the control layer 2114 for controlling electron transport was changed. In other words, the weight ratio of Alq to TPQ was adjusted to 1:0.01 (=Alq:TPQ), and a light-emitting element 2 was formed. The layers other than the control layer 2114 were formed similar to the light-emitting element 1.

(Light-Emitting Element 3)

The same substrate as that of the light-emitting element 1 was used, and the concentration of TPQ in the control layer 2114 for controlling electron transport was changed. In other words, the weight ratio of Alq to TPQ was adjusted to 1:0.05

(=Alq:TPQ), and a light-emitting element 3 was formed. The layers other than the control layer 2114 were formed similar to the light-emitting element 1.

(Comparative Light-Emitting Element 4)

The same substrate as that of the light-emitting element 1 was used, and the control layer 2114 for controlling electron transport was not provided. In other words, Alq wad deposited to a thickness of 40 nm on the light-emitting layer and thus an electron-transporting layer was formed. The layers other than the control layer 2114 were formed similar to the light-emitting element 1.

The light-emitting elements 1 to 3 and the comparative light-emitting element 4 obtained in the above-described manner were put in a glove box containing a nitrogen atmosphere and sealing treatment was conducted so that the light-emitting elements were not exposed to air. Then, the operating characteristics of the light-emitting elements were measured. The measurement was carried out at a room temperature (in the atmosphere kept at 25° C.).

Table 1 shows values of a voltage [V], a current efficiency [cd/A] and a power efficiency [lm/W] at the time when the light-emitting elements 1 to 3 and the comparative light-emitting element 4 each emitted light at a luminance of 5000 [cd/m$^2$]. Further, the concentration (molar fraction) of TPQ in the control layer in each light-emitting element is also shown in Table 1. As apparent from Table 1, as the concentration of TPQ as a dopant having an electron-trapping property in the control layer is increased, the driving voltage is slightly increased, and thus it is found that TPQ acts as a trap. Note that green light emission derived from 2PCAPA was obtained from each light-emitting element.

TABLE 1

| | molar fraction of TPQ C | voltage [V] | current efficiency [cd/A] | power efficiency [lm/W] |
|---|---|---|---|---|
| light-emitting element 1 | 0.0053 | 7.0 | 15 | 6.6 |
| light-emitting element 2 | 0.010 | 7.1 | 14 | 6.3 |
| light-emitting element 3 | 0.050 | 7.3 | 13 | 5.8 |
| comparative light-emitting element 4 | 0 | 6.8 | 15 | 6.9 |

Figure 20:
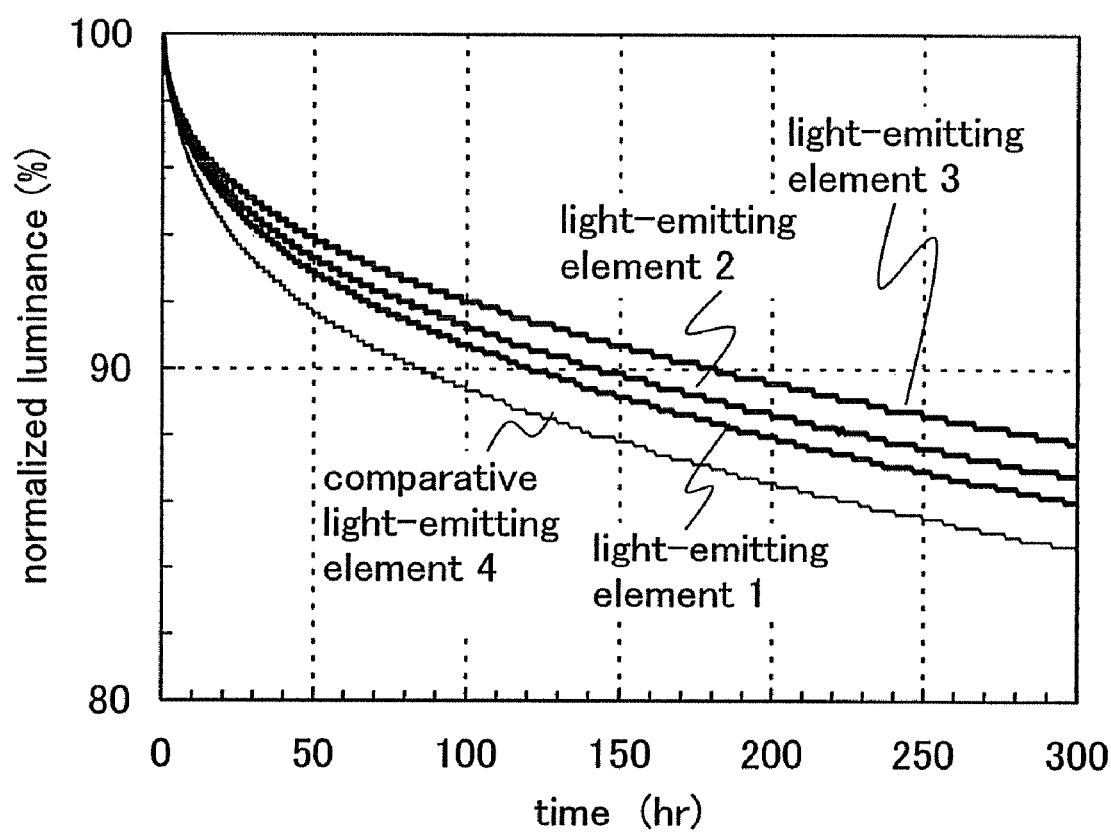
FIG. 20 is a graph showing the results of the continuous lighting tests obtained by constant current driving of the light-emitting elements manufactured in Example 2.

Next, these light-emitting elements were each driven at constant current at an initial luminance of 5000 [cd/m$^2$], and continuous lighting tests were conducted. The results are shown in FIG. 20. Based on these results, as barometers of lifetime of the elements, decay time $\tau_{0.9}$ during which luminance is decayed to 90% of the initial luminance, and a luminance decay rate $D_{300hr}$ [%] after 300 hours were obtained and are shown in Table 2 below. Table 2 also shows a value of the parameter X obtained by assigning a molar fraction C, ΔE (=0.25 [eV]) calculated in Example 1, and the thickness L (=10 [nm]) of the control layer to the expression (1). Note that as for the luminance decay rate $D_{300hr}$ [%], if the luminance is decayed by 10% after 300 hours (i.e., 90% of the initial luminance), D=10.

TABLE 2

| | molar fraction of TPQ C | parameter X | $\tau_{0.9}$ [hr] | $D_{300 hr}$ [%] |
|---|---|---|---|---|
| light-emitting element 1 | 0.0053 | $1.9 \times 10^{-2}$ | 120 | 14.0 |
| light-emitting element 2 | 0.010 | $1.2 \times 10^{-2}$ | 140 | 13.2 |
| light-emitting element 3 | 0.050 | $2.8 \times 10^{-3}$ | 180 | 12.2 |
| comparative light-emitting element 4 | 0 | 0.1 | 86 | 15.5 |

Figure 25:
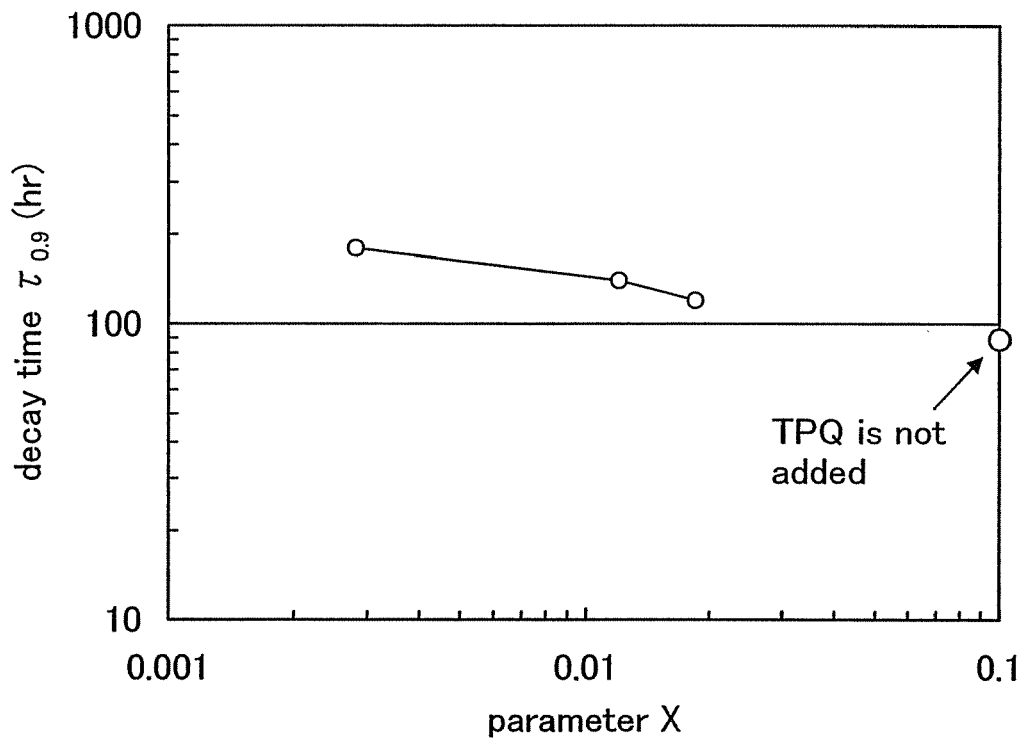
FIG. 25 is a graph showing a parameter X.

FIG. 25 is a graph in which the horizontal axis represents the parameter X and the vertical axis represents $\tau_{0.9}$ based on the data of Table 2. As apparent from FIG. 25, as compared with the comparative light-emitting element 4 (whose parameter X is 0.1) to which TPQ was not added, the lifetime of each of the light-emitting elements 1 to 3 was improved. In addition, as the concentration of TPQ becomes higher, the value of X decreases. However, even when the value of X decreases, the improvement effect of lifetime can be obtained even when X is about $3 \times 10^{-3}$.

Figure 26:
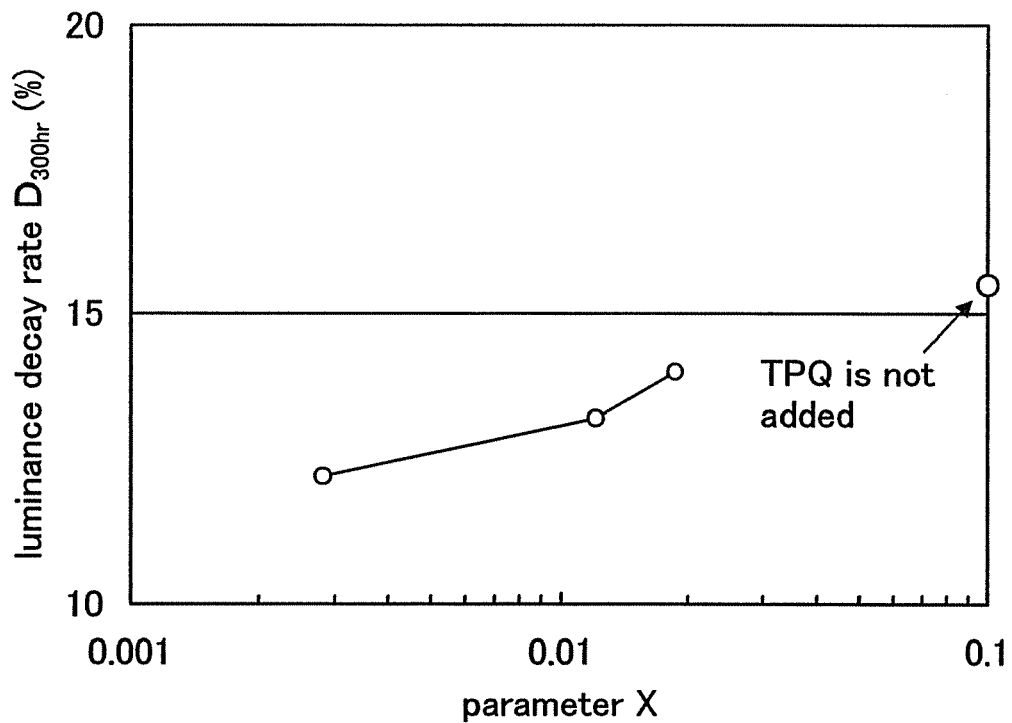
FIG. 26 is a graph showing a parameter X.

Further, FIG. 26 is a graph in which the horizontal axis represents the parameter X and the vertical axis represents $D_{300hr}$. As for the luminance decay rate, it is apparent that luminance decay can be suppressed in the level of around $X=3 \times 10^{-3}$. In other words, even when the barometer of lifetime was evaluated with the luminance decay rate instead of decay time, the behavior of X was similar.

Example 3

In Example 3, a light-emitting element according to an aspect of the present invention is described with reference to FIG. 15. In Example 3, a light-emitting element in which tris(8-quinolinolato)aluminum(III) (Alq) was used for the first organic compound included in a control layer 2114, and coumarin 545T (abbr.: C545T) was used for the second organic compound included in the control layer 2114 was formed, and the concentration of C545T was changed. The lifetime of the light-emitting element in this case was examined.

Structural formulae of materials used in this example are shown below. Materials of which structural formulae have already been shown are omitted.

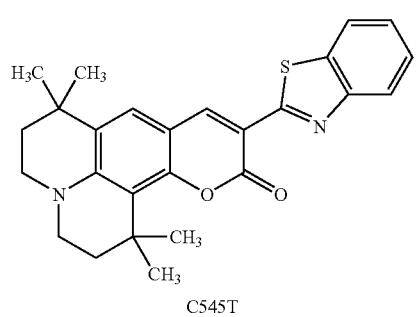

C545T

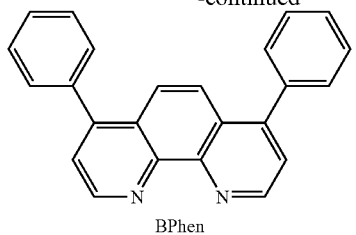
BPhen

A fabrication method of the light-emitting element of this example is described below.

(Light-Emitting Element 5)

First, indium tin oxide containing silicon oxide (abbr.: ITSO) was deposited on a glass substrate 2101 by a sputtering method, so that a first electrode 2102 was formed. The thickness of the first electrode 2102 was set to 110 nm. The area of the first electrode was set to 2 mm×2 mm.

Next, the substrate provided with the first electrode 2102 was fixed to a substrate holder provided in a vacuum evaporation apparatus such that the side on which the first electrode 2102 was formed faced downward. After the pressure in a film formation chamber was lowered to approximately $10^{-4}$ Pa, a layer 2111 containing a composite material of an organic compound and an inorganic compound was formed on the first electrode 2102 by co-evaporation of 4,4'-bis[N-(1-naphthyl)-N-phenylamino]biphenyl (abbr.: NPB) and molybdenum(VI) oxide. The thickness was 50 nm and the weight ratio of NPB to molybdenum(VI) oxide was adjusted to 4:1 (=NPB:molybdenum oxide). Note that a co-evaporation method refers to an evaporation method by which evaporation is concurrently conducted from a plurality of evaporation sources in one treatment chamber.

Next, a film of 4,4'-bis[N-(1-naphthyl)-N-phenylamino]biphenyl (abbr.: NPB) was formed to a thickness of 10 nm on the layer 2111 containing a composite material by an evaporation method employing resistance heating to form a hole-transporting layer 2112.

Then, a light-emitting layer 2113 was formed to a thickness of 30 nm on the hole-transporting layer 2112 by co-evaporation of 9-[4-(10-phenyl-9-anthryl)phenyl]-9H-carbazole (abbr.: CzPA) and N-(9,10-diphenyl-2-anthryl)-N,9-diphenyl-9H-carbazol-3-amine (abbr.: 2PCAPA). Here, the weight ratio of CzPA to 2PCAPA was adjusted to 1:0.05 (=CzPA: 2PCAPA).

Then, tris(8-quinolinolato)aluminum(III) (Alq) and coumarin 545T (abbr.: C545T) were co-evaporated so that the control layer 2114 for controlling electron transport was formed to a thickness of 10 nm on the light-emitting layer 2113. In this case, the weight ratio of Alq to C545T was adjusted to 1:0.01 (=Alq:C545T).

Next, an electron-transporting layer 2115 was formed by depositing bathophenanthroline (abbr.: BPhen) to a thickness of 30 nm on the control layer 2114 by an evaporation method using resistance heating.

Next, by an evaporation method using resistance heating, a film of lithium fluoride (LiF) was formed to a thickness of 1 nm on the electron-transporting layer 2115 to form an electron-injecting layer 2116.

Lastly, aluminum was formed to a thickness of 200 nm on the electron-injecting layer 2116 by an evaporation method using resistance heating to form a second electrode 2104, and accordingly, a light-emitting element 5 was fabricated.

(Light-Emitting Element 6)

The same substrate as that of the light-emitting element 5 was used, and the concentration of C545T in the control layer 2114 for controlling electron transport was changed. In other words, the weight ratio of Alq to C545T was adjusted to 1:0.05 (=Alq:C545T), and a light-emitting element 6 was fabricated. The layers other than the control layer 2114 were formed similar to the light-emitting element 5.

(Light-Emitting Element 7)

The same substrate as that of the light-emitting element 5 was used, and the concentration of C545T in the control layer 2114 for controlling electron transport was changed. In other words, the weight ratio of Alq to C545T was adjusted to 1:0.1 (=Alq:C545T), and a light-emitting element 7 was fabricated. The layers other than the control layer 2114 were formed similar to the light-emitting element 5.

(Light-Emitting Element 8)

The same substrate as that of the light-emitting element 5 was used, and the concentration of C545T in the control layer 2114 for controlling electron transport was changed. In other words, the weight ratio of Alq to C545T was adjusted to 1:0.5 (=Alq:C545T), and a light-emitting element 8 was fabricated. The layers other than the control layer 2114 were formed similar to the light-emitting element 5.

The light-emitting elements 5 to 8 thus obtained were each sealed in a glove box under a nitrogen atmosphere without being exposed to air. Then, the operating characteristics of the light-emitting elements were measured. The measurement was carried out at a room temperature (in the atmosphere kept at 25° C.).

Table 3 shows values of a voltage [V], a current efficiency [cd/A] and a power efficiency [lm/W] at the time when the light-emitting elements 5 to 8 each emitted light at a luminance of 5000 [cd/m$^2$]. Further, the concentration (molar fraction) of C545T in the control layer in each light-emitting element is also shown in Table 3. As apparent from Table 3, as the concentration of C545T as a dopant having an electron-trapping property in the control layer is increased, the driving voltage is slightly increased, and thus it is found that C545T acts as a trap. Note that green light emission derived from 2PCAPA was obtained from each light-emitting element.

TABLE 3

|  | molar fraction of C545T C | voltage [V] | current efficiency [cd/A] | power efficiency [lm/W] |
|---|---|---|---|---|
| light-emitting element 5 | 0.011 | 4.5 | 15 | 9.9 |
| light-emitting element 6 | 0.051 | 5.2 | 15 | 8.9 |
| light-emitting element 7 | 0.096 | 8.6 | 8.9 | 3.3 |
| light-emitting element 8 | 0.35 | 8.9 | 11 | 3.9 |

Figure 21:
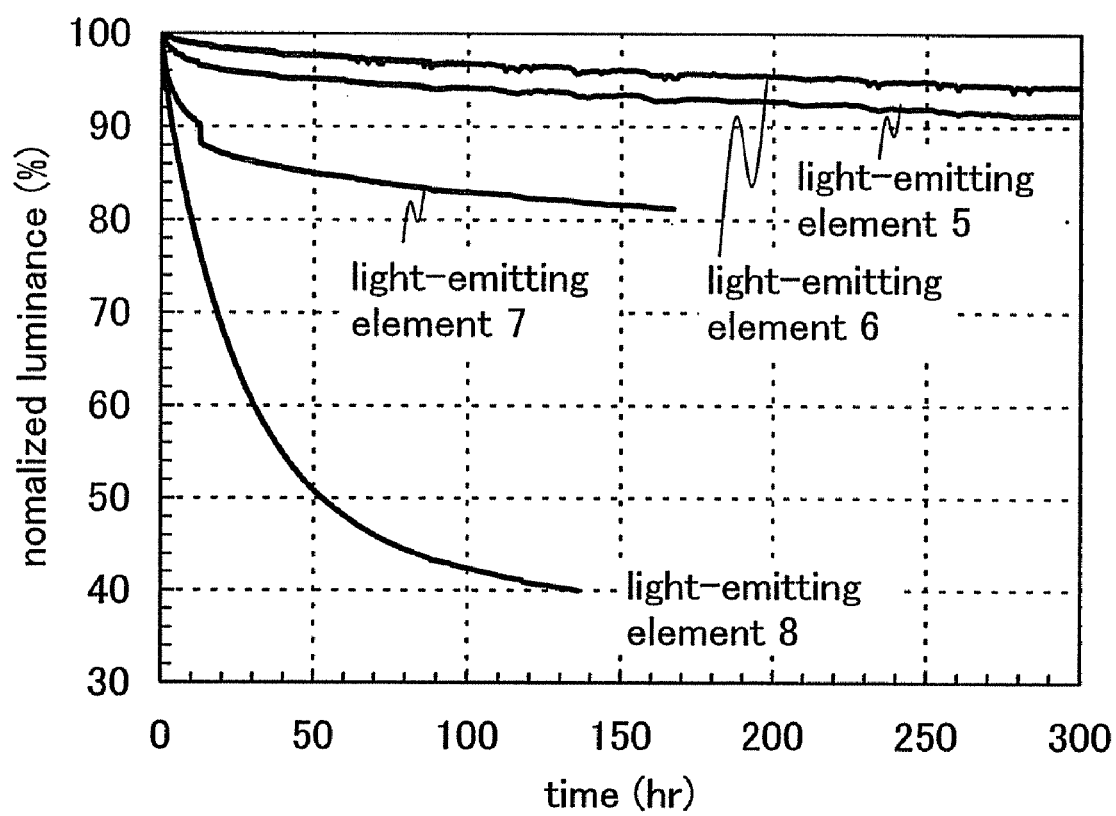
FIG. 21 is a graph showing the results of the continuous lighting tests obtained by constant current driving of the light-emitting elements manufactured in Example 3.

Next, these light-emitting elements were each driven at constant current at an initial luminance of 5000 [cd/m$^2$], and continuous lighting tests were conducted. The results are shown in FIG. 21. Based on these results, as barometers of lifetime of the elements, decay time $\tau_{0.9}$, and a luminance decay rate $D_{300hr}$ [%] were obtained and are shown in Table 4 below, similar to Example 2. Table 4 also shows a value of the parameter X obtained by assigning a molar fraction C, ΔE (=0.30 [eV]) calculated in Example 1, and the thickness L (=10 [nm]) of the control layer to the expression (1).

TABLE 4

| | molar fraction of C545T C | parameter X | $\tau_{0.9}$ [hr] | $D_{300\,hr}$ [%] |
|---|---|---|---|---|
| light-emitting element 5 | 0.011 | $7.8 \times 10^{-3}$ | 400 | 8.7 |
| light-emitting element 6 | 0.051 | $1.4 \times 10^{-3}$ | 800 | 5.7 |
| light-emitting element 7 | 0.096 | $4.9 \times 10^{-4}$ | 13 | 21* |
| light-emitting element 8 | 0.35 | $2.8 \times 10^{-5}$ | 3.5 | 65* |

*extrapolation value

Figure 27:
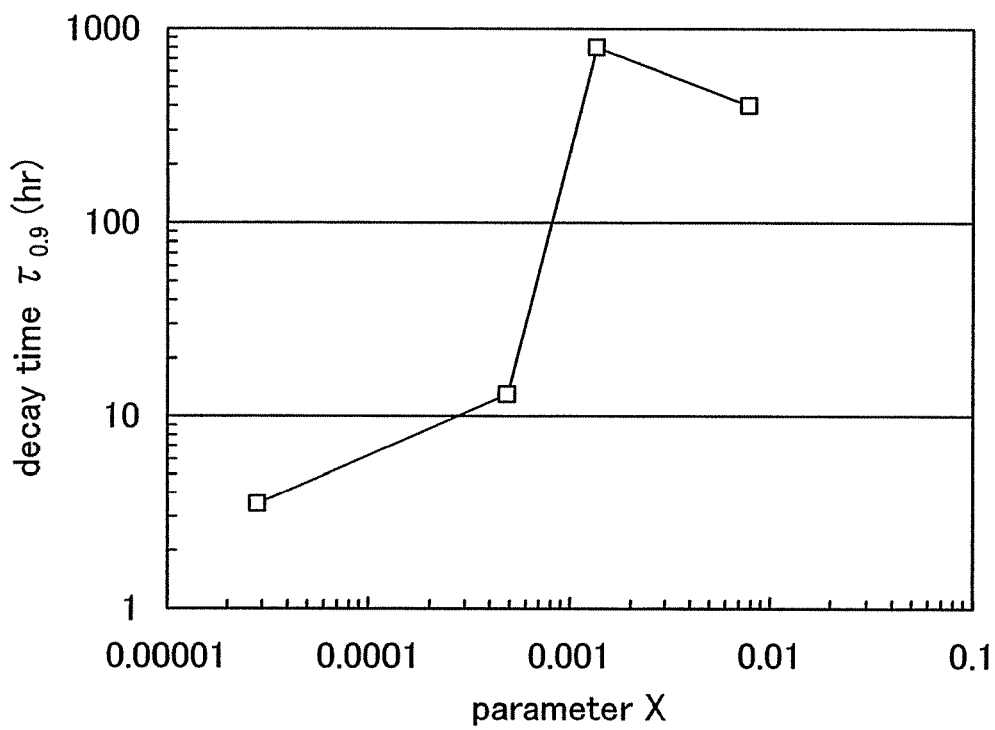
FIG. 27 is a graph showing a parameter X.

FIG. 27 is a graph based on the data of Table 4, in which the horizontal axis represents the parameter X and the vertical axis represents $\tau_{0.9}$. As apparent from FIG. 27, the optimum value of the concentration for obtaining the effect of improving lifetime is present at a peak around $X=2\times10^{-3}$.

Figure 28:
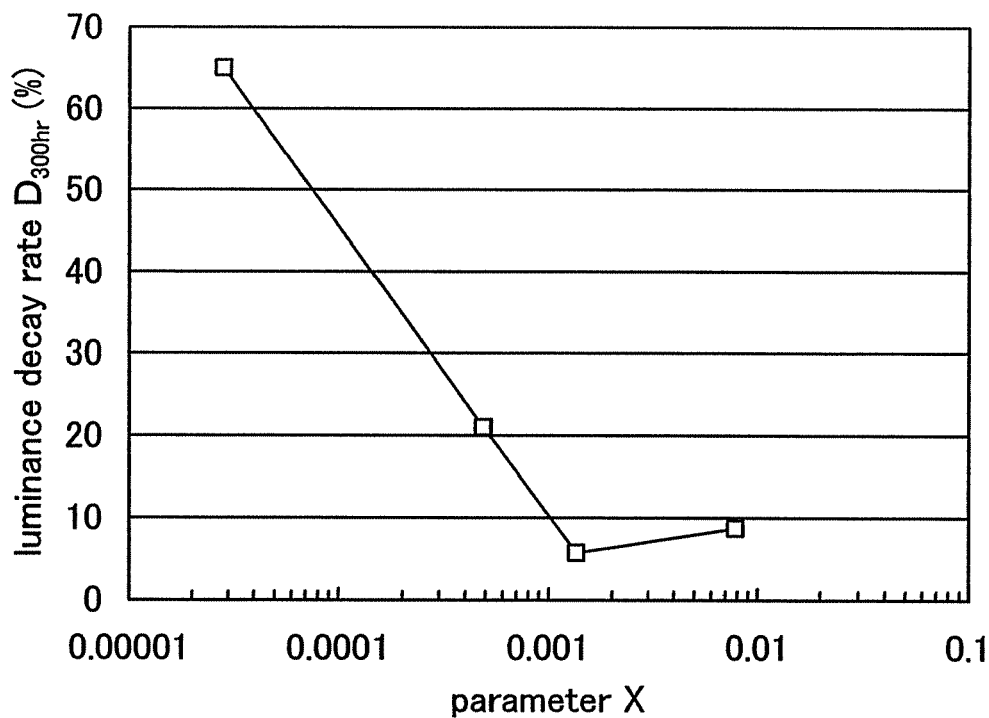
FIG. 28 is a graph showing a parameter X.

Further, FIG. 28 is a graph in which the horizontal axis represents the parameter X and the vertical axis represents $D_{300hr}$. As for suppression of luminance decay, the optimum value of the parameter X is similar. In other words, even when the barometer of lifetime was evaluated with the luminance decay rate instead of decay time, the behavior of X was similar.

Example 4

In Example 4, a light-emitting element according to an aspect of the present invention is described with reference to FIG. 15. In Example 4, a light-emitting element in which tris(8-quinolinolato)aluminum(III) (abbr.: Alq) was used for the first organic compound included in a control layer 2114, and N,N'-diphenylquinacridone (abbr.: DPQd) was used for the second organic compound included in the control layer 2114 was formed, and the concentration of DPQd was changed. The lifetime of the light-emitting element in this case was examined.

Structural formulae of materials used in this example are shown below. Materials of which the structural formulae have already been shown are omitted.

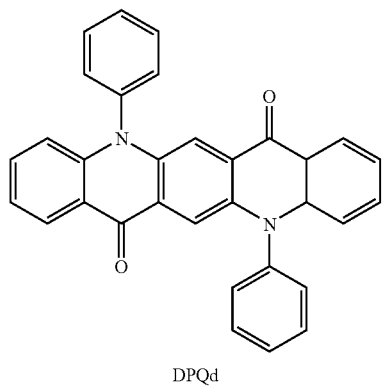

DPQd

A fabrication method of the light-emitting element of this example is described below.
(Light-Emitting Element 9)

First, indium tin oxide containing silicon oxide (abbr.: ITSO) was deposited on a glass substrate 2101 by a sputtering method, so that a first electrode 2102 was formed. The thickness of the first electrode 2102 was set to 110 nm. The area of the first electrode was set to 2 mm×2 mm.

Next, the substrate provided with the first electrode 2102 was fixed to a substrate holder provided in a vacuum evaporation apparatus such that the side on which the first electrode 2102 was formed faced downward. After the pressure in a film formation chamber was lowered to approximately $10^{-4}$ Pa, a layer 2111 containing a composite material of an organic compound and an inorganic compound was formed on the first electrode 2102 by co-evaporation of 4,4'-bis[N-(1-naphthyl)-N-phenylamino]biphenyl (abbr.: NPB) and molybdenum(VI) oxide. The thickness was 50 nm and the weight ratio of NPB to molybdenum(VI) oxide was adjusted to 4:1 (=NPB:molybdenum oxide). Note that a co-evaporation method refers to an evaporation method by which evaporation is concurrently conducted from a plurality of evaporation sources in one treatment chamber.

Next, a film of 4,4'-bis[N-(1-naphthyl)-N-phenylamino]biphenyl (abbr.: NPB) was formed to a thickness of 10 nm on the layer 2111 containing a composite material by an evaporation method employing resistance heating to form a hole-transporting layer 2112.

Then, a light-emitting layer 2113 was formed to a thickness of 30 nm on the hole-transporting layer 2112 by co-evaporation of 9-[4-(10-phenyl-9-anthryl)phenyl]-9H-carbazole (abbr.: CzPA) and N-(9,10-diphenyl-2-anthryl)-N,9-diphenyl-9H-carbazol-3-amine (abbr.: 2PCAPA). Here, the weight ratio of CzPA to 2PCAPA was adjusted to 1:0.05 (=CzPA:2PCAPA).

Then, tris(8-quinolinolato)aluminum(III) (abbr.: Alq) and N,N'-diphenylquinacridone (abbr.: DPQd) were co-evaporated so that the control layer 2114 for controlling electron transport was formed to a thickness of 10 nm on the light-emitting layer 2113. In this case, the weight ratio of Alq to DPQd was adjusted to 1:0.002 (=Alq:DPQd).

Next, an electron-transporting layer 2115 was formed by depositing tris(8-quinolinolato)aluminum(III) (abbr.: Alq) to a thickness of 30 nm on the control layer 2114 by an evaporation method using resistance heating.

Next, by an evaporation method using resistance heating, a film of lithium fluoride (LiF) was formed to a thickness of 1 nm on the electron-transporting layer 2115 to form an electron-injecting layer 2116.

Lastly, aluminum was formed to a thickness of 200 nm on the electron-injecting layer 2116 by an evaporation method using resistance heating to form a second electrode 2104, and accordingly, a light-emitting element 9 was fabricated.
(Light-Emitting Element 10)

The same substrate as that of the light-emitting element 9 was used, and the concentration of DPQd in the control layer 2114 for controlling electron transport was changed. In other words, the weight ratio of Alq to DPQd is adjusted to be 1:0.003 (=Alq:DPQd), and thus a light-emitting element 10 was fabricated. The layers other than the control layer 2114 were formed similar to the light-emitting element 9.
(Light-Emitting Element 11)

The same substrate as that of the light-emitting element 9 was used, and the concentration of DPQd in the control layer 2114 for controlling electron transport was changed. In other words, the weight ratio of Alq to DPQd was adjusted to 1:0.005 (=Alq:DPQd), and thus a light-emitting element 11 was fabricated. The layers other than the control layer 2114 were formed similar to the light-emitting element 9.
(Light-Emitting Element 12)

The same substrate as that of the light-emitting element 9 was used, and the concentration of DPQd in the control layer 2114 for controlling electron transport was changed. In other words, the weight ratio of Alq to DPQd was adjusted to 1:0.007 (=Alq:DPQd), and thus a light-emitting element 12 was fabricated. The layers other than the control layer 2114 were formed similar to the light-emitting element 9.

The light-emitting elements 9 to 12 thus obtained were each sealed in a glove box under a nitrogen atmosphere without being exposed to air. Then, the operating characteristics of the light-emitting elements were measured. The measurement was carried out at a room temperature (in the atmosphere kept at 25° C.).

Table 5 shows values of a voltage [V], a current efficiency [cd/A] and a power efficiency [lm/W] at the time when the light-emitting elements 9 to 12 each emitted light at a luminance of 5000 [cd/m$^2$]. Further, the concentration (molar fraction) of DPQd in the control layer in each light-emitting element is also shown in Table 5. As apparent from Table 5, as the concentration of DPQd as a dopant having an electron-trapping property in the control layer is increased, the driving voltage is slightly increased, and thus it is found that DPQd acts as a trap. Note that green light emission derived from 2PCAPA was obtained from each light-emitting element.

TABLE 5

|  | molar fraction of DPQd C | voltage [V] | current efficiency [cd/A] | power efficiency [lm/W] |
| --- | --- | --- | --- | --- |
| light-emitting element 9 | 0.0019 | 8.6 | 12 | 4.4 |
| light-emitting element 10 | 0.0030 | 8.8 | 12 | 4.3 |
| light-emitting element 11 | 0.0049 | 9.2 | 12 | 4.0 |
| light-emitting element 12 | 0.0069 | 9.5 | 11 | 3.6 |

Figure 22:
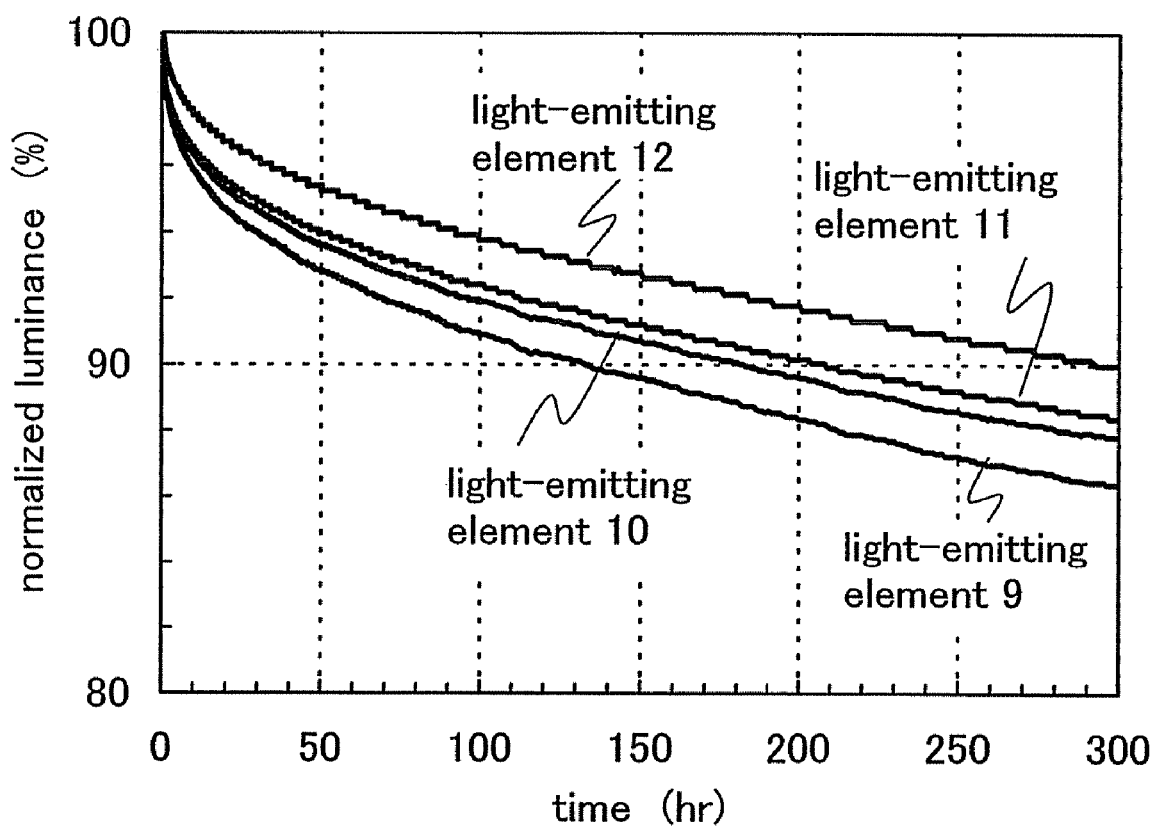
FIG. 22 is a graph showing the results of the continuous lighting tests obtained by constant current driving of the light-emitting elements manufactured in Example 4.

Next, these light-emitting elements were each driven at constant current at an initial luminance of 5000 [cd/m$^2$], and continuous lighting tests were conducted. The results are shown in FIG. 22. Based on these results, as barometers of lifetime of the elements, decay time $\tau_{0.9}$, and a luminance decay rate $D_{300hr}$ [%] were obtained and are shown in Table 6 below, similar to Example 2. Table 6 also shows a value of the parameter X obtained by assigning a molar fraction C, ΔE (=0.48 [eV]) calculated in Example 1, and the thickness L (=10 [nm]) of the control layer to the expression (1).

TABLE 6

|  | molar fraction of DPQd C | parameter X | $\tau_{0.9}$ [hr] | $D_{300\,hr}$ [%] |
| --- | --- | --- | --- | --- |
| light-emitting element 9 | 0.0019 | 9.7 × 10$^{-3}$ | 130 | 13.7 |
| light-emitting element 10 | 0.0030 | 6.9 × 10$^{-3}$ | 180 | 12.2 |
| light-emitting element 11 | 0.0049 | 4.2 × 10$^{-3}$ | 210 | 11.6 |
| light-emitting element 12 | 0.0069 | 2.9 × 10$^{-3}$ | 290 | 10.0 |

Figure 29:
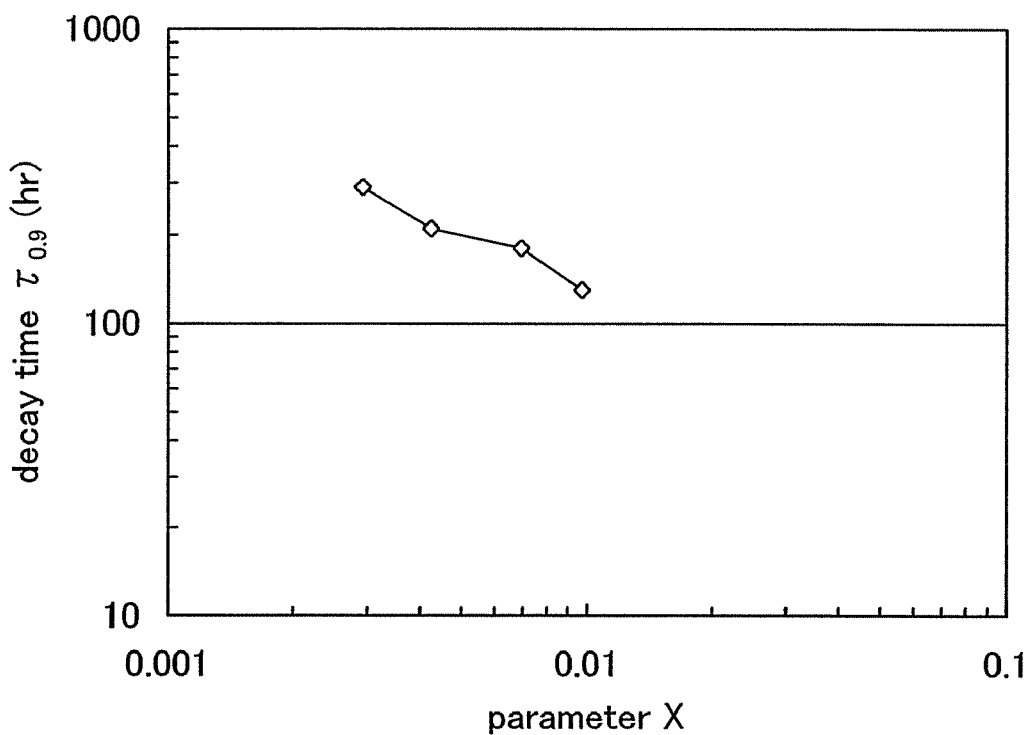
FIG. 29 is a graph showing a parameter X.

FIG. 29 is a graph based on the data of Table 6, in which the horizontal axis represents the parameter X and the vertical axis represents $\tau_{0.9}$. As apparent from FIG. 29, as the concentration of DPQd becomes higher, the value of X decreases. However, even when the value of X decreases, the improvement effect of lifetime can be obtained even when X is about 3×10$^{-3}$.

Figure 30:
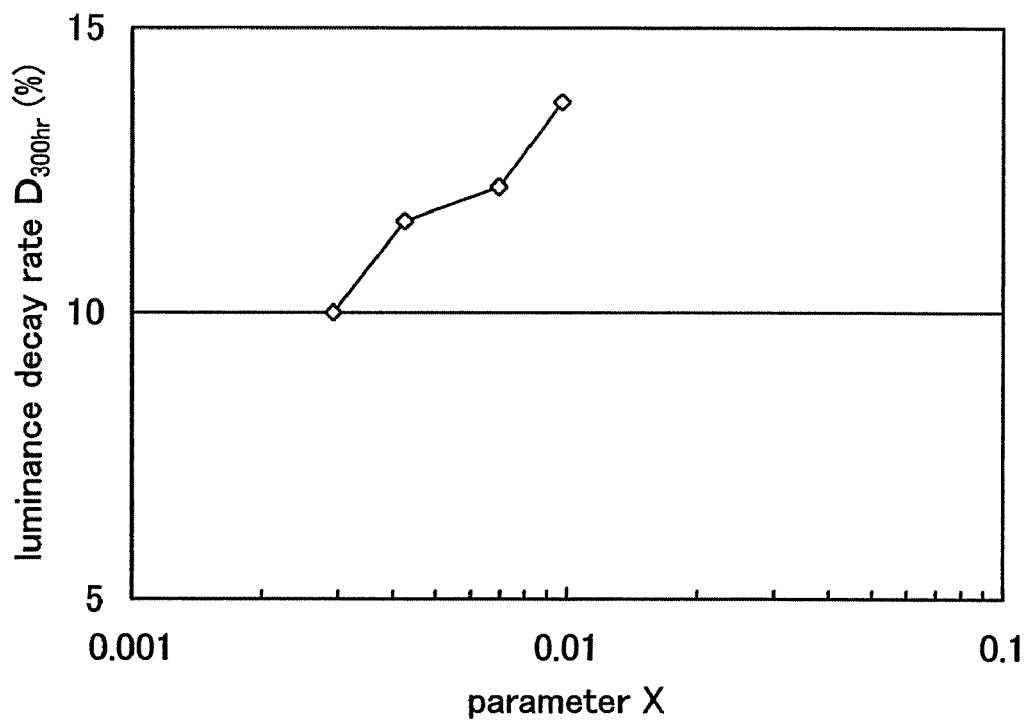
FIG. 30 is a graph showing a parameter X.

Further, FIG. 30 is a graph in which the horizontal axis represents the parameter X and the vertical axis represents $D_{300hr}$. As for the luminance decay rate, luminance decay can be suppressed in the level of around X=3×10$^{-3}$. In other words, even when the barometer of lifetime was evaluated with the luminance decay rate instead of decay time, the behavior of X was similar.

Example 5

In Example 5, a light-emitting element according to an aspect of the present invention is described with reference to FIG. 15. In Example 5, as in Example 4, a light-emitting element in which tris(8-quinolinolato)aluminum(III) (Alq) was used for the first organic compound included in a control layer 2114, and N,N'-diphenylquinacridone (DPQd) was used for the second organic compound included in the control layer 2114 was formed, and the concentration of DPQd was changed. The lifetime of the light-emitting element in this case was examined by changing the concentration of DPQd in concentration regions different from those in Example 4.

A fabrication method of the light-emitting element of this example is described below.
(Light-Emitting Element 13)

First, indium tin oxide containing silicon oxide (abbr.: ITSO) was deposited on a glass substrate 2101 by a sputtering method, so that a first electrode 2102 was formed. The thickness of the first electrode 2102 was set to 110 nm. The area of the first electrode was set to 2 mm×2 mm.

Next, the substrate provided with the first electrode 2102 was fixed to a substrate holder provided in a vacuum evaporation apparatus such that the side on which the first electrode 2102 was formed faced downward. After the pressure in a film formation chamber was lowered to approximately 10$^{-4}$ Pa, a layer 2111 containing a composite material of an organic compound and an inorganic compound was formed on the first electrode 2102 by co-evaporation of 4,4'-bis[N-(1-naphthyl)-N-phenylamino]biphenyl (abbr.: NPB) and molybdenum(VI) oxide. The thickness was 140 nm and the weight ratio of NPB to molybdenum(VI) oxide was adjusted to 4:1 (=NPB:molybdenum oxide). Note that a co-evaporation method refers to an evaporation method by which evaporation is concurrently conducted from a plurality of evaporation sources in one treatment chamber.

Next, a film of 4,4'-bis[N-(1-naphthyl)-N-phenylamino]biphenyl (abbr.: NPB) was formed to a thickness of 10 nm on the layer 2111 containing a composite material by an evaporation method employing resistance heating to form a hole-transporting layer 2112.

Then, a light-emitting layer 2113 was formed to a thickness of 30 nm on the hole-transporting layer 2112 by co-evaporation of 9-[4-(10-phenyl-9-anthryl)phenyl]-9H-carbazole (abbr.: CzPA) and N-(9,10-diphenyl-2-anthryl)-N,9-diphenyl-9H-carbazol-3-amine (abbr.: 2PCAPA). Here, the weight ratio of CzPA to 2PCAPA was adjusted to 1:0.05 (=CzPA:2PCAPA).

Then, tris(8-quinolinolato)aluminum(III) (abbr.: Alq) and N,N"-diphenylquinacridone (DPQd) were co-evaporated so that the control layer 2114 for controlling electron transport was formed to a thickness of 10 nm on the light-emitting layer 2113. In this case, the weight ratio of Alq to DPQd was adjusted to 1:0.005 (=Alq:DPQd).

Next, an electron-transporting layer 2115 was formed by depositing tris(8-quinolinolato)aluminum(III) (abbr.: Alq) to a thickness of 30 nm on the control layer 2114 by an evaporation method using resistance heating.

Next, by an evaporation method using resistance heating, a film of lithium fluoride (LiF) was formed to a thickness of 1 nm on the electron-transporting layer 2115 to form an electron-injecting layer 2116.

Lastly, aluminum was formed to a thickness of 200 nm on the electron-injecting layer 2116 by an evaporation method using resistance heating to form a second electrode 2104, and accordingly, a light-emitting element 13 was fabricated.
(Light-Emitting Element 14)

The same substrate as that of the light-emitting element 13 was used, and the concentration of DPQd in the control layer 2114 for controlling electron transport was changed. In other words, the weight ratio of Alq to DPQd was adjusted to 1:0.01 (=Alq:DPQd), and thus a light-emitting element 14 was fabricated. The layers other than the control layer 2114 were formed similar to the light-emitting element 13.
(Light-Emitting Element 15)

The same substrate as that of the light-emitting element 13 was used, and the concentration of DPQd in the control layer 2114 for controlling electron transport was changed. In other words, the weight ratio of Alq to DPQd was adjusted to 1:0.02 (=Alq:DPQd), and thus a light-emitting element 15 was fabricated. The layers other than the control layer 2114 were formed similar to the light-emitting element 13.

The light-emitting elements 13 to 15 thus obtained were each sealed in a glove box under a nitrogen atmosphere without being exposed to air. Then, the operating characteristics of the light-emitting elements were measured. The measurement was carried out at a room temperature (in the atmosphere kept at 25° C.).

Table 7 shows values of a voltage [V], a current efficiency [cd/A] and a power efficiency [lm/W] at the time when the light-emitting elements 13 to 15 each emitted light at a luminance of 5000 [cd/m$^2$]. Further, the concentration (molar fraction) of DPQd in the control layer in each light-emitting element is also shown in Table 7. As apparent from Table 7, as the concentration of DPQd as a dopant having an electron-trapping property in the control layer is increased, the driving voltage is slightly increased, and thus it is found that DPQd acts as a trap. Note that green light emission derived from 2PCAPA was obtained from each light-emitting element.

TABLE 7

| | molar fraction of DPQd C | voltage [V] | current efficiency [cd/A] | power efficiency [lm/W] |
|---|---|---|---|---|
| light-emitting element 13 | 0.0049 | 9.4 | 11 | 3.6 |
| light-emitting element 14 | 0.0098 | 10.1 | 10 | 3.2 |
| light-emitting element 15 | 0.019 | 10.9 | 8.3 | 2.4 |

Figure 23:
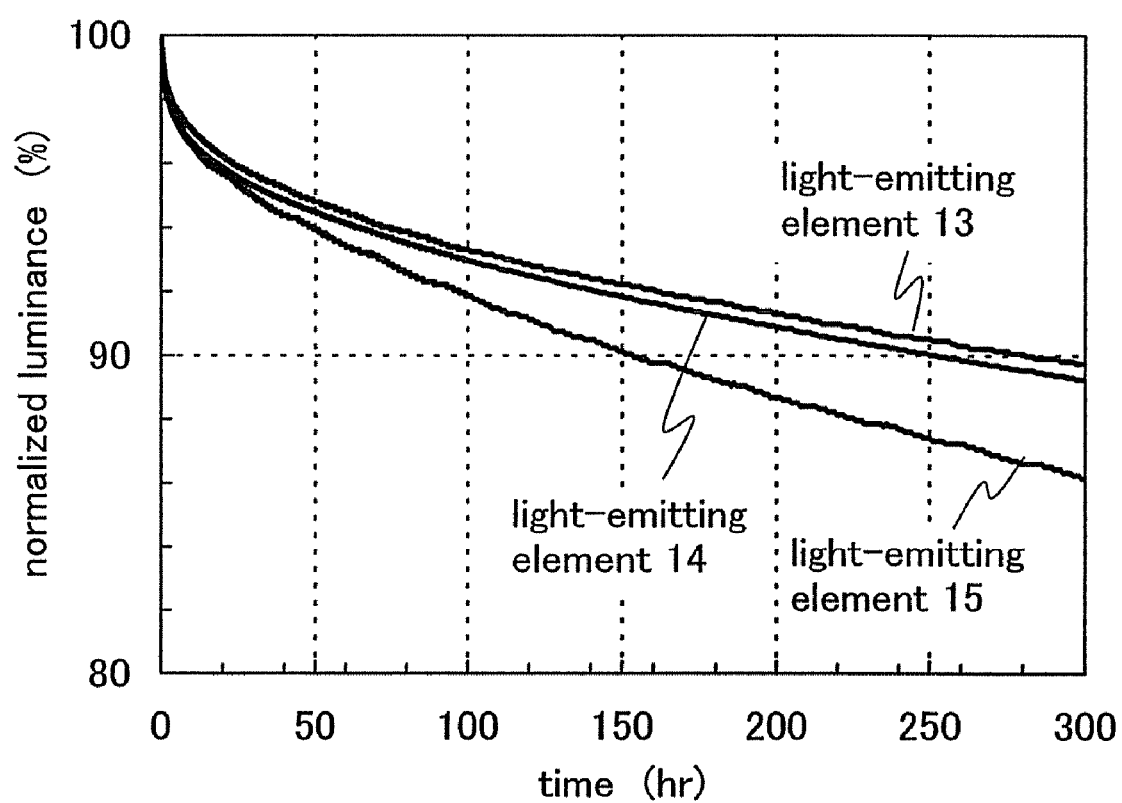
FIG. 23 is a graph showing the results of the continuous lighting tests obtained by constant current driving of the light-emitting elements manufactured in Example 5.

Next, these light-emitting elements were each driven at constant current at an initial luminance of 5000 [cd/m$^2$], and continuous lighting tests were conducted. The results are shown in FIG. 23. Based on these results, as barometers of lifetime of the elements, decay time $\tau_{0.9}$, and a luminance decay rate $D_{300hr}$ [%] were obtained and are shown in Table 8 below, similar to Example 2. Table 8 also shows a value of the parameter X obtained by assigning a molar fraction C, $\Delta E$ (=0.48 [eV]) calculated in Example 1, and the thickness L (=10 [nm]) of the control layer to the expression (1).

TABLE 8

| | molar fraction of DPQd C | parameter X | $\tau_{0.9}$ [hr] | $D_{300hr}$ [%] |
|---|---|---|---|---|
| light-emitting element 13 | 0.0049 | $4.2 \times 10^{-3}$ | 280 | 10.2 |

TABLE 8-continued

| | molar fraction of DPQd C | parameter X | $\tau_{0.9}$ [hr] | $D_{300hr}$ [%] |
|---|---|---|---|---|
| light-emitting element 14 | 0.0098 | $1.9 \times 10^{-3}$ | 250 | 10.7 |
| light-emitting element 15 | 0.019 | $6.8 \times 10^{-4}$ | 150 | 13.8 |

Figure 31:
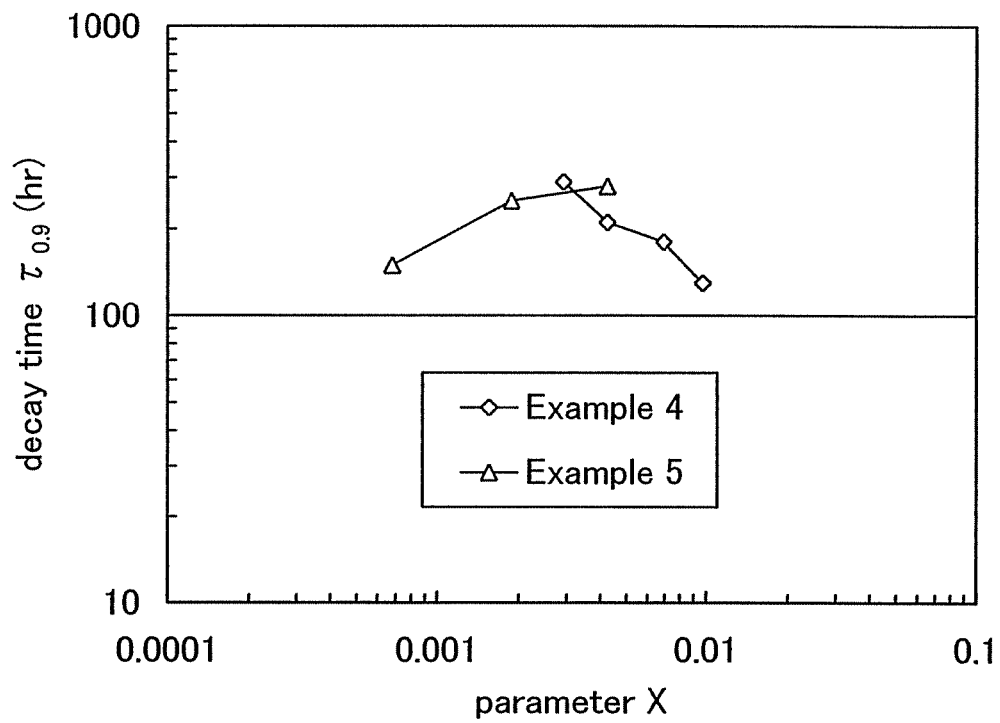
FIG. 31 is a graph showing a parameter X.

FIG. 31 is a graph based on the data of Table 8, in which the horizontal axis represents the parameter X and the vertical axis represents $\tau_{0.9}$. FIG. 31 also shows the results of Example 4 (this is because DPQd was used as a dopant having an electron-trapping property in Example 5, similar to Example 4). From results of Examples 4 and 5, it is found that similar to the case of C545T of Example 3, DPQd has also an optimum value of the concentration to improve the lifetime, at a peak around $X=3\times10^{-3}$.

Figure 32:
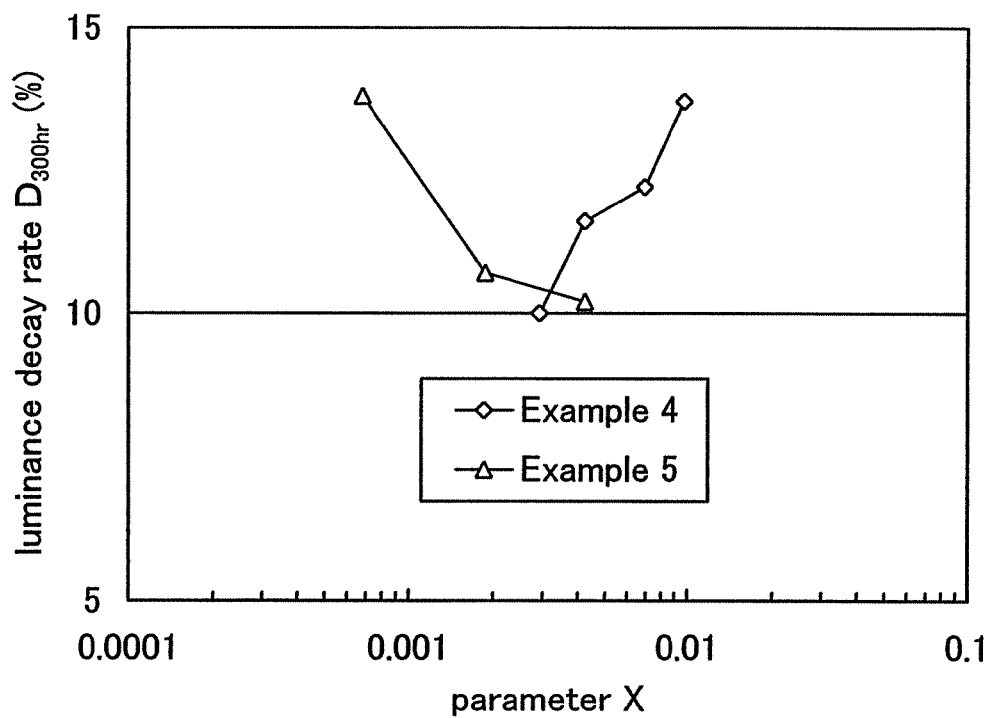
FIG. 32 is a graph showing a parameter X.

Further, FIG. 32 is a graph in which the horizontal axis represents the parameter X and the vertical axis represents $D_{300hr}$. As for suppression of luminance decay, the optimum value of the parameter X is similar. In other words, even when the barometer of lifetime was evaluated with the luminance decay rate instead of decay time, the behavior of the parameter X was similar.

Example 6

In Example 6, a light-emitting element according to an aspect of the present invention is described with reference to FIG. 15. In Example 6, as in Example 4 or 5, a light-emitting element in which tris(8-quinolinolato)aluminum(III) (Alq) was used for the first organic compound included in a control layer 2114, and N,N'-diphenylquinacridone (DPQd) was used for the second organic compound included in the control layer 2114 was formed, and the thickness of the control layer was changed. The lifetime of the light-emitting element in this case was examined.

A fabrication method of the light-emitting element of this example is described below.
(Light-Emitting Element 16)

First, indium tin oxide containing silicon oxide (abbr.: ITSO) was deposited on a glass substrate 2101 by a sputtering method, so that a first electrode 2102 was formed. The thickness of the first electrode 2102 was set to 110 nm. The area of the first electrode was set to 2 mm×2 mm.

Next, the substrate provided with the first electrode 2102 was fixed to a substrate holder provided in a vacuum evaporation apparatus such that the side on which the first electrode 2102 was formed faced downward. After the pressure in a film formation chamber was lowered to approximately 10$^{-4}$ Pa, a layer 2111 containing a composite material of an organic compound and an inorganic compound was formed on the first electrode 2102 by co-evaporation of 4,4'-bis[N-(1-naphthyl)-N-phenylamino]biphenyl (abbr.: NPB) and molybdenum(VI) oxide. The thickness was 50 nm and the weight ratio of NPB to molybdenum(VI) oxide was adjusted to 4:1 (=NPB:molybdenum oxide). Note that a co-evaporation method refers to an evaporation method by which evaporation is concurrently conducted from a plurality of evaporation sources in one treatment chamber.

Next, a film of 4,4'-bis[N-(1-naphthyl)-N-phenylamino] biphenyl (abbr.: NPB) was formed to a thickness of 10 nm on the layer 2111 containing a composite material by an evaporation method employing resistance heating to form a hole-transporting layer 2112.

Then, a light-emitting layer 2113 was formed to a thickness of 30 nm on the hole-transporting layer 2112 by co-evaporation of 9-[4-(10-phenyl-9-anthryl)phenyl]-9H-carbazole (abbr.: CzPA) and N-(9,10-diphenyl-2-anthryl)-N,9-diphenyl-9H-carbazol-3-amine (abbr.: 2PCAPA). Here, the weight ratio of CzPA to 2PCAPA was adjusted to 1:0.05 (=CzPA:2PCAPA).

Then, tris(8-quinolinolato)aluminum(III) (Alq) and N,N'-diphenylquinacridone (DPQd) were co-evaporated so that the control layer 2114 for controlling electron transport was formed to a thickness of 5 nm on the light-emitting layer 2113. In this case, the weight ratio of Alq to DPQd was adjusted to 1:0.005 (=Alq:DPQd).

Next, an electron-transporting layer 2115 was formed by depositing tris(8-quinolinolato)aluminum(III) (Alq) to a thickness of 35 nm on the control layer 2114 by an evaporation method using resistance heating.

Next, by an evaporation method using resistance heating, a film of lithium fluoride (LiF) was formed to a thickness of 1 nm on the electron-transporting layer 2115 to form an electron-injecting layer 2116.

Lastly, aluminum was formed to have a thickness of 200 nm on the electron-injecting layer 2116 by an evaporation method using resistance heating to form a second electrode 2104, and accordingly, a light-emitting element 9 was fabricated.

(Light-Emitting Element 17)

The same substrate as that of the light-emitting element 16 was used, and the thickness of the control layer 2114 for controlling electron transport was changed. In other words, the weight ratio of Alq to DPQd was kept to be 1:0.005 (=Alq:DPQd), and the thickness of the control layer 2114 was set to 10 nm. In the light-emitting element 17, the thickness of Alq used for the electron-transporting layer 2115 was 30 nm and the total thickness of the control layer 2114 and the electron-transporting layer 2115 was adjusted to 40 nm, which was equal to that of the light-emitting element 16. The thicknesses of the layers other than the thicknesses of the control layer 2114 and the electron-transporting layer 2115 were set similar to those of the light-emitting element 16.

(Light-Emitting Element 18)

The same substrate as that of the light-emitting element 16 was used, and the thickness of the control layer 2114 for controlling electron transport was changed. In other words, the weight ratio of Alq to DPQd was kept to be 1:0.005 (=Alq:DPQd), and the thickness of the control layer 2114 was set to 15 nm. In the light-emitting element 18, the thickness of Alq used for the electron-transporting layer 2115 was 25 nm and the total thickness of the control layer 2114 and the electron-transporting layer 2115 was adjusted to 40 nm, which is equal to that of the light-emitting element 16. The thicknesses of the layers other than the thicknesses of the control layer 2114 and the electron-transporting layer 2115 were set to be equal to those of the light-emitting element 16.

(Light-Emitting Element 19)

The same substrate as that of the light-emitting element 16 was used, and the thickness of the control layer 2114 for controlling electron transport was changed. In other words, the weight ratio of Alq to DPQd was kept to be 1:0.005 (=Alq:DPQd), and the thickness of the control layer 2114 was set to 20 nm. In the light-emitting element 19, the thickness of Alq used for the electron-transporting layer 2115 was 20 nm and the total thickness of the control layer 2114 and the electron-transporting layer 2115 was adjusted to 40 nm, which is equal to that of the light-emitting element 16. The thicknesses of the layers other than the thicknesses of the control layer 2114 and the electron-transporting layer 2115 were set to be equal to those of the light-emitting element 16.

The light-emitting elements 16 to 19 thus obtained were each sealed in a glove box under a nitrogen atmosphere without being exposed to air. Then, the operating characteristics of the light-emitting elements were measured. The measurement was carried out at a room temperature (in the atmosphere kept at 25° C.).

Table 9 shows values of a voltage [V], a current efficiency [cd/A] and a power efficiency [lm/W] at the time when the light-emitting elements 16 to 19 each emitted light at a luminance of 5000 [cd/m$^2$]. Further, the thickness [nm] of the control layer in each element is also shown in Table 9. As apparent from Table 9, as the thickness of the control layer is increased, the driving voltage is slightly increased, and thus it is found that the trapping function of the control layer is improved. Note that green light emission derived from 2PCAPA was obtained from each light-emitting element.

TABLE 9

| | thickness of control layer L [nm] | voltage [V] | current efficiency [cd/A] | power efficiency [lm/W] |
|---|---|---|---|---|
| light-emitting element 16 | 5 | 8.5 | 12 | 4.5 |
| light-emitting element 17 | 10 | 9.0 | 12 | 4.0 |
| light-emitting element 18 | 15 | 9.8 | 11 | 3.4 |
| light-emitting element 19 | 20 | 10.3 | 10 | 3.1 |

Figure 24:
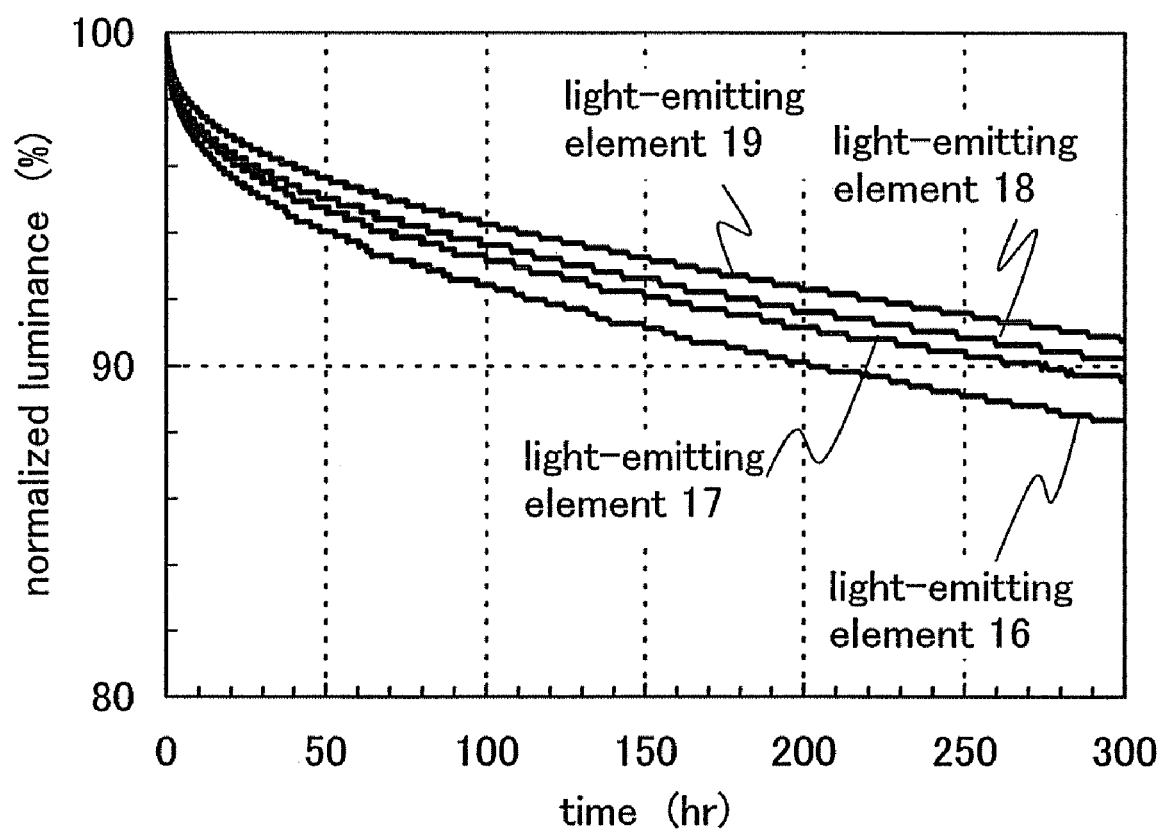
FIG. 24 is a graph showing the results of the continuous lighting tests obtained by constant current driving of the light-emitting elements manufactured in Example 6.

Next, these light-emitting elements were each driven at constant current at an initial luminance of 5000 [cd/m$^2$], and continuous lighting tests were conducted. The results are shown in FIG. 24. Based on these results, as barometers of lifetime of the elements, decay time $\tau_{0.9}$, and a luminance decay rate $D_{300hr}$ [%] were obtained and are shown in Table 10 below, similar to Example 2. Table 10 also shows a value of the parameter X obtained by assigning a molar fraction C (=0.005), $\Delta E$ (=0.48 [eV]) calculated in Example 1, and the thickness L [nm] of the control layer to the expression (1).

TABLE 10

| | thickness of control layer L [nm] | parameter X | $\tau_{0.9}$ [hr] | $D_{300\,hr}$ [%] |
|---|---|---|---|---|
| light-emitting element 16 | 5 | $8.3 \times 10^{-3}$ | 200 | 11.6 |
| light-emitting element 17 | 10 | $4.2 \times 10^{-3}$ | 280 | 10.3 |
| light-emitting element 18 | 15 | $2.8 \times 10^{-3}$ | 320 | 9.8 |
| light-emitting element 19 | 20 | $2.1 \times 10^{-3}$ | 360 | 9.2 |

Figure 33:
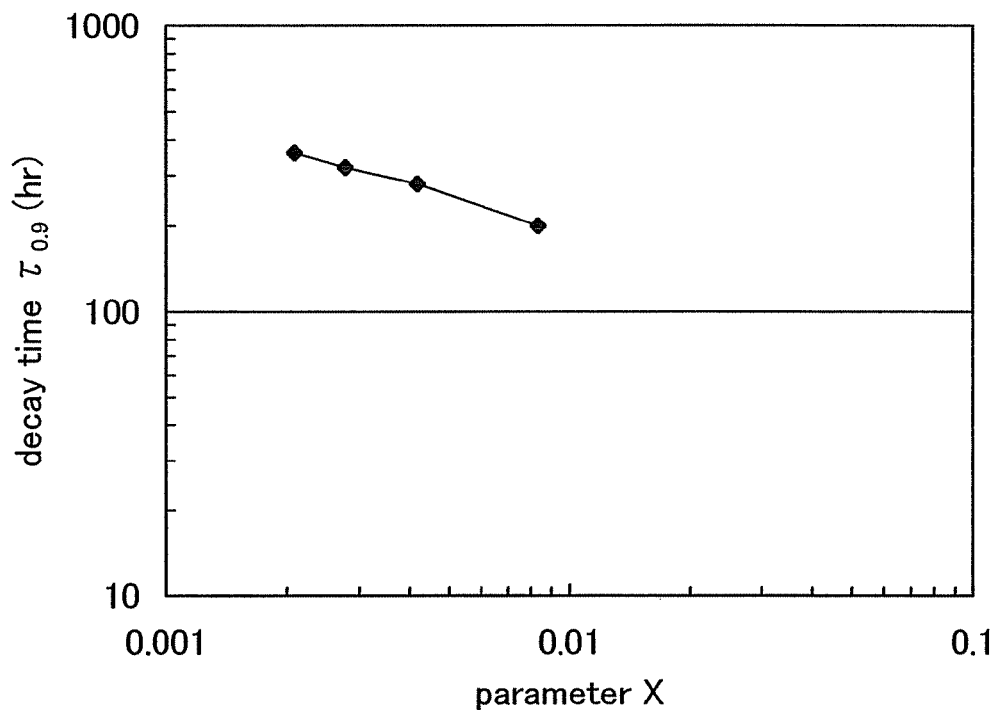
FIG. 33 is a graph showing a parameter X.

FIG. 33 is a graph based on the data of Table 10, in which the horizontal axis represents the parameter X and the vertical axis represents $\tau_{0.9}$. As apparent from FIG. 33, as the thickness of the control layer is increased, the value of X decreases. However, even when the value of X decreases, the improvement effect of lifetime reliability can be obtained even when X is about $2 \times 10^{-3}$.

Figure 34:
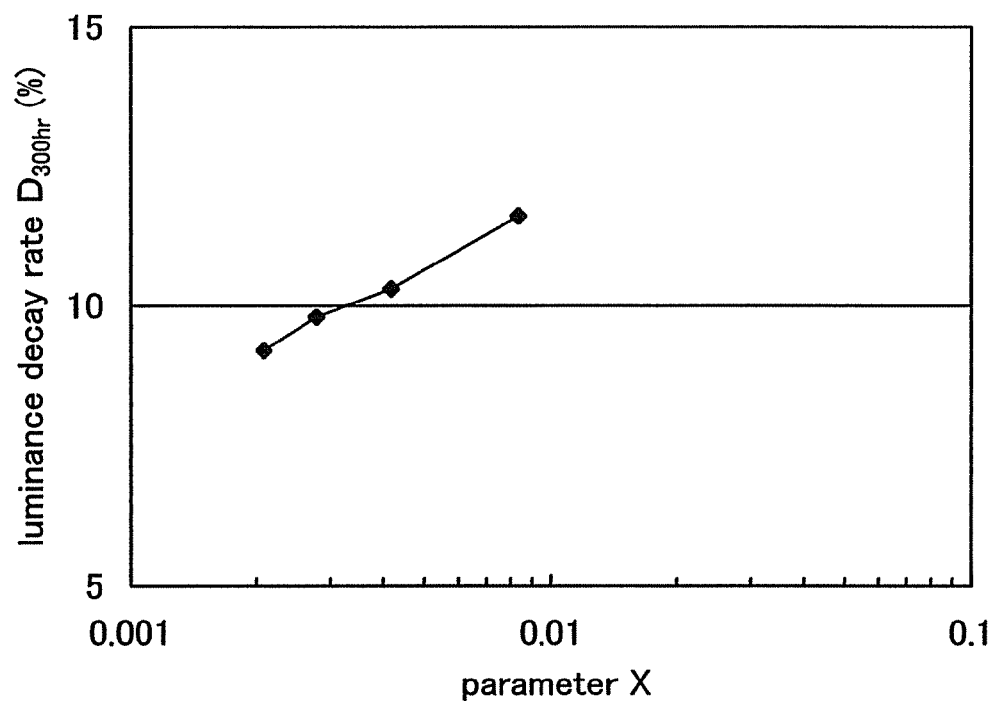
FIG. 34 is a graph showing a parameter X.

Further, FIG. 34 is a graph in which the horizontal axis represents the parameter X and the vertical axis represents $D_{300hr}$. As for the luminance decay rate, luminance decay can be suppressed in the level of around $X=2\times 10^{-3}$. In other words, even when the barometer of lifetime was evaluated with the luminance decay rate instead of decay time, the behavior of the parameter X was similar.

Example 7

In Example 7, validity and effective range of the parameter X was evaluated based on the data obtained in Example 2 to 6.

Figure 35:
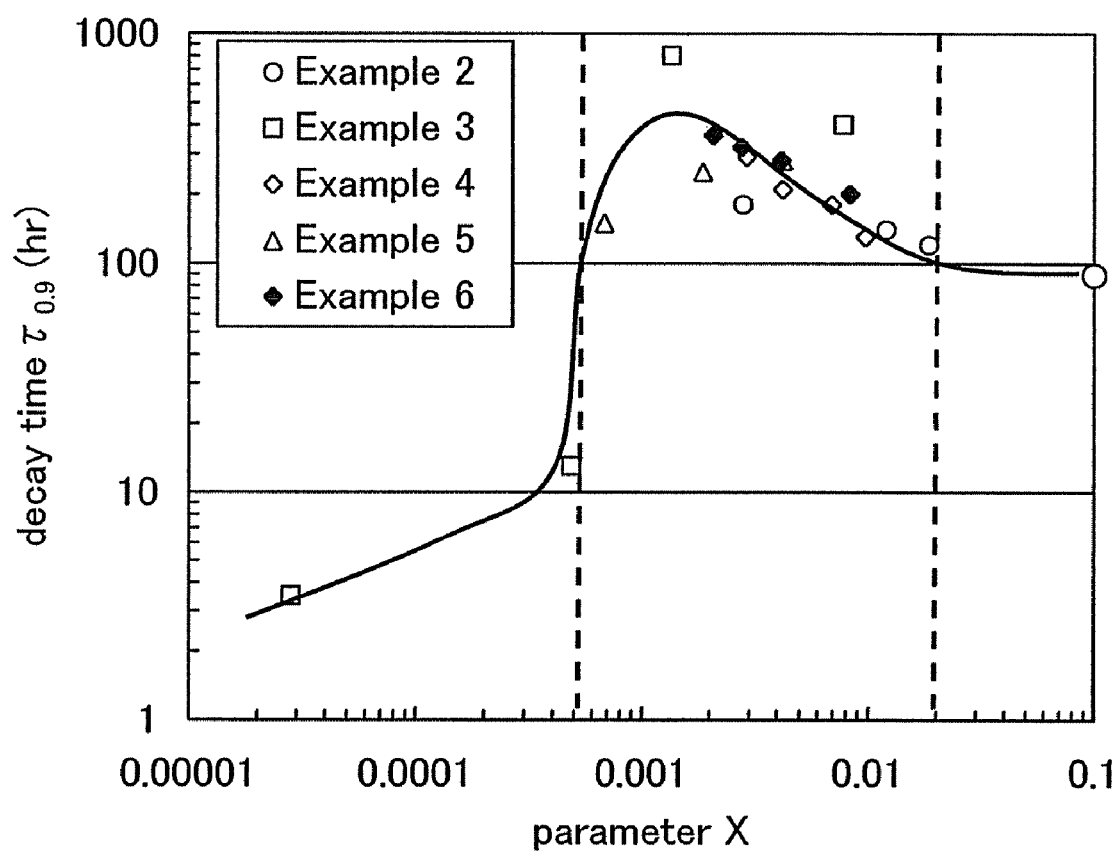
FIG. 35 is a graph showing a parameter X.

In Examples 2 to 6, the parameter X and decay time $\tau_{0.9}$ were plotted, and FIG. 35 is a graph showing the data of Examples 2 to 6. FIG. 35 elucidates, from the concentration of plots, the optimum value of the parameter X to increase the value of $\tau_{0.9}$ is common for each element. Although the data of Example 2 to 6 were obtained by variously changing the kind, concentration, and thicknesses of substances, it is surprising for us, the present inventors, that such a rule has been found.

In particular, it is found that the range of the parameter X in which $\tau_{0.9}$ exceeds 100 [hr] is the range between dotted lines in FIG. 35, i.e., from $5 \times 10^{-4}$ to $2 \times 10^{-2}$. When $\tau_{0.9}$ exceeds 100 [hr], although depending on the shape of a luminance decay curve, a luminance half-life period of about 10000 or more hours is obtained, which is practical. Accordingly, a preferable range of the parameter X is $5 \times 10^{-4}$ to $2 \times 10^{-2}$.

Figure 36A:
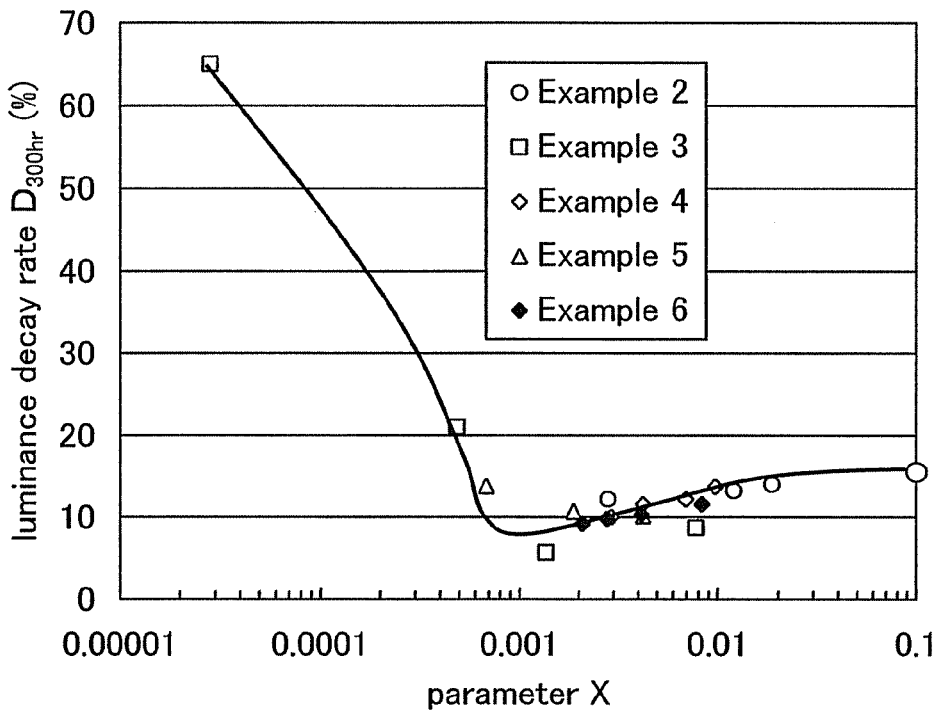
FIGS. 36A and 36B are each a graph showing a parameter X.
Figure 36B:
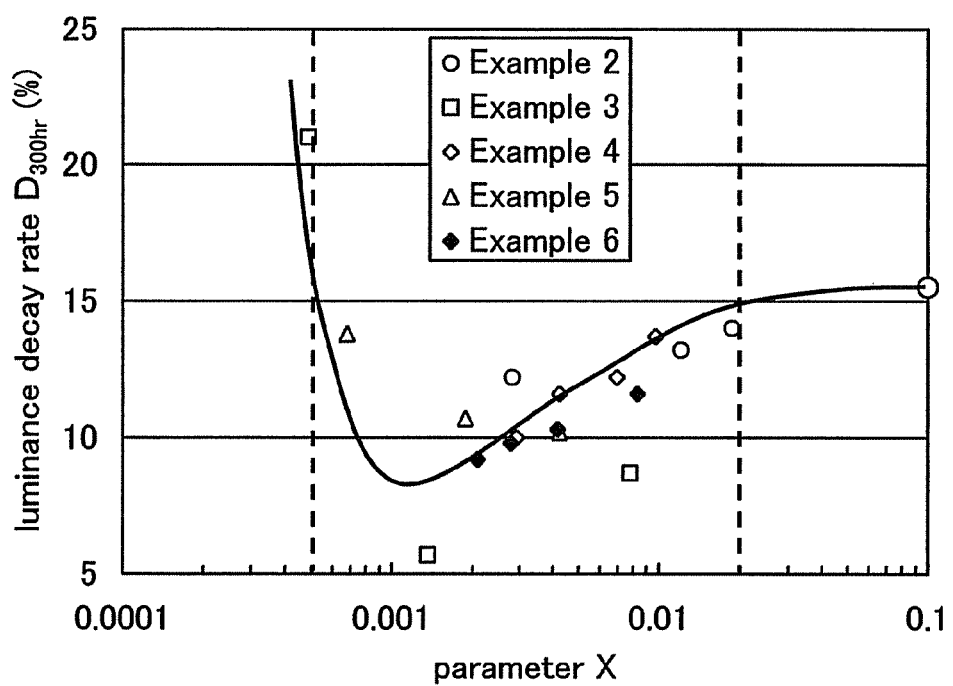

Next, similarly, FIG. 36A shows a relationship between the parameter X and the luminance decay rate $D_{300hr}$, including all of the data of Examples 2 to 6. FIG. 36B is a partial enlarged view of FIG. 36A. It can be said that the optimum range of the parameter X is similar even when the luminance decay rate was used for evaluation, instead of the decay time (see the dotted line in FIG. 36B). As described above, it was able to empirically show that the parameter X was an extremely valid parameter, and the valid range of the parameter X was also able to be shown empirically.

This application is based on Japanese Patent Application serial no. 2007-340190 filed with Japan Patent Office on Dec. 28, 2007, the entire contents of which are hereby incorporated by reference.

What is claimed is:

1. A light-emitting element comprising:
a first electrode;
a second electrode; and
a light-emitting layer and a control layer between the first electrode and the second electrode, the control layer being in contact with the light-emitting layer,
wherein:
the control layer includes a first organic compound and a second organic compound;
the first organic compound is included more than the second organic compound;
the first organic compound is an organic compound having an electron-transporting property;
a lowest unoccupied molecular orbital level (LUMO level) of the second organic compound is deeper than the lowest unoccupied molecular orbital level (LUMO level) of the first organic compound;
a value of a parameter X obtained by an expression (1) is in the range of from $5 \times 10^{-4}$ to $2 \times 10^{-2}$; and $$X = \frac{1}{L}\left\{\exp\left(-\frac{\Delta E}{kT}\right)\right\}^{\sqrt[3]{C}} \quad (1)$$

$\Delta E$ is an energy difference [eV] between the LUMO level of the first organic compound and the LUMO level of the second organic compound, C is a molar fraction [dimensionless term] of the second organic compound in the control layer, L is a thickness [nm] of the control layer, k is a Boltzmann constant ($=8.61 \times 10^{-5}$ [eV·K$^{-1}$]), and T is a temperature ($=300$[K]), wherein the second organic compound is a quinoxaline derivative.

2. The light-emitting element according to claim 1, wherein the thickness L of the control layer is from 5 nm to 20 nm.

3. The light-emitting element according to claim 1, wherein a carrier mobility of the first organic compound is in the range of from $10^{-7}$ [m$^2$/Vs] to $10^{-3}$ [m$^2$/Vs].

4. The light-emitting element according to claim 1, wherein an energy difference $\Delta E$ between the LUMO level of the first organic compound and the LUMO level of the second organic compound is in the range of from 0.2 [eV] to 0.6 [eV].

5. The light-emitting element according to claim 1, wherein the light-emitting layer has an electron-transporting property.

6. The light-emitting element according to claim 1, wherein:
the light-emitting layer includes a third organic compound and a fourth organic compound;
the third organic compound is included more than the fourth organic compound; and
the third organic compound has an electron-transporting property.

7. The light-emitting element according to claim 1, wherein:
the light-emitting layer includes a third organic compound and a fourth organic compound;
the third organic compound is included more than the fourth organic compound;
the third organic compound has an electron-transporting property; and
the first organic compound is different from the third organic compound.

8. A light-emitting element comprising:
a first electrode;
a second electrode; and
a light-emitting layer and a control layer between the first electrode and the second electrode,
wherein:
the control layer includes a first organic compound and a second organic compound;
the first organic compound is included more than the second organic compound;
the first organic compound is an organic compound having an electron-transporting property;
a lowest unoccupied molecular orbital level (LUMO level) of the second organic compound is deeper than the lowest unoccupied molecular orbital level (LUMO level) of the first organic compound;
a value of a parameter X obtained by an expression (1) is in the range of from $5 \times 10^{-4}$ to $2 \times 10^{-2}$; and $$X = \frac{1}{L}\left\{\exp\left(-\frac{\Delta E}{kT}\right)\right\}^{\sqrt[3]{C}} \quad (1)$$

$\Delta E$ is an energy difference [eV] between the LUMO level of the first organic compound and the LUMO level of the second organic compound, C is a molar fraction [dimensionless term] of the second organic compound in the control layer, L is a thickness [nm] of the control layer, k is a Boltzmann constant (=8.61×10⁻⁵ [eV·K⁻¹]), and T is a temperature (=300[K]), wherein the second organic compound is a quinoxaline derivative.

9. The light-emitting element according to claim 8, wherein the thickness L of the control layer is from 5 nm to 20 nm.

10. The light-emitting element according to claim 8, wherein a carrier mobility of the first organic compound is in the range of from $10^{-7}$ [m²/Vs] to $10^{-3}$ [cm²/Vs].

11. The light-emitting element according to claim 8, wherein an energy difference ΔE between the LUMO level of the first organic compound and the LUMO level of the second organic compound is in the range of from 0.2 [eV] to 0.6 [eV].

12. The light-emitting element according to claim 8, wherein the light-emitting layer has an electron-transporting property.

13. The light-emitting element according to claim 8, wherein:
   the light-emitting layer includes a third organic compound and a fourth organic compound;
   the third organic compound is included more than the fourth organic compound; and
   the third organic compound has an electron-transporting property.

14. The light-emitting element according to claim 8, wherein:
   the light-emitting layer includes a third organic compound and a fourth organic compound;
   the third organic compound is included more than the fourth organic compound;
   the third organic compound has an electron-transporting property; and
   the first organic compound is different from the third organic compound.

* * * * *

UNITED STATES PATENT AND TRADEMARK OFFICE
CERTIFICATE OF CORRECTION

PATENT NO. : 8,203,262 B2
APPLICATION NO. : 12/339517
DATED : June 19, 2012
INVENTOR(S) : Satoshi Seo and Tsunenori Suzuki Page 1 of 2

It is certified that error appears in the above-identified patent and that said Letters Patent is hereby corrected as shown below:

Column 8, Line 1; Change "$(I_0+0)/2\ 0.5\ L_O$" to --$(L_0+0)/2\ 0.5\ L_O$--.

Column 10, Lines 29-30; Change "tris (8-quinolinolato)aluminum (II)" to
--tris (8-quinolinolato)aluminum (III)--.

Column 10, Lines 41-42; Change "2,2',2"-(1,3,5-benzene triyl) tris(1-phenyl-1H-benzimidazole)" to
--2,2",2"-(1,3,5-benzenetriyl) tris(1-phenyl-iH-benzimidazole)--.

Column 10, Line 45; Change "(abbr.: C011)" to --(abbr.: CO11)--.

Column 15, Lines 52-53; Change "1,3-bis[5-β-tert-butylphenyl)-1,3,4-oxadiazol-2-yl]benzene"
to --1,3-bis[5-*p*-tert-butylphenyl)-1,3,4-oxadiazol-2-yl]benzene--.

Column 16, Line 52; Change "2,5-bis(N,N'-diphenyl amino)" to --2,5-bis(N,N'-diphenylamino--.

Column 30, Between Line 17 and Line 18, insert:
--" Note that this embodiment mode can be combined with any of the other embodiment
modes as appropriate."--.

Column 30, Line 24; Change "NM-diphenylquinacridone" to --N,N'-diphenylquinacridone--.

Signed and Sealed this
Sixteenth Day of October, 2012

David J. Kappos
*Director of the United States Patent and Trademark Office*

CERTIFICATE OF CORRECTION (continued)
U.S. Pat. No. 8,203,262 B2

Column 31, Line 23; Change "raging ranging" to --ranging--.

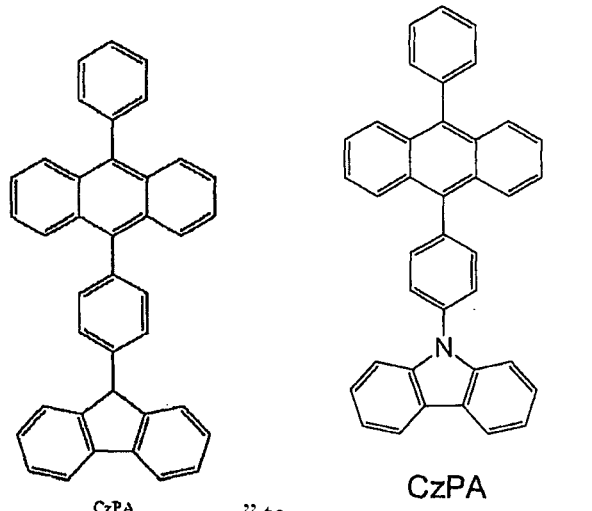

Column 33, Lines 2-21; Change "        CzPA        " to --        CzPA        --.

Column 34, Line 57; Change "TTQ" to --TPQ--.

Column 46, Line 62; Change "lifetime reliability" to --reliability--.